(12) United States Patent
Nakazato et al.

(10) Patent No.: US 6,211,531 B1
(45) Date of Patent: Apr. 3, 2001

(54) CONTROLLABLE CONDUCTION DEVICE

(75) Inventors: Kazuo Nakazato, Cambridge (GB); Kiyoo Itoh; Hiroshi Mizuta, both of Tokyo (JP); Toshikazu Shimada, Kokubunji (JP); Hideo Sunami, Tokyo (JP); Tatsuya Teshima, Sagamihara (JP); Toshiyuki Mine, Fussa (JP); Ken Yamaguchi, Fuchi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/492,171

(22) Filed: Jan. 27, 2000

Related U.S. Application Data

(62) Division of application No. 09/095,058, filed on Jun. 10, 1998, now Pat. No. 6,060,723.

(30) Foreign Application Priority Data

| Jul. 18, 1997 | (EP) | ................................. 97305399 |
| Sep. 4, 1997  | (JP) | ................................. 9-240030 |
| Feb. 6, 1998  | (EP) | ................................. 98300894 |

(51) Int. Cl.[7] .......................... H01L 29/06; H01L 29/80; H01L 31/112; H01L 29/76; H01L 29/94
(52) U.S. Cl. .............................. 257/28; 257/30; 257/262; 257/263; 257/280; 257/364; 257/365
(58) Field of Search ................................. 257/28, 30, 14, 257/192, 280, 262, 263, 364, 365

(56) References Cited

U.S. PATENT DOCUMENTS

| 4,692,997 | 9/1987 | Calviello ............................. 437/238 |
| 5,021,839 | 6/1991 | Yamazaki . |
| 5,055,887 | 10/1991 | Yamazaki . |
| 5,093,699 | 3/1992 | Weichold et al. ..................... 357/22 |

(List continued on next page.)

FOREIGN PATENT DOCUMENTS

| 0 145 403 | 6/1985 | (EP) . |
| 0 202 755 | 11/1986 | (EP) . |
| 0 249 204 | 12/1987 | (EP) . |
| 0 649 174 | 4/1995 | (EP) . |
| 0 700 093 | 3/1996 | (EP) . |
| 0 750 353 | 12/1996 | (EP) . |
| WO 94/15340 | 7/1994 | (GB) . |
| 2 295 488 | 5/1996 | (GB) . |

OTHER PUBLICATIONS

Patent Abstracts of Japan, vol. 12, No. 246, Jul. 12, 1988 & JP 63 034975 (Hitachi, Ltd.), Feb. 15, 1988.

Anonymous: *Superlattice Tailoring to Obtain Devices With High Saturation Velocity*, IBM Technical Disclosure Bulletin, vol. 29, No. 7, Dec. 1986, New York, US; pp. 2931–2932.

Austing D G et al.: *Single Electron Tunneling in Sub-Micron A/GaAs/GaAs Double Barrier Transistor Structures*, Solid State Electronics, vol. 40, No. 1/08, Jan. 1, 1996, pp. 237–240.

(List continued on next page.)

*Primary Examiner*—Ngân V. Ngô
(74) *Attorney, Agent, or Firm*—Kenyon & Kenyon

(57) ABSTRACT

A controllable conduction device in the form of a transistor comprises source and drain regions 5, 2 between which extends a conduction path P for charge carriers, a gate 4 for controlling charge carrier flow along the conduction path and a multiple layer structure 3 providing a multiple tunnel junction configuration in the conduction path, with the result that current leakage is blocked by the multiple tunnel junction configuration when the transistor is in its off state. Vertical and lateral transistor configurations are described, together with use of the transistor in complimentary pairs and for a random access memory cell. Improved gate structures are described which are also applicable to memory devices that incorporate the tunnel barrier configuration to store charge on the memory node.

25 Claims, 32 Drawing Sheets

U.S. PATENT DOCUMENTS

| | | | |
|---|---|---|---|
| 5,216,262 | 6/1993 | Tsu | 257/17 |
| 5,430,011 | 7/1995 | Tanaka et al. | 505/193 |
| 5,432,362 | 7/1995 | Lippens et al. | 257/197 |
| 5,606,177 | 2/1997 | Wallace et al. | 257/25 |
| 5,608,231 | 3/1997 | Ugajin et al | 257/24 |
| 5,629,231 | 5/1997 | Kiehl | 438/509 |
| 5,714,766 | 2/1998 | Chen et al. | 267/17 |
| 5,962,864 | * 10/1999 | Leadbeater et al. | |

OTHER PUBLICATIONS

Patent Abstracts of Japan, vol. 97, No. 2, Feb. 28, 1997 & JP 08 264807 (Nippon Telegr 7 AMP; Teleph Corp. & LT; NTT>), Oct. 11, 1996.

Ahmed H et al.: *Single–Electron Devices*, Microelectronic Engineering, vol. 32, No. 1/4, Sep. 1996, pp. 297–315.

Wen–Shiung Lour: *Fabrication of Voltage–Controlled Strained–Layer Quantum Well Three–Terminal Switching Device*, Solid State Electronics, vol. 38, No. 3, Mar. 1, 1995, pp. 557–560.

Wei Y et al.: *Controlled growth of $(Si)_2$ Tunnel Barrier and Crystalline Si Quantum Wells For Si Resonant Tunneling Diodes*, Journal of Applied Physics, vol. 81, No. 9, May 1 1997, pp. 6415–6424.

Austing D G et al: *A New Design for Submicron Double–Barrier Resonant Tunnelling Transistors*, Semiconductor Science and Technology, vol. 11, No. 3, Mar. 1, 1996, pp. 388–391.

Capasso F et al.: *Quantum Functional Devices: Resonant–Tunneling Transistors, Circuits with Reduced Complexity, and Multiple–Valued Logic*, IEEE Transactions On Electron Devices, vol. 36, No. 10, Oct. 1, 1989, pp. 2065–2082.

Patent Abstracts of Japan, vol. 96, No. 8, Aug. 30, 1996 & JP 08 097305 (Hitachi, Ltd.), Apr. 12, 1996.

Nakazato K et al.: *Enhancement of Coulomb Blockade in Semiconductor Tunnel Junctions*, Applied Physics Letters, vol. 66, No. 23, Jun. 5, 1995, pp. 3170–3172.

Nakazato K et al: *Single–Electron Memory*, Journal Of Applied Physics, vol. 75, No. 10, May 15, 1994, pp. 5123–5134.

Uemura T et al: *Large Enhancement of Interband Tunneling Current Densities of Over $10^5$ $A/cm^2$ in $In_{0.53}Ga_{0.47}As$–Based Surface Tunnel Transistors*, IEEE Electron Device Letters, vol. 18, No. 5, May 1997, pp. 225–227.

Patent Abstracts of Japan, vol. 11, No. 33, Jan. 30, 1987 & JP 61 201470 (Mitsubishi Electric Corp.), Sep. 6, 1986.

Patent Abstracts of Japan, vol. 95, No. 1, Feb. 28, 1995 & JP 06 302623 (NEC Corp), Oct. 28, 1994.

Japanese Journal Of Applied Physics, vol. 36, No. 3B, Part 1, Mar. 1997, pp. 1667–1671, D. G. Austing et al.: GaAs/AlGaAs/InGaAs Vertical Triple Barrier Single electron Transistors.

Applied Physics Letters, Aug. 10, 1987, USA, Vol. 51, No. 6, pp. 445–447, T. Nakagawa et al.: *Thermally stimulated resonant current in AlGaAs/GaAs triple barrier diodes*.

IBM Technical disclosure bulletin, vol. 29, No. 7, Dec. 1986, pp. 2931–2932.

IEEE Transactions On Electron Devices, vol. ED–32, No. 2, Feb. 1985, Mehrdad M. Moslehi et al.: *Thermal Nitridation of Si and $SiO_2$ for VLSI*.

Appl. Phys. Lett 64 (11), Mar. 14, 1994, H.I. Liu et al.: *Self–limiting oxidation for fabricating sub–5 nm silicon nonwires*.

Appl. Phys. Lett 70 (3), Jan. 20, 1997, Hiroshi Fukuda et al.: *Fabrication of silicon nanopillars containing polycrystalline silicon/insulator multi–layer structures*.

* cited by examiner

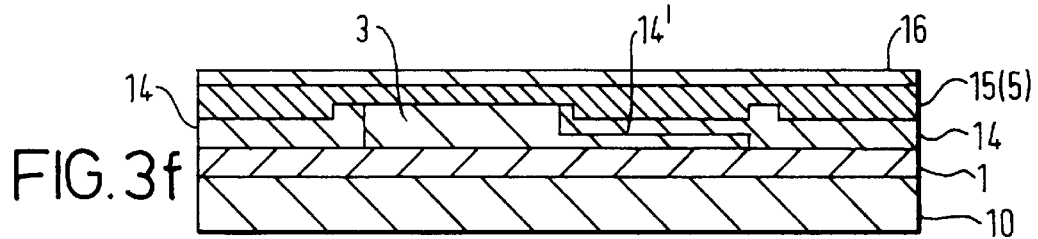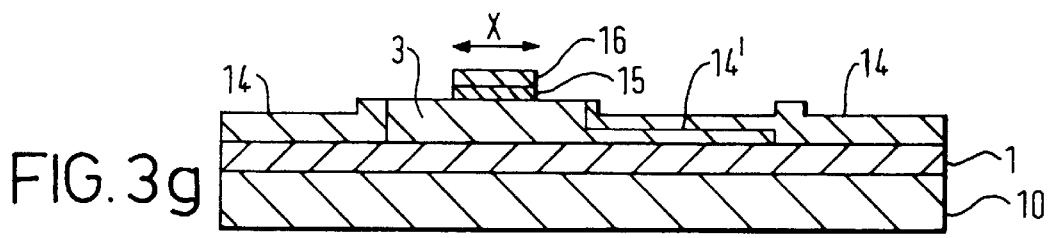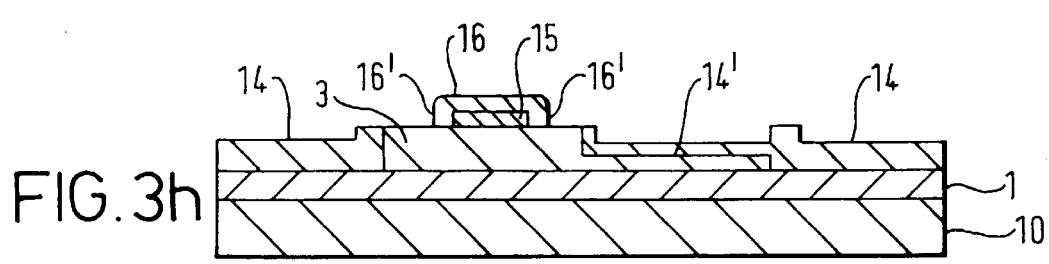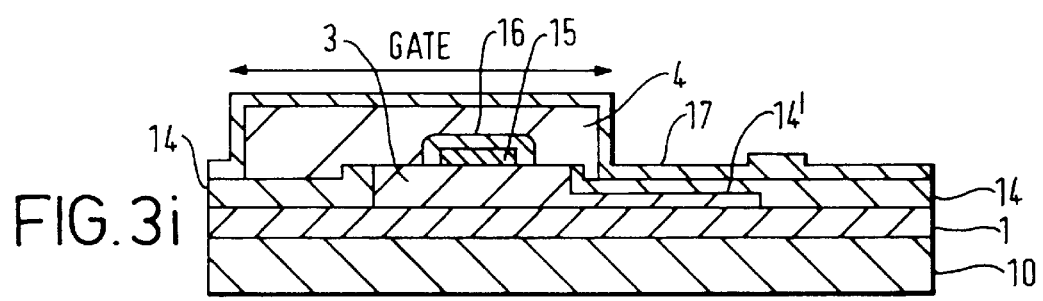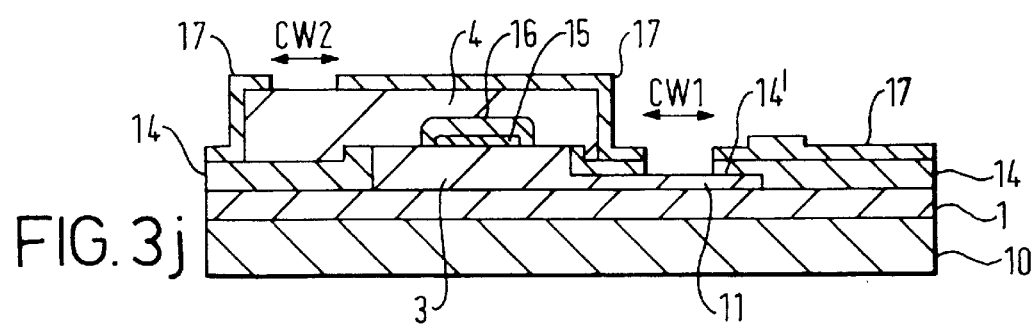

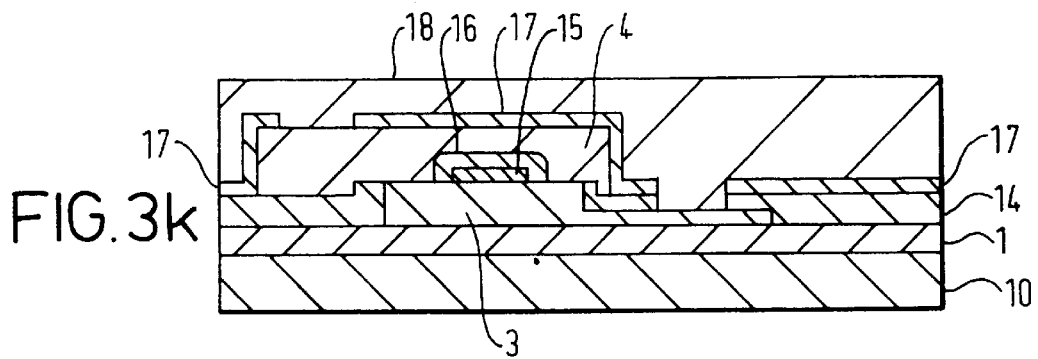
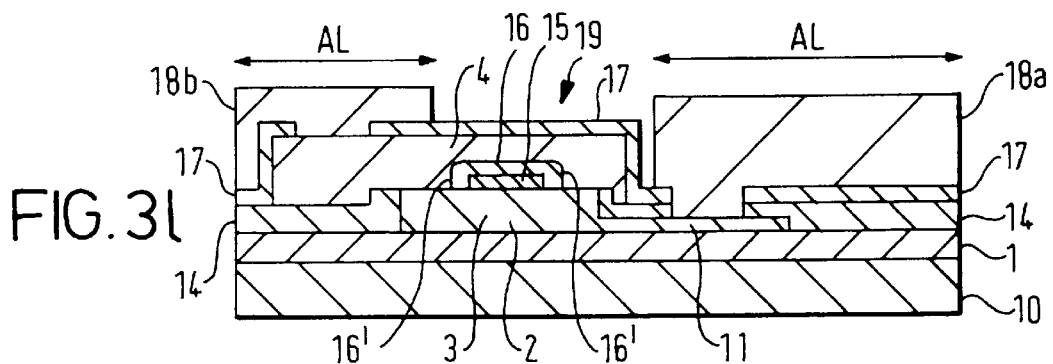
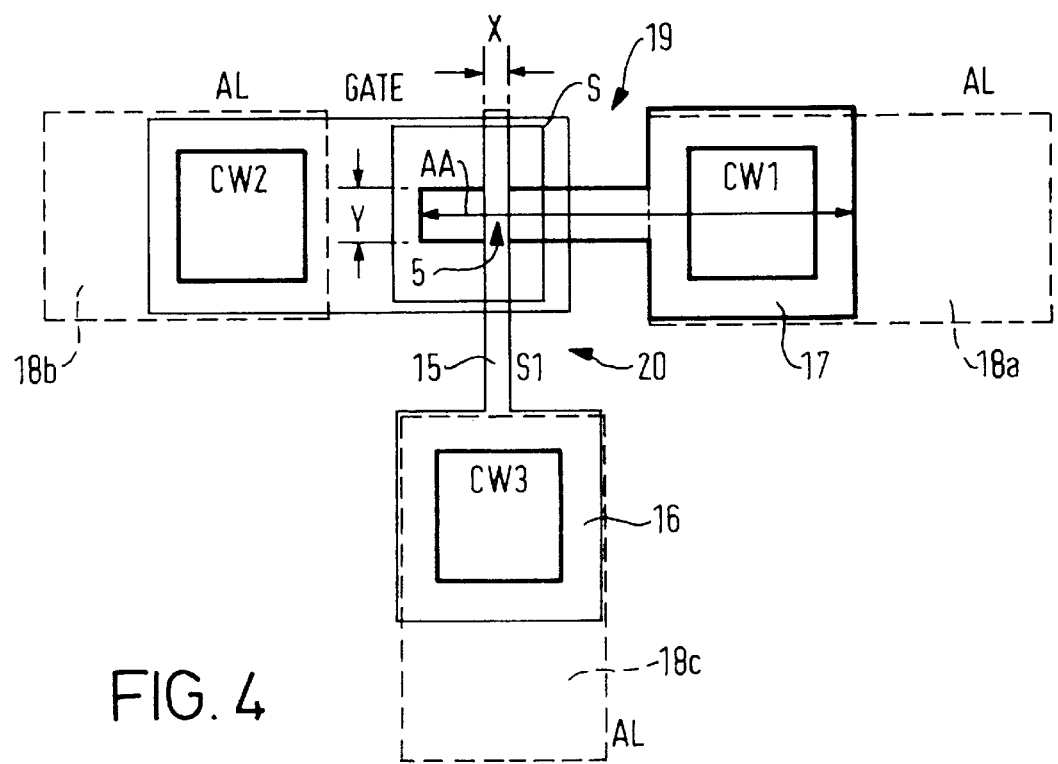

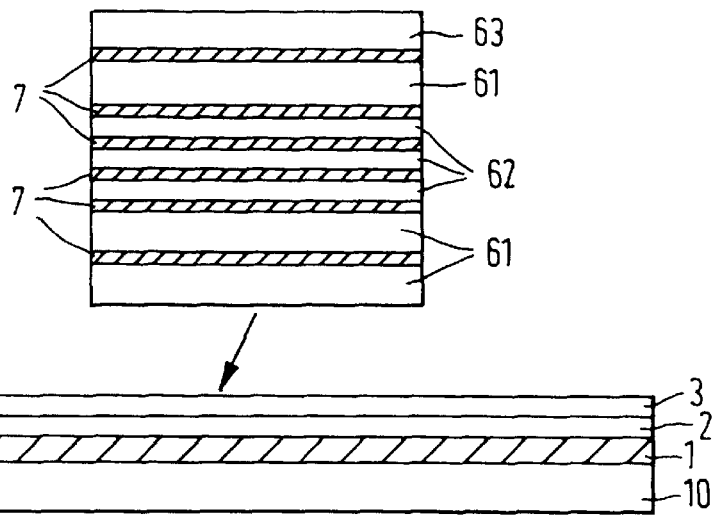
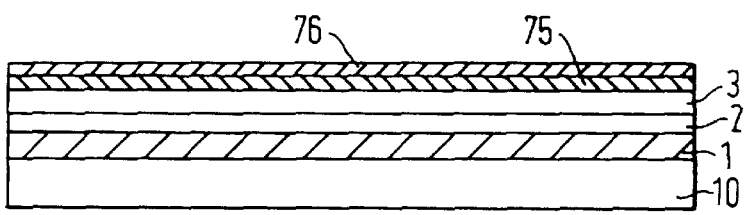
FIG.40a
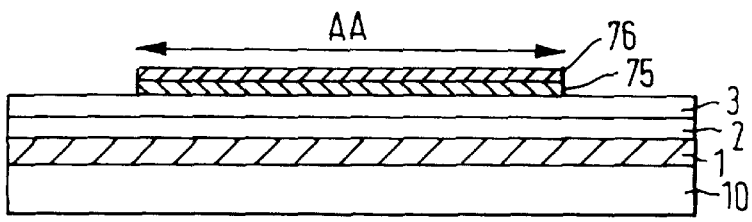
FIG.40b
FIG.40c
FIG.40d
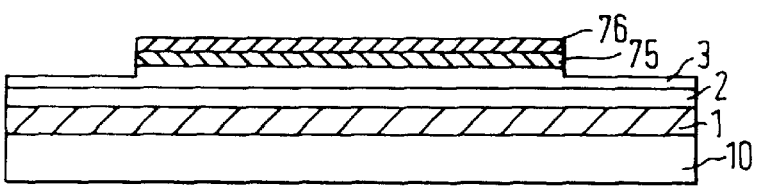
FIG.40e
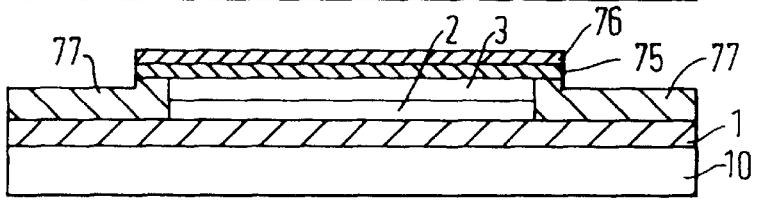
FIG.40f
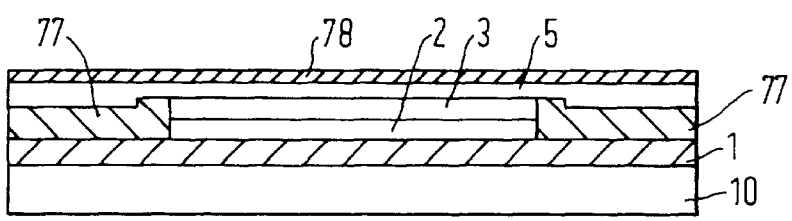

“Single-electron memory”, K. Nakazato, R. J. Blaikie and H. Ahmed, J. Appl. Phys. 75, 5123 (1994). A single electron memory is disclosed in WO94/15340. In this device, a small group of electrons e.g. less than ten electrons, is stored at a node, which consists of a island constructed on the nanometre scale by electron beam lithography. The charge that can exist at the node is limited by the so-called Coulomb blockade effect. Once charged with the small group of electrons, no additional electrons can enter the island, due to its charging energy. In order to demonstrate the Coulomb blockade effect, the charging energy of the island needs to exceed the surrounding thermal energy, so that thermal electrons do not swamp the charge of the island. This requires either the device to be cooled to liquid nitrogen temperatures to reduce the thermal energy or, if the device is to operate at room temperature, the scale of the island needs to be of the order of 1 or 2 nm, which is beyond the capability of current e-beam lithographic techniques.

CONTROLLABLE CONDUCTION DEVICE

This is division of application Ser. No. 09/095,058 filed Jun. 10, 1998, now U.S. Pat. No. 6,060,723.

FIELD OF THE INVENTION

This invention relates to a controllable conduction device with improved, reduced leakage current characteristics.

BACKGROUND

Integrated circuits have become progressively more miniaturised since their invention in 1959. Initially, their performance was improved by reducing the size of transistors used in the circuits, because the size reduction produced a reduction in parasitic capacitances of the circuit and a reduction in power dissipation. The miniaturisation was achieved by linearly scaling down the size of the features of the integrated circuit, by miniaturising the scale of the lithographic masks used in the manufacturing process.

However, as the scale of the devices was reduced further, it was found that the electrical characteristics of the resulting circuit did not scale linearly, and as a result, the configuration of the individual transistors in the circuit needed to be modified in order to optimise performance.

For example, current leakage from individual transistors of the circuits becomes a prominent factor degrading device performance as the device is miniaturised further and in high capacity dynamic random access memory (DRAM) cells, complex, three dimensional capacitors have been proposed in order to compensate for leakage current. However, the fabrication of such capacitors becomes unduly complicated.

Recently an alternative approach has been demonstrated, applicable to integrated circuits, in which transport of individual groups of electrons, in theory single electrons, is controlled. Reference is directed to "Single-electron memory", K. Nakazato, R. J. Blaikie and H. Ahmed, J. Appl. Phys. 75, 5123 (1994). A single electron memory is disclosed in WO94/15340. In this device, a small group of electrons e.g. less than ten electrons, is stored at a node, which consists of a island constructed on the nanometre scale by electron beam lithography. The charge that can exist at the node is limited by the so-called Coulomb blockade effect. Once charged with the small group of electrons, no additional electrons can enter the island, due to its charging energy. In order to demonstrate the Coulomb blockade effect, the charging energy of the island needs to exceed the surrounding thermal energy, so that thermal electrons do not swamp the charge of the island. This requires either the device to be cooled to liquid nitrogen temperatures to reduce the thermal energy or, if the device is to operate at room temperature, the scale of the island needs to be of the order of 1 or 2 nm, which is beyond the capability of current e-beam lithographic techniques.

Charge is caused to enter and leave the island by means of a multiple tunnel junction device. In the device disclosed in WO94/15340 supra, the multiple tunnel junction device comprises a side gated structure which gives rise to multiple, stable electron states on the island, which can be used to provide a memory.

It has previously been proposed to improve the characteristics of a conventional transistor, which operates using a conventional current, which comprises many thousands of electrons per second, by associating a multiple tunnel junction device with the gate of the transistor, so that when in the off state, the multiple tunnel junction device minimises leakage current. Reference is directed to our EP-A-0 649 174. In this device, the gate is provided with a finger structure, constructed on the nanometre scale so as to produce e.g. by a field effect, a series of tunnel barriers in the source-drain path of the transistor. The multiple barriers act as a multiple tunnel junction so that in the off state, electron transport through the device is limited by Coulomb blockade, thereby significantly reducing leakage current from the drain to the source. However, this device is difficult to manufacture because the finger members formed in the gate need to be fabricated on a nanometre scale and current technologies do not permit such a device to be constructed readily on a scale small enough for operation at room temperature.

In "Superlattice tailoring to obtain devices with high saturation velocity" IBM Technical Disclosure Bulletin, Vol 29. No 7, December 1986, pp 2931–2, a transistor is described which has a superlattice in its source-drain path, formed of overlying, conductive layers of opposite conductivity type. The superlattice gives rise to energy subbands or minibands which allow the overall electron velocity to be increased.

In our EP 96308283.9 filed on Nov. 15, 1996, and corresponding U.S. Ser. No. 08/958845 filed on Oct. 28, 1997 there is described a memory device which includes a memory node to which charge is written through a tunnel barrier configuration from a control electrode. The stored charge affects the conductivity of a source-drain path and data is read by monitoring the conductivity of the path. The charge barrier configuration comprises a multiple tunnel barrier which may comprise alternating layers of polysilicon of 5 nm thickness and layers of silicon nitride of 2 nm thickness, overlying a polycrystalline layer of silicon, part of which acts as a memory node. Alternative barrier configurations are described including conductive nanometre scale conductive islands which act as a memory node, distributed in an insulating matrix. The advantage of the tunnel barrier configuration is that it reduces leakage current from the memory node without degrading the reading and writing times for the memory. Different types of memory device are described. In a first type, charge carriers from a control electrode pass through the tunnel barrier configuration to the memory node in response to a voltage applied to the control electrode. In a second type of device, an additional gate is provided for the tunnel barrier configuration in order to control the transfer of charge carriers from the control electrode to the memory node.

SUMMARY OF THE INVENTION

In accordance with the invention it has been appreciated that the charge barrier configuration can also be used in a controlled conduction device such as a transistor. The tunnel barrier configuration is used to provide a conductive path between a source and drain. When switched on, charge carriers can flow between the source and drain, but when switched off, the barrier configuration inhibits charge leakage through the path. A large on/off current ratio is thus obtained.

According to the invention there is provided a controllable conduction device comprising: source and drain regions, a conduction path for charge carriers between the source and drain regions, a gate for controlling charge carrier flow along the conduction path, and a barrier structure in the conduction path formed of regions of relatively conductive and non-conductive material such that under a first bias condition charge carrier flow can occur along the path and under a second bias condition the regions present a tunnel barrier configuration that inhibits charge carrier flow along the path, the regions providing an energy band profile that comprises a dimensionally relatively wide barrier component with a relatively low barrier height, and at least one relatively narrow barrier component with a relatively high barrier height.

The multiple tunnel junction configuration may comprise a plurality of alternating layers of relatively conductive and non-conductive material. For example, alternating layers of silicon and silicon nitride can be used, although an oxide of silicon can be used instead of the nitride layer.

The alternating layers of non-conductive material may have a thickness of 3 nm or less, so as to provide the tunnel barrier configuration.

In use, a conventional current may flow along the conduction path between the source and drain regions, which can be switched between on and off states by applying a voltage to the gate. When in the off state, the leakage current is extremely small due to the barrier configurations presented by the multiple tunnel junction configuration in the source-drain conduction path. The layers can be made of sufficiently small thickness that the tunnel junction device blocks charge leakage at room temperature.

The device may be constructed on a substrate, with the alternating layers of the multiple tunnel junction being formed on the substrate. The substrate is conveniently an insulating layer and, where the device is made of silicon containing layers, an insulating silicon dioxide layer on a silicon wafer substrate may be used. However, other insulating substrates may be used, for example quartz, where it is desired to incorporate an array of conduction devices according to the invention in a display. Other substrates may be used such as ceramics or metals.

Thus, by means of the invention, controllable conduction devices operable with a conventional current may be further miniaturised, whilst suffering less from the problem of leakage current than hitherto.

Complementary structures may be formed, including first and second of the devices, of different conductivity types, which may be stacked one upon the other.

A device according to the invention may be used in a memory cell including a charge storage capacitor, for selectively writing charge to the capacitor. An array of the memory cells may be provided.

The invention also includes a method of fabricating a controllable conduction device comprising: forming a multiple layer structure to provide a multiple tunnel junction configuration, and forming source and drain regions for a conduction path for charge carriers, forming a gate for controlling charge carrier flow along the conduction path, and forming a barrier structure in the conduction path that comprises regions of relatively conductive and non-conductive material such that under a first bias condition charge carrier flow can occur along the path and under a second bias condition the regions present a tunnel barrier configuration that inhibits charge carrier flow along the path, the regions in the absence of an applied bias presenting an energy band profile that comprises a dimensionally relatively wide barrier component with a relatively low barrier height, and at least one relatively narrow barrier component with a relatively high barrier height.

The source and drain regions may be formed in an overlying relationship. This may be achieved by forming a first conductive doped layer on a substrate, forming the multiple layer structure to overlie the first conductive doped layer, forming a second doped conductive layer to overlie the multiple layer structure, and configuring the first and second doped layers into the source and drain regions.

Alternatively, the source and drain regions may be formed in a laterally spaced relationship.

In another aspect, the invention gives rise to improvements which relate to the aforementioned device and also to the memory device disclosed in co-pending U.S. Ser. No. 08/958845 supra. Considering the second type of memory device disclosed in this copending application, the tunnel barrier configuration is arranged as an upstanding pillar, with the control electrode overlying it. The additional gate applies an electrostatic field, primarily from above, downwardly through the pillar structure in order to write charge onto the memory node. In this configuration, a high electric field is applied between the gate and the memory node in the case of the memory device, or between the gate and the drain, in the case of the transistor. This high electric field causes electron-hole pairs to be produced, and an accumulation of carriers near the gate structure, which screens the confinement potential.

In order to overcome these problems, the invention provides a controllable conduction device comprising an upstanding pillar structure having a side wall and a top surface, the structure being formed of regions of relatively conductive and non-conductive material such that in a first condition, charge carrier flow can occur through the pillar structure and in a second condition the regions present a tunnel barrier configuration that inhibits charge carrier flow through the pillar structure, said regions providing an energy band profile that comprises a dimensionally relatively wide barrier component with a relatively low barrier height, and at least one relatively narrow barrier component with a relatively high barrier height, and a side gate structure alongside the side wall of the pillar structure, configured to apply an electric field through the side wall into the pillar structure to control electrical conductivity therein.

The device according to the invention can be used in a memory that includes a memory node to receive charge carriers that pass along a path through the pillar structure. The side gate can be operated to control charge carrier flow along the path so as to control the charge stored in the node.

The device can also be operated as a transistor in which source and drain regions are provided so as to provide a source-drain charge carrier flow path through the pillar structure, with the side gate being operated to control charge carrier flow along the path.

The side gate structure may comprise a Schottky gate or a junction gate.

The invention also provides an improved non-volatile configuration and in accordance with the invention there is provided a memory device comprising a barrier structure formed of regions of relatively conductive and non-conductive material such that in a first condition, charge carrier flow can occur through the pillar structure and in a second condition the regions present a tunnel barrier configuration that inhibits charge carrier flow through the structure, a memory node to receive charge carriers that pass along a path through the structure, and a control electrode for supplying charge carriers to the path so as to pass through the structure to be stored at the node, wherein the regions of non-conductive material are configured so as to provide an energy band profile that comprises dimensionally relatively narrow barrier components adjacent the memory node and the control electrode respectively, and a dimensionally relatively wide barrier component between the narrow barrier components, the barrier components being configured such as to provide non-volatile charge storage at the node.

In another aspect, the controlled conductivity device includes a barrier structure formed of regions of relatively conductive and non-conductive material such that in a first condition, charge carrier flow can occur through the structure and in a second condition the regions present a tunnel barrier configuration that inhibits charge carrier flow through the structure, an output region to receive charge carriers that pass along a path through the structure, and an input region for supplying charge carriers to the path so as to pass through the structure to the output region, wherein the regions of non-conductive material are configured so as to provide an energy band profile that comprises guard barrier components adjacent the input and output regions respectively, and a main barrier component between the guard barrier components, the main barrier component having a width of 2 nm or more, the guard barrier components having a width of 3 nm or less and the barriers being spaced apart by 45 nm or less.

The present invention in a further aspect, provides an improved device in a generally lateral configuration. In accordance with the invention from this further aspect there is provided a controllable conduction device comprising a substrate, control elements spaced apart laterally on the substrate, a channel structure electrically connected to and extending between the control elements, the channel structure being formed of regions of relatively conductive and non-conductive material such that in a first condition, charge carrier flow can occur through the structure and in a second condition the regions present a tunnel barrier configuration that inhibits charge carrier flow, and a gate region configured to apply an electric field into the channel structure to control electrical conductivity therein, the channel structure being configured so as to lip under one of the control elements and lip over the other of the control elements on the substrate.

The device may be configured as a transistor or a memory device.

BRIEF DESCRIPTION OF THE DRAWINGS

In order that the invention may be more fully understood embodiments thereof will now be described by way of example with reference to the accompanying drawings in which:

FIGS. 3a–l illustrate process steps in the fabrication of a vertical transistor structure in accordance with the invention;

FIG. 4 illustrates schematically in plan view the device manufactured by the process shown in FIG. 3;

FIGS. 40a–l illustrate the process steps for manufacturing another embodiment of transistor device in accordance with the invention;

DETAILED DESCRIPTION

Vertical Transistor Structure

Figure 1:
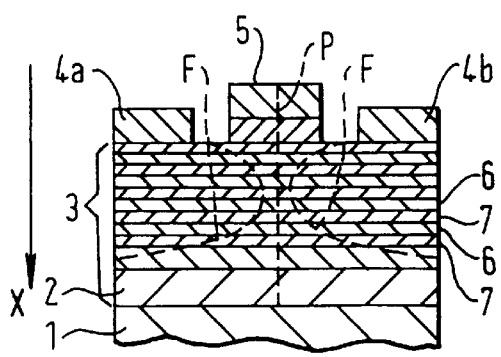
FIG. 1 is a schematic cross sectional view of a vertical transistor structure in accordance with the invention.

FIG. 1 illustrates in section a first embodiment of controllable conduction device according to with the invention, in the form of a transistor. The device comprises a substrate 1, with a drain region 2 comprising a layer of n-doped polysilicon, overlaid by a multiple layer structure 3 that gives rise to a multiple tunnel junction configuration. The layer structure 3 comprises alternate layers of relatively conducting and non-conducting material and in this example comprises layers of silicon and silicon nitride as will be explained in more detail herein. The multiple layer structure 3 is overlaid by gate regions 4a, 4b and source region 5 is disposed between the gate regions. The source and gate regions 4, 5 may comprise n-doped polysilicon. In use, current flows along a path P, from the drain 2 to the source 5, transversely of the planes of the layers in the structure 3. A voltage applied to the gate 4a, b controls the drain-source current. Equipotential field lines F produced by the gate voltage in the layer structure 3 are shown in dotted outline.

Figure 2A:
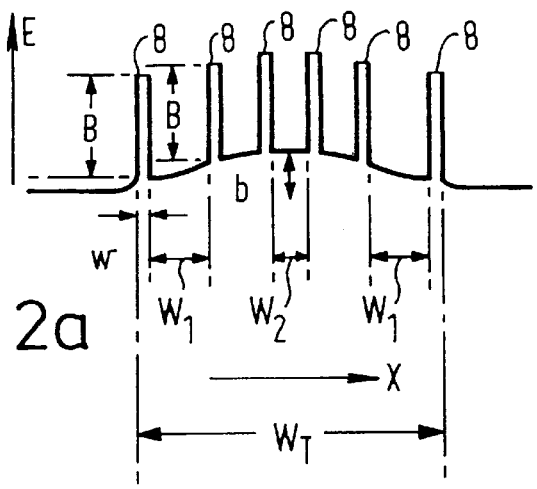
FIGS. 2a and 2b are energy diagrams for explaining the operation of the tunnel barrier configuration shown in FIG. 1 in the absence of a source-drain voltage and, when forward biassed by a source-drain voltage respectively.

Referring to the multiple layer structure 3, it comprises silicon layers 6 disposed between layers 7 of electrically insulating, silicon nitride material. The insulating layers 7 are typically of the order of 3 nm in thickness and give rise to an energy band diagram as shown in FIG. 2a. The insulating layers 7 give rise to relatively high barriers 8, of height B, of a relatively narrow width dimension ω corresponding to the width of the individual layers 7. In this example, the width dimension ω is of the order of 3 nm.

The spacing of the individual barriers 8 is determined by the thicknesses of the layers 6 of the conductive silicon material. Towards the top and bottom of the layer structure 3, the layers $6_1$ (shown in detail in FIG. 3a) have a thickness W1 of the order of 50 nm and in the central region of the stack, the layers $6_2$ have a thickness W2 of the order of 5 nm.

Collectively, as shown in FIG. 2a, in the absence of any applied bias, the layers of the structure 3 give rise to a barrier of height b which is relatively low compared to the barrier height B of the individual layers 7, but which is relative wide in terms of its physical dimension, corresponding to a width $W_T$ of the entire multiple layer structure 3.

Figure 2B:
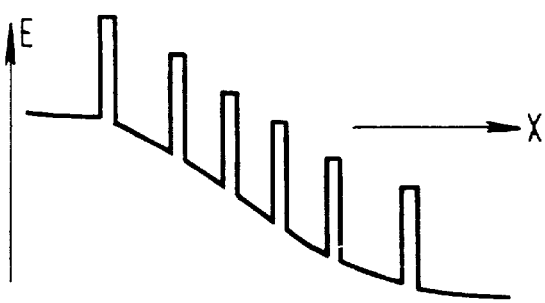

When a source-drain voltage is applied to the device, the energy diagram for the multiple layer structure 3 adopts the configuration shown in FIG. 2b. It will be seen that electrons can pass from the source 5 to the drain 2, tunnelling through the relatively narrow barriers ω, falling down the potential gradient provided by the source-drain voltage.

In the configuration shown in FIG. 2a, when the source-drain voltage is zero, the relatively wide, but low barrier b presented by the layer structure 3 collectively, together with the relatively high barriers 8, of height B, gives rise to a barrier which inhibits charge carrier conduction between the source and drain 5, 2. The wide barrier b inhibits electron tunnelling between the source and drain and furthermore, the individual, spaced apart barriers 8 give rise to electron traps that inhibit electron tunnelling. The fact that the barriers at the top and bottom of the stack are spaced by a distance $W_1$, wider than the spacing $W_2$ of the inner layers of the stack, increases the height b of the wide barrier. The barrier structure additionally inhibits leakage of current from the gate regions 4a, 4b, to the drain. It will be seen from FIG. 1 that the multiple layer structure 3 presents a corresponding barrier to charge carrier conduction from the gate regions 4a, b, to the drain as for conduction from the source region 5.

When a source-drain voltage is applied, conduction occurs from the drain to the source in the manner of a conventional transistor and a conventional current flows, consisting of many thousands of electrons per second. Conduction along the path can be controlled by applying a gate voltage, in a conventional manner, which gives rise to a field which "pinches" the width of the conduction path P between the source and the drain, by an amount dependent on the gate voltage.

A method of fabricating the device will now be described in more detail with reference to FIG. 3.

Figure 3A:
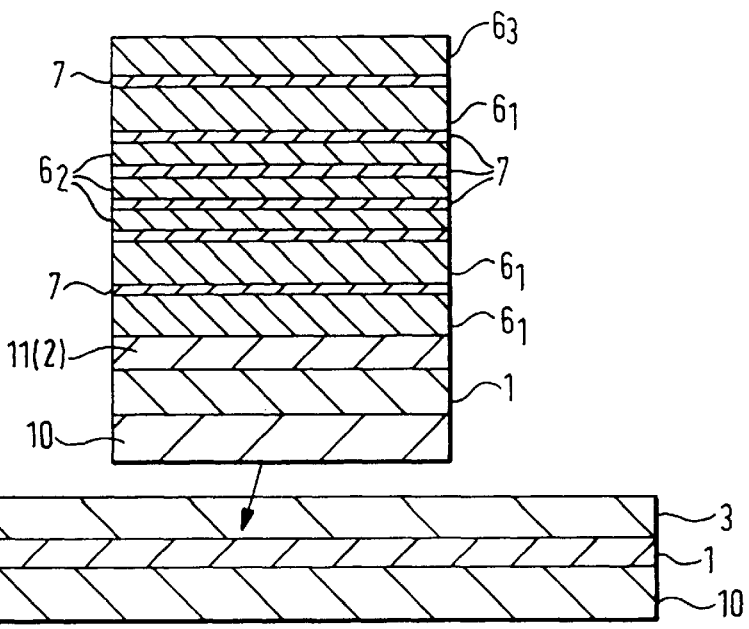

Referring to FIG. 3a, the starting materials comprise a silicon wafer 1 which is thermally oxidised at 1000° C. to form a 600 nm layer 10 of $SiO_2$, which acts as an insulating substrate. Then, a layer 11, which is used to produce the drain 2 is formed on the $SiO_2$ layer 10. The layer 11 comprises 50 nm thickness polysilicon deposited in a reactor by low pressure chemical vapour deposition (LPCVD). A thin silicon dioxide layer of thickness of the order of 10 nm is formed by thermal oxidisation on the surface of the layer 11. Arsenic ions are then implanted in the layer 11 to form an n± doped conductive layer that can be used for the drain 2. The arsenic ions are implanted with a dosage of $3 \times 10^{15}$ $cm^{-2}$ at an energy of the order of 25 keV through the oxide layer (not shown). The oxide layer is then removed by wet etching using a 20:1 BHF solution.

Thereafter, a stack of the silicon and the silicon nitride layers 6, 7 are grown so as to form the multiple layer structure 3 that gives rise to the multiple tunnel junction. Initially, the layers 6 of silicon are formed to have a relatively large thickness $W_1=50$ nm and then, for the major part of the stack, the thickness of the layers $6_2$ is of the order of $W_2=5$ nm. At least one further layer $6_1$ of width $W_1$ is formed at the top of the stack and in this example, a further layer $6_3$ of silicon is formed with a thickness of 30 nm.

The layers 6, 7 are formed in the LPCVD reactor. The process involves thermal nitridation of silicon as described in detail by M. Moslehi and K. C. Saraswat, IEEE Trans. Electron Device, ED-32, 106 (1985). so as to form thin, tunnel junctions, in which the thickness of the nitride is self-limited to around 2–3 nm, with a tunnel barrier height B of the order of 2 eV.

The layer structure 3 is thus built up to form a superlattice by firstly depositing a silicon layer in the LPCVD reactor at 770° C. in $SiH_4$ gas to achieve the appropriate thickness of silicon for the relevant layer shown in FIG. 3a. Thereafter, the surface of the deposited silicon is directly converted to silicon nitride at 930° C. for 20 minutes in a 100% $NH_3$ gaseous atmosphere at 1 Torr in the reactor. Then a further layer of silicon is deposited on the silicon nitride in the same chamber. Accordingly, pure silicon nitride without any silicon oxide is formed between the successive deposited silicon layers.

Figure 3B:
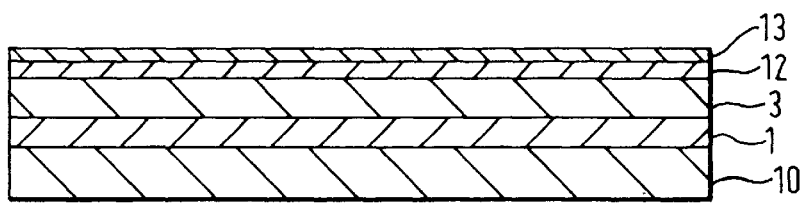

Referring to FIG. 3b, a layer 12 of silicon dioxide of thickness 10 nm is formed by thermal oxidisation over the layer structure 3, and a silicon nitride layer 13 of thickness 160 nm is formed in the LPCVD reactor, at a temperature of 740° C.

Figure 3C:
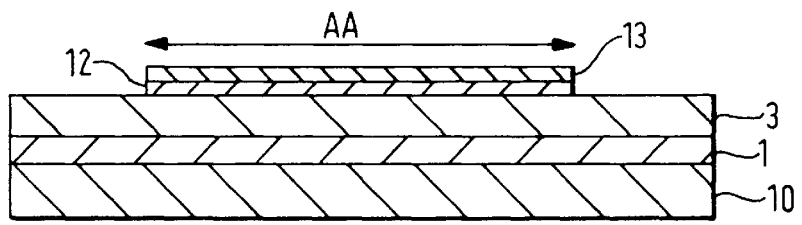

Referring to FIG. 3c, the layers 12, 13 are then patterned using optical lithography and a dry etching method in an atmosphere of $CHF_3$ and argon gas, in a manner well known per se. The resulting structure has a lateral width dimension AA and a breadth (described later with reference to FIG. 4) of dimension Y.

Figure 3D:
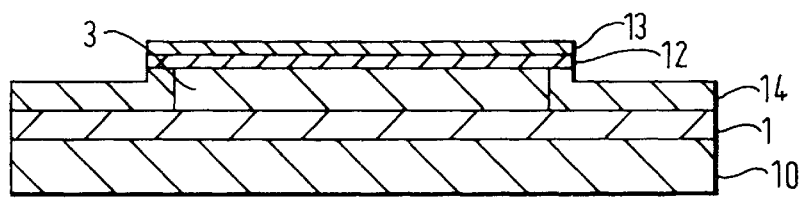

As shown in FIG. 3d, the patterned layers 12, 13 are then used as a mask in order to dry etch the multiple layer structure 3 so as to remove most of the layers 6, 7 outside of the dimension AA, but leaving a thickness of approximately 80 nm of the structure 3 outside of the masked pattern. This remaining portion of the region 3 is then converted into silicon dioxide by thermal oxidisation to form isolation regions 14 in order to isolate adjacent transistors (not shown) formed by the inventive method on the same substrate 1.

Figure 3E:
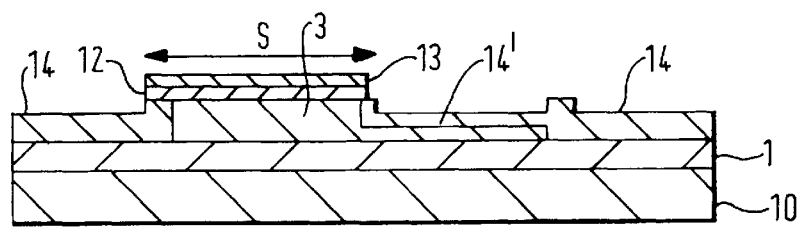

Referring to FIG. 3e, the layers 12, 13 are patterned using optical lithography and a dry etching method in an atmosphere of $CHF_3$ and argon gas. The patterned layers 12, 13 are then used as a mask in order to dry etch the multiple layer structure 3 so as to remove most of the layers 6, 7 outside of the dimension S, but leaving a thickness of approximately 80 nm of the structure 3 outside the masked pattern. The remaining portion of the region 3 is thermally oxidised to form silicon oxide isolation layer 14 of thickness 50 nm.

Referring to FIG. 3f, the silicon nitride and silicon oxide layers 12, 13 are removed using orthophosphoric acid at 160° C. and a 20:1 BHF solution. Then, a layer 15 of polysilicon is deposited with a thickness of 100 nm by LPCVD. A silicon oxide layer 16 of thickness 100 nm is then deposited on the layer 15. Arsenic ions are implanted at an energy of 140 kev and a dosage of $5 \times 10^{15}$ $cm^{-2}$ in order to change the silicon layer 15 to a heavily doped, n-type layer. Thermal annealing at 800° C. for one minute is then carried out in order to activate the arsenic ions and provide heavily n-doped electrical characteristics in the layer 15, which is used later to provide the source 5 of the device.

Referring to FIG. 3g, the silicon dioxide layer 16 is patterned using electron beam lithography and dry etching to provide an elongate region of width X which will be used as a mask to define the source region 5. Then the silicon layer 15 is correspondingly etched in $CF_4$ gas, down almost to the layer structure 3. Referring to FIG. 3h, an insulating $SiO_2$ layer is deposited and then etched in $CHF_3$ and argon gas, so as to leave side wall $SiO_2$ regions 16.

Referring to FIG. 3i, a layer 4 of polysilicon for forming the gate is deposited to a thickness of 100 nm by LPCVD. Using optical lithography and dry etching, the polysilicon layer is removed outside of the dimension "GATE". An insulating $SiO_2$ layer 17 is then deposited to a thickness 100 nm by CVD.

Then, as shown in FIG. 3j, a contact window CW1 is etched through the oxide layers 17 and 14' in order to allow electrical connection to be made to the layer 11—the lowermost layer of the multiple layer structure 3, which forms the drain 2. The contact window CW1 is formed by optical lithography and wet etching using 20:1 BHF solution. At the same time, a contact window CW2 is made to the gate.

As shown in FIG. 3k, a metallisation layer 18 is formed by sputtering in order to provide electrical connections to the gate and the drain. The layer 18 comprises an initial layer of titanium, of 100 nm thickness, overlaid by a 1000 nm thickness layer of aluminium/silicon (1%), produced by conventional sputtering techniques.

As shown in FIG. 3l, an electrical insulation space 19 is etched into the layer 18 so as to provide first and second portions 18a, 18b. The portion 18a provides a connection through the contact window CW1 to the layer 11, and hence to the drain region 2. The portion 18b provides a connection through window CW2 to the layer 4, which overlies the insulating layers 16, around the multiple layer structure 3, that gives rise to the multiple tunnel junction device, and thus acts as a gate.

The resulting device is shown schematically in plan view in FIG. 4. From FIG. 4 it can be seen that the process step described with reference to FIG. 3j that formed the contact window CW1 and CW2 can also be used to form a contact window CW3 through the $SiO_2$ overlayer 16, so as to provide an external electrical connection to the heavily doped n-type region 15 that forms the source region 5. Additionally, when the insulating gap 19 (FIG. 3l) is formed, an insulating gap 20 (FIG. 4) is also formed so as to define portion 18c of the sputtered layer 18. This provides an electrical connection through contact window CW2 to the source 5 through conductive layer 15.

During and after the growth of the layers 6, 7 of the multi-layer structure 3, the overall wafer is heated to 900–1000° C. for several hours in to form the isolation regions 14, 14' by thermal oxidisation. However, to ensure that the resulting device operates successfully, it is important that the dopants from the heavily doped source and drain regions 5, 2 do not migrate into the silicon layers $6_1$ of the layer structure 3. In the described embodiment, the uppermost and lowermost layers 7 of silicon nitride act as barriers fro the n+ dopants in the layers 10, 15 and prevent them from diffusing into the central region of the multi-layer structure 3 during the heating process.

FIG. 4 shows the active region of the transistor to be X×Y. Typically X=50 nm and Y=200 nm.

Figure 5:
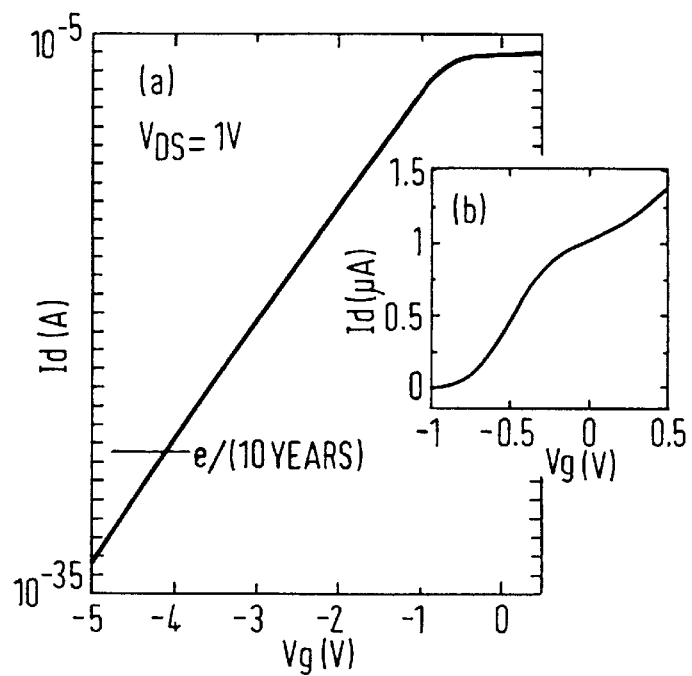
FIG. 5 is a graph illustrating the operating characteristics of the device.

FIG. 5 illustrates the electrical characteristics of the resulting vertical transistor. The transistor exhibits an extremely low leakage current when switched off. Typically, the transistor is switched to its off state when a negative gate voltage is applied, thereby switching off conduction between the source and the drain 2, 5. The escape time of one electron was estimated to be of the order of 10 years at a gate voltage of −4v at normal room temperature. The current $I_{DS}$ in the on state is small compared with a conventional transistor, of the order of 1 $\mu A$, due to the resistance of the multiple tunnel junction configuration 3. A high switching speed can be obtained, by reducing the number of electrons that flow along the conductive path. This is achieved by making the dimensions X×Y small as compared with conventional transistors, as can be seen by the example given hereinabove, with the advantage that the size of the device can be reduced significantly, compared with prior art transistors. Thus, with a device constructed as described herein, the charging/discharging time, $Q/I_{DS}$ is around 1 n sec when Q=6000 e (where e represents the charge of 1 electron). If higher currents are required, transistors can be connected in parallel.

Lateral Transistor Structure

Figure 6:
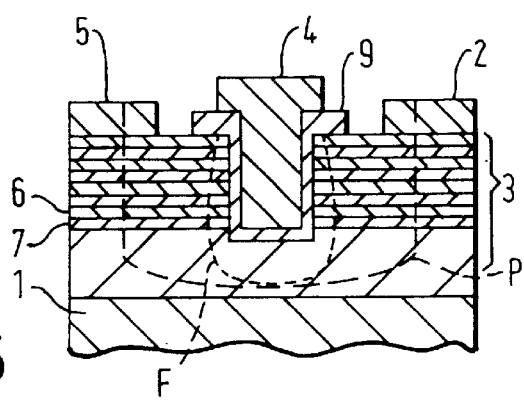
FIG. 6 is a schematic sectional view of a lateral transistor device in accordance with the invention.
Figure 7A:
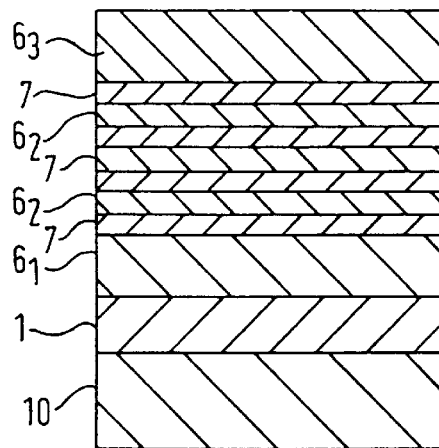
FIGS. 7a–j illustrate process steps in the fabrication of a lateral transistor device in accordance with the invention.

A lateral transistor structure in accordance with the invention is shown in cross section schematically in FIG. 6. Like parts of the device to those shown in FIG. 1 are marked with the same reference numbers. In this embodiment, the source and drain regions 2, 5 are disposed laterally spaced apart, with the gate 4 between them. The source and drain regions 2, 5 both overlie the multiple layer structure 3 and the gate 4 extends into the structure 3, surrounded by an insulating layer 9. The conduction path P between the source and drain 5, 2 is shown schematically in dotted outline, and extends downwardly through the structure 3, transversely of the layers thereof, around the gate 4 and then vertically upwardly through the layer structure 3, transversely of its layers, to the drain 2. As shown by the equipotential field line F, a voltage applied to the gate 4 controls conduction between the source and the drain. The resulting lateral structure is characterised by a low leakage current in a similar way to the vertical structure previously described. A practical example of a fabrication method for the lateral device of FIG. 6, will now be described in detail with reference to FIG. 7. The process uses similar techniques to those described in relation to FIG. 3. In FIG. 7*a*, the initial silicon wafer 1 is thermally oxidised at 1000° C. to form a 600 nm thickness layer 10 of silicon dioxide. Then, the multiple layer structure 3 is formed generally in the manner previously described in relation to FIG. 3, but with the drain layer 11 omitted.

A first layer 6₁ of polysilicon of thickness 100 nm is grown onto the layer 10 followed by a sequence of layers 7 of silicon nitride, and 6₂ of polysilicon, of thicknesses 3 nm and 5 nm respectively, in a manner previously described with reference to FIG. 3*a*. A further polysilicon layer 6₃ of thickness 100 nm is grown on the top of the sequence.

Figure 7B:
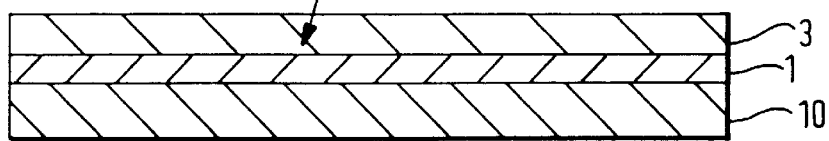

Referring to FIG. 7*b*, a silicon dioxide layer 12 of thickness 100 nm is formed by thermal oxidisation and is then subjected to ion implantation with arsenic ions with a dosage of $5 \times 10^{15}$ cm$^{-2}$, at an energy level of 140 keV. Thermal annealing is then carried out at 800° C. for one minute in order to activate the arsenic ions. Then, a layer 13 of silicon nitride, of thickness 160 nm is deposited over the layer 12 at a temperature 740° C.

Figure 7C:
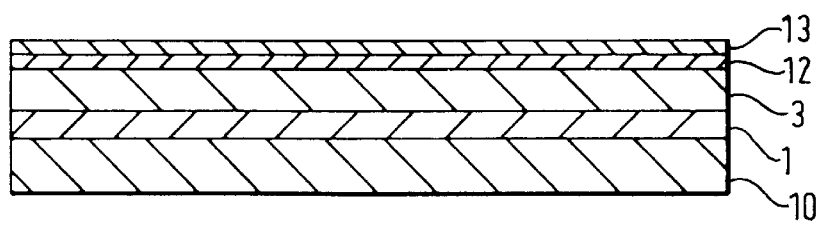
Figure 7D:
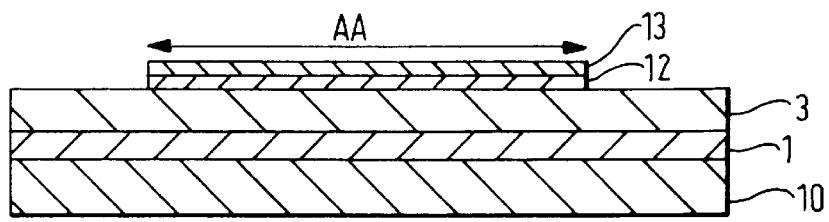

As shown in FIG. 7*c*, the layer structure 12, 13 is subjected to optical lithography and dry etching using CHF₃ and argon gases in order to form a pattern of width AA. As shown in FIG. 7*d*, the pattern is then dry etched into the layers of the multiple layer structure 3, leaving a thickness of approximately 80 nm in the etched areas, in a similar way to the method described previously with reference to FIG. 3*d*.

Figure 7E:
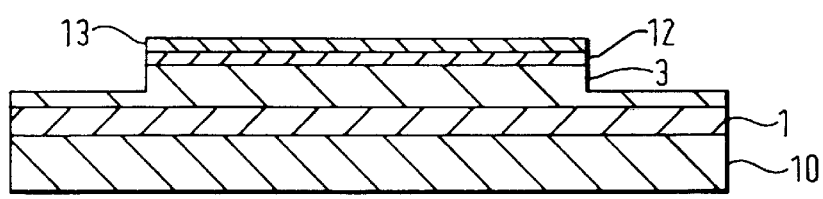

Then, as shown in FIG. 7*e*, silicon dioxide isolation regions are formed around the remaining part of the multiple layer structure 3.

Figure 7F:
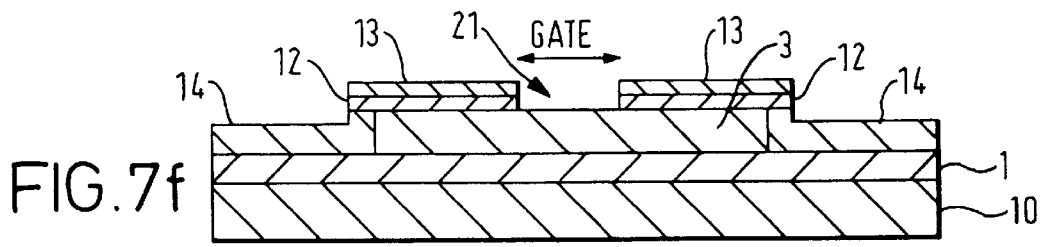
Figure 7G:
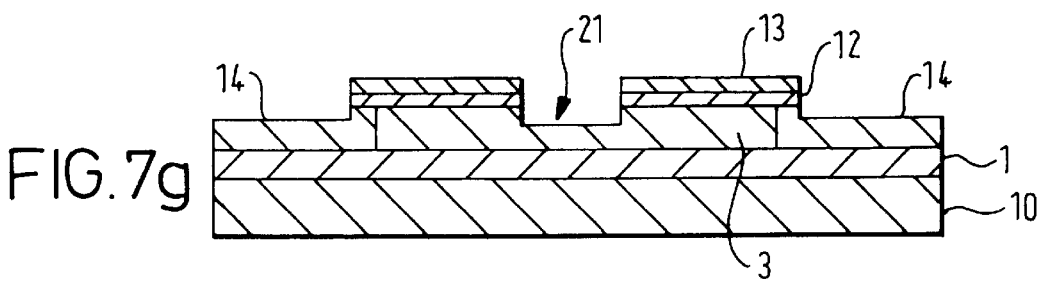

FIG. 7*f* illustrates how an opening 21 is formed in the layers 12, 13, to receive the gate 4. The opening 21 is etched in the layers 12, 13 by conventional optical lithography and dry etching, in an atmosphere of CHF₃ and argon gases. The multiple layer structure 3 is then dry etched through the gate opening 21 using CF₄ gas until the etched part has a thickness of the order of 80 nm, as shown in FIG. 7*g*.

Figure 7H:
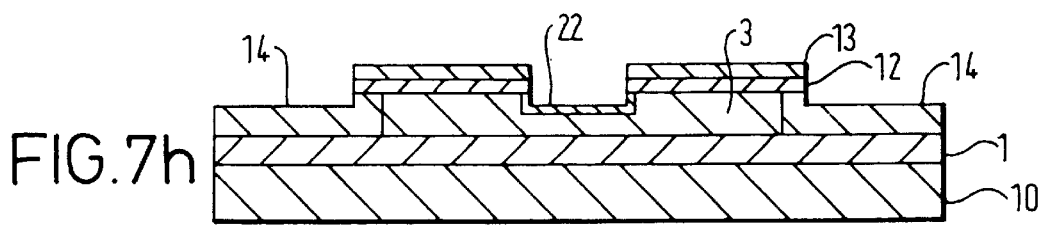

Then, as shown in FIG. 7*h*, silicon dioxide in a layer 22 is grown in the gate opening 21, to a thickness of 20 nm by conventional thermal oxidation.

Figure 7I:
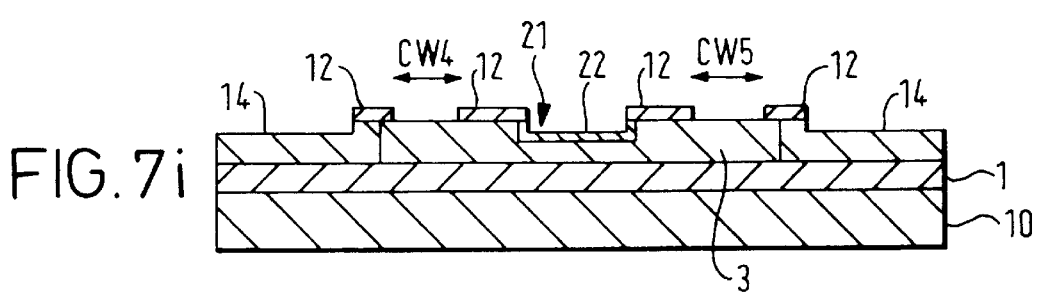

As shown in FIG. 7*i*, the silicon nitride layer 13 is then removed by the use of orthophosphoric acid at a temperature of 160° C. Then, using optical lithography and wet etching with a 20:1 BHF solution, the remaining silicon oxide layer 12 is patterned to provide contact windows CW4, CW5 for the source and drain 5, 2 respectively.

Figure 7J:
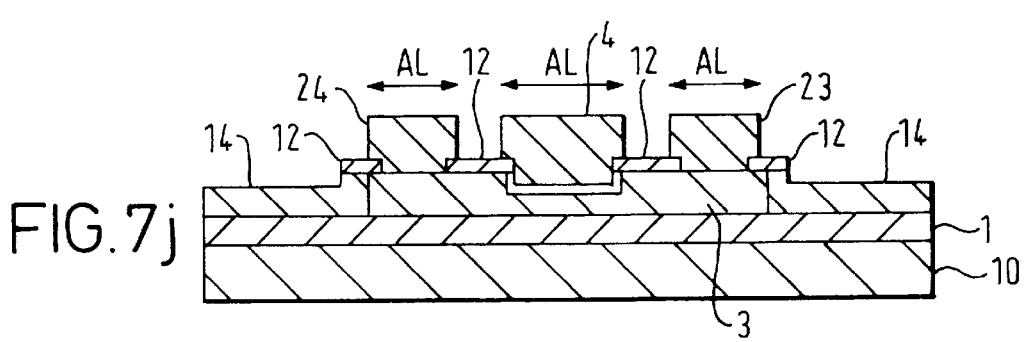

As shown in FIG. 7*j*, electrodes for the source, drain and gate regions 5, 2, 4 are sputtered into the opening CW4, CW5 and 21. The sputtered metallisation consists of 100 nm thickness titanium followed by 1000 nm thickness aluminium/silicon (1%). The metallisation is applied as a continuous layer and then using optical lithography and wet etching is patterned to provide the respective drain, gate and source regions 2, 4 and 5 shown in FIG. 5*j*.

Figure 8:
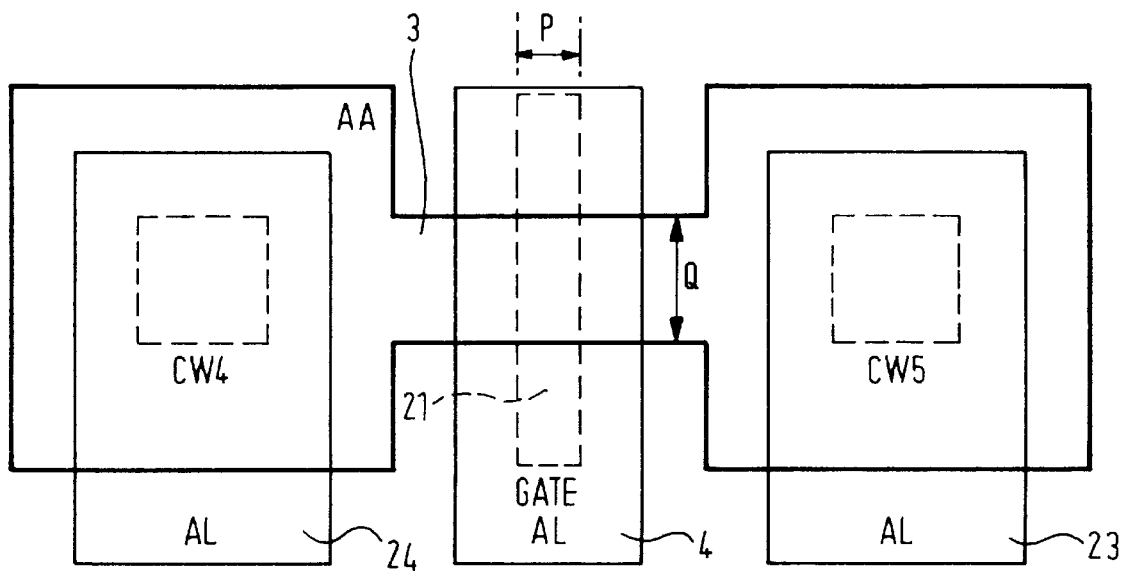
FIG. 8 is a schematic plan view of the device fabricated by the process of FIG. 7.

FIG. 8 illustrates the resulting lateral transistor in plan view. The area of the gate region is given by P×Q. In a typical example, P=150 nm and Q=200 nm.

Figure 9:
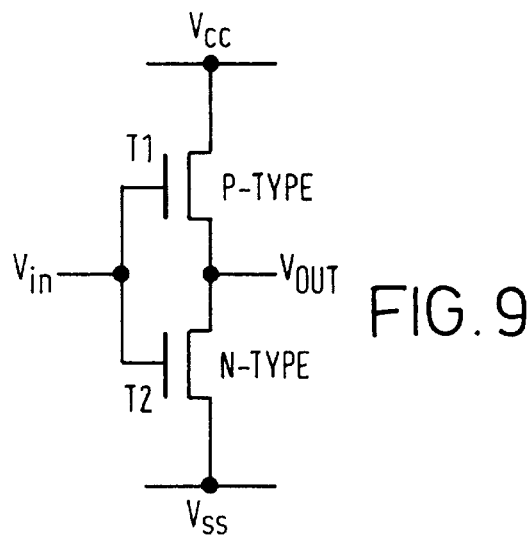
FIG. 9 is a schematic circuit diagram of a complimentary transistor pair.

It will be understood that large arrays of transistors according to the invention may be formed on a single substrate and they may be of vertical or lateral structures as described previously or a mixture of both. The substrate need not necessarily be silicon and the transistors can be formed on a substrate such as quartz or metal for use, for example in a flat display. The extremely low leakage current results in a very low power consumption. The described transistors in accordance with the invention can be configured to have complimentary conduction characteristics. An n-type transistor can be produced by doping the source and drain regions with n-type impurities such as arsenic or phosphorous, and p-type device is produced when the source and drain regions are doped with p-type impurities such as boron. The resulting transistors can be stacked in complimentary pairs and an example will now be described with reference to FIGS. 9, 10 and 11. The circuit diagram of the complimentary pair is shown in FIG. 9 and comprises complimentary n and p-type transistors T1 and T2, with a common gate connection $V_{in}$. The source-drain paths of the transistors are connected in series between rails $V_{CC}$ and $V_{SS}$, with a common output connection $V_{out}$.

Figure 10:
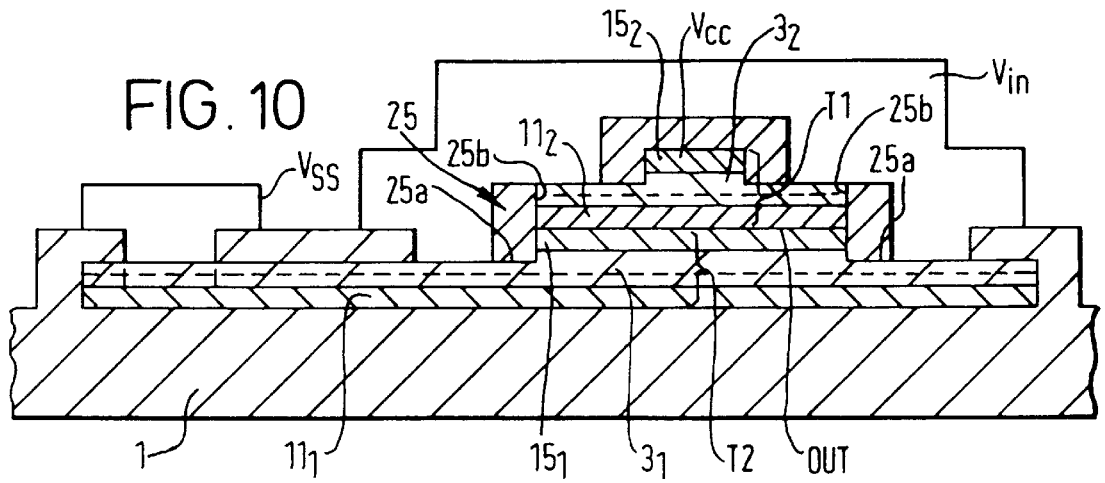
FIG. 10 is a schematic sectional view of the complimentary pair, fabricated with vertical transistors in accordance with the invention.
Figure 11:
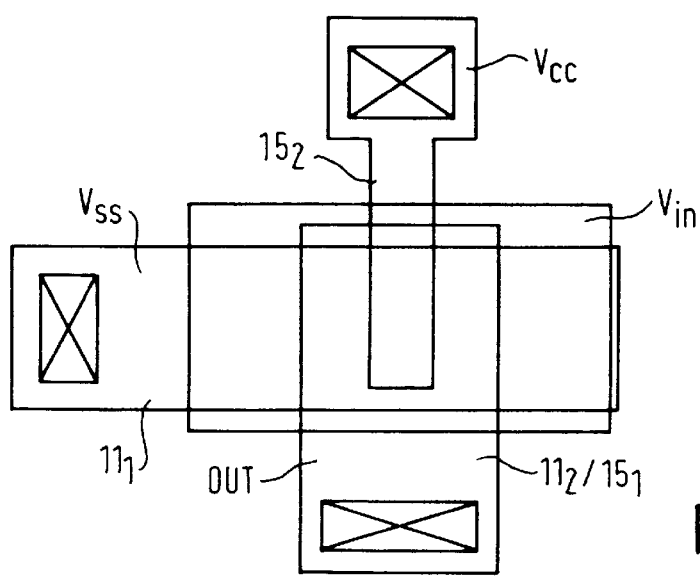
FIG. 11 is a schematic plan view of the arrangement shown in FIG. 10.

Referring to FIG. 10, the transistor T2 is shown stacked on transistor T1, which itself is formed on a substrate layer 10 which may comprise silicon dioxide as described previously.

The transistor T1 comprises a multiple layer structure 3₁ sandwiched between n⁺ polysilicon layers 11₁ 15₁, so as to form an n-doped vertical structure similar to that described with reference to FIG. 3.

The p-type transistor T2 consists of a multiple layer structure 3₂ corresponding to the structure 3 shown in FIG. 3, sandwiched between p⁺ doped polysilicon layers 112 and 152. A common gate region 25, which may comprise a sputtered metallic layer 18 described previously with reference to FIG. 3*k*, is applied over both of the transistors T1, T2. The voltage $V_{in}$ applied to the common gate region 25 controls charge carrier flow in a conduction path transversely through the layers of the multiple layer structure 3₁, by virtue of an electrical field applied through regions 25*a* into the multiple layer structure 3₁. A corresponding current control is achieved in the layer structure 3₂ for transistor T2, as a result of the field applied from the gate through regions 25*b*. Since the transistors are stacked upon one another, the complimentary pair of transistors only takes up the area of a single transistor on the substrate.

Figure 12:
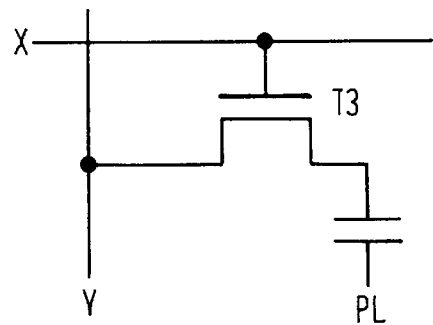
FIG. 12 is a schematic circuit diagram of a random access memory cell.

The previously described vertical transistor structure according to the invention can also be used with advantage to form memory cells in a memory cell array, for example in a random access memory. The conventional circuit diagram for a random access memory cell is shown in FIG. 12 and consists of a row line X and a column line Y coupled through a transistor T3 to a storage capacitor C. In the usual way, charge can be written to, or erased from the storage capacitor C by selectively switching on or off the transistor T3 by means of row and column voltages applied to the lines X, Y.

Figure 13:
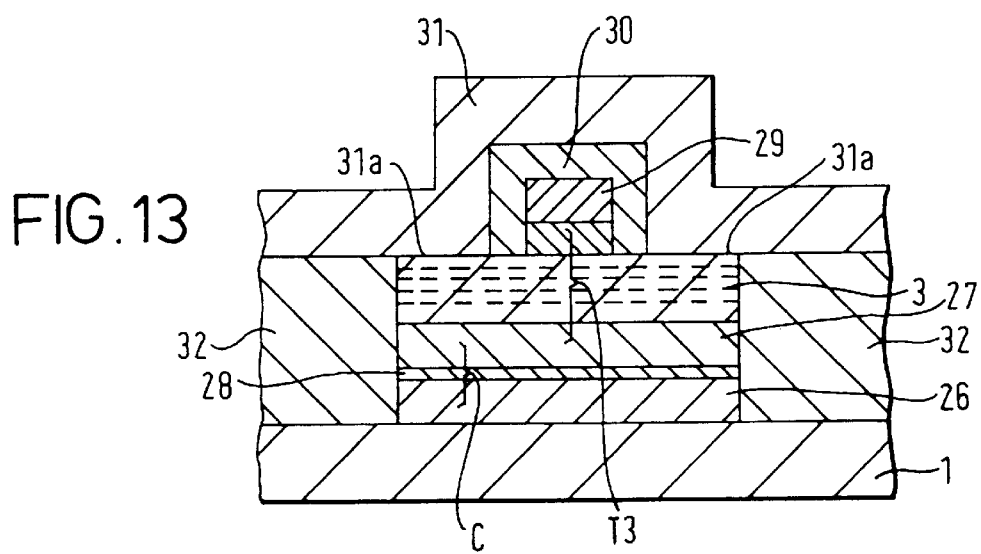
FIG. 13 is a schematic sectional view of the memory cell of FIG. 12 when fabricated using a vertical transistor structure in accordance with the invention.

FIG. 13 illustrates a first embodiment of memory cell, corresponding to the circuit of FIG. 12, formed so as to include a vertical transistor structure in accordance with the invention. The device consists of a silicon dioxide layer 10 formed on a substrate 1 (not shown) in the manner previously described. The capacitor C consists of first and second electrode plates 26, 27 formed of layers of n+ doped polysilicon of thickness 50 nm A dielectric layer 28 is sandwiched between the electrode plates 26, 27. The dielectric layer consists of a 5 nm thick layer of silicon dioxide in this example. The layer 27 of the capacitor also acts as the drain for a vertical transistor structure that includes a source 29 formed of a layer of n+ doped polysilicon of thickness 50 nm and a multiple layer 3, fabricated as previously described to include alternate layers of silicon and silicon nitride to form a multiple tunnel junction configuration. The source layer 29 is covered by an insulating silicon dioxide layer 30. The row line X is formed by a layer of n+ doped polysilicon 31, which runs transversely of the Y line 29. The layer 31 acts as a gate for the transistor and applies a field for controlling the conduction path through the layer structure 3 in regions 31a, in the manner described with reference to FIG. 1.

Thus, by applying a combination of voltages to the X and Y lines 29, 31, charge can be selectively written to and erased from the capacitor defined by the layers 26, 27 and 28. Regions of insulating silicon dioxide 32 surround the capacitor C and transistor T3 to enable elements of a two dimensional array to be constructed, without significant charge leakage between the elements.

Figure 14:
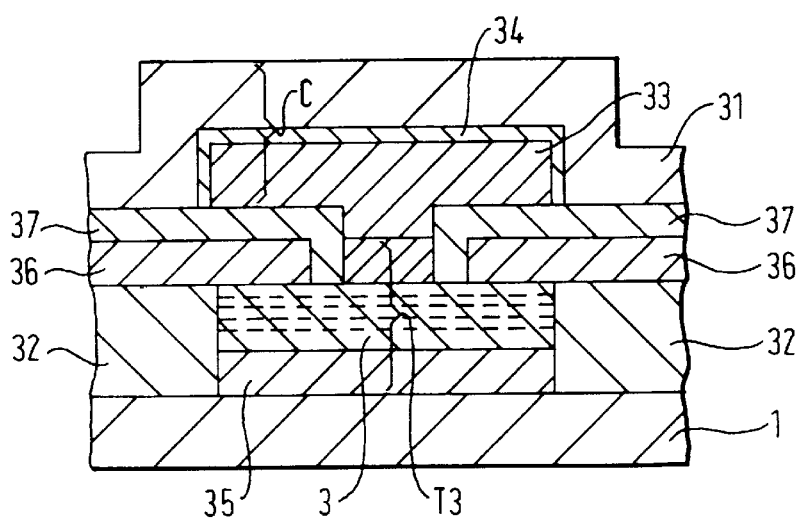
FIG. 14 illustrates in section an alternative embodiment of the random access memory cell fabricated in accordance with the invention.

Another embodiment of the memory cell array is shown in FIG. 14. In this embodiment, the capacitor C overlies the transistor T3. The capacitor C comprises an n+ polysilicon layer 31, which acts as a reference potential for the capacitor and a n+ polysilicon layer 33, which each act as a plate of the capacitor, and a dielectric layer 34, between the plates, comprising a 5 nm thickness insulating layer 34, formed of silicon dioxide.

The transistor T3 in this embodiment comprises a n+ polysilicon layer 35 which also runs over the chip to act as the Y column line, above which is formed the multiple layer structure 3, formed as previously described. The plate 33 of the capacitor C acts as the source for the transistor T3. The row line X is formed of a n+ doped polysilicon layer 36, insulated from the layer 31 and the capacitor by a silicon dioxide layer 37. A voltage applied to the X line 36 acts in region 36a to control the conduction that occurs in transistor T 3, transversely through the layers of the multiple layer structure 3, so as to control the transfer of charge to and from the capacitor C. Insulating silicon dioxide layers 32 isolate the memory cell from adjacent cells in the array.

Since the transistor T3 in the described embodiments of memory cell has an extremely low leakage current when in the off state, the power consumption of the memory cell is extremely low and as a result, the refreshment duty cycle can be decreased as compared with prior art devices.

Many modifications and variations to the described examples, falling within the scope of the invention, will be apparent to those skilled in the art. For example, whilst silicon nitride has been used in the layer structure 3 to provide tunnel barriers, it will be appreciated that other insulating films such as silicon dioxide could be used.

Side Gated Structures

A number of different multiple layer structures 3 will now be described, which can be used with the previously described vertical and lateral transistor structures and also in the memory devices described in U.S. Ser. No. 08/958845 supra, the contents of which are incorporated herein by reference. The layer structures 3 are provided with a side gate and the resulting arrangement gives rise to an improved performance, as will now be discussed.

Considering for example the vertical transistor device shown in FIG. 1, as previously explained, when a source-drain voltage is applied, conduction occurs from the drain to the source in the manner of a conventional transistor and a conventional current flows along path P consisting of $\sim 10^{13}$ of electrons per second. The voltage applied to the gate 4 gives rise to an electrostatic field which controls the conduction between the source 5 and the drain 2. A problem with this arrangement is however, that a relatively high electric field is applied directly between gate 4 and drain 2. This high electric field causes electric field induced electron-hole pairs to be created, and the accumulation of carriers near the gate 4 degrades the efficacy of the barrier provided by the layer structure 3.

Considering also the memory device of U.S. Ser. No. 08/0958845, an embodiment corresponding to FIG. 29 thereof will now be described with reference to FIG. 15 herein. The memory device is shown in cross section and is formed in a silicon substrate 1. The device includes a memory node 40 in the form of a polysilicon layer of 5 nm, which is overlaid by a layer structure 3, generally the same as that shown in FIG. 1, which provides the multiple tunnel barrier configuration. The layer structure 3 is made up of alternate layers of silicon and silicon nitride in the manner previously described. Charge carriers can be written onto the memory node 40 through the layer structure 3 from a control electrode in the form of a 30 nm thickness layer 41 of n-type silicon. The control electrode 41 is formed over a conductive layer 42 of intrinsic silicon of 30 nm thickness. The control electrode 41 is encapsulated in electrically insulating silicon dioxide layers 13, and 14.

A gate electrode 45 of polysilicon material overlies the layer structure 3 so as to apply an electrostatic field primarily downwardly into the layer structure, so as to allow the potential barrier structure provided by the layers 3 to be selectively raised and lowered, to permit charge to be selectively written onto the memory node 40. The polysilicon gate 45 is electrically insulated form the control electrode 41 by the silicon dioxide layers 43 and 44. Also, the gate 45 is insulated from side edges of the layer structure 3 by a thick oxide layer 46. No significant field from the gate 45 enters through the side edge of layer structure 3, and the conduction controlling field enters downwardly through the uppermost surface of the layer structure.

The memory node 40 acts as a field effect gate for controlling current flow between a source 47 and a drain 48 implanted in the substrate by conventional doping techniques. A conductive path 49 extends between the source and drain 47, 48 and the conductivity varies depending on the level of charge stored on the memory node 40. The use of the multiple layer structure 3 to provide a multiple tunnel junction between the control electrode 41 and the memory node 40 gives rise to an extremely low leakage current from the node 40. However, the gate electrode 45 does not raise or lower the potential barrier structure effectively under the control electrode 41 and raises the electric field in the region between the gate region and the memory node 40.

Figure 15:
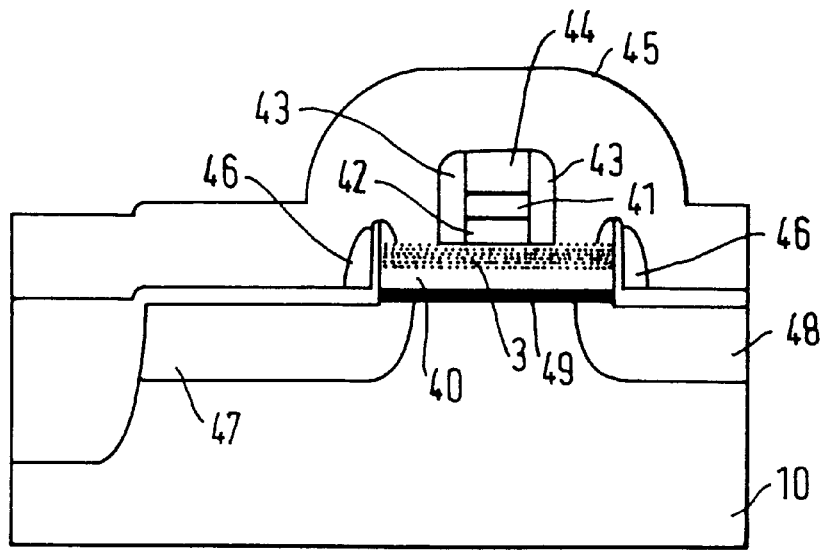
FIG. 15 is a cross section of an earlier memory device.
Figure 16A:
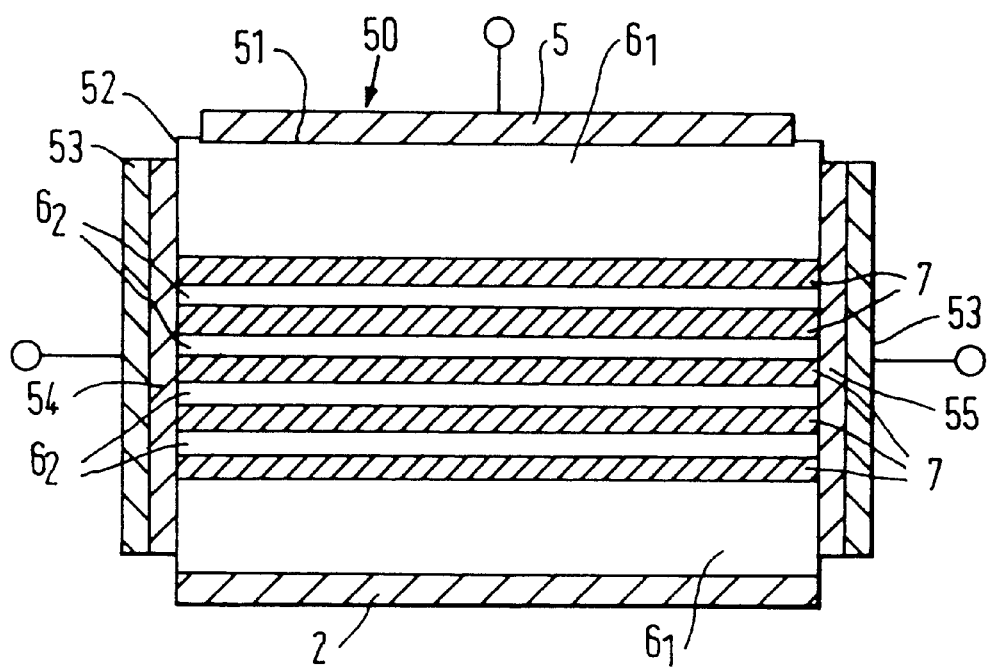
FIG. 16a illustrates a transistor device in accordance with the invention, in schematic cross section.

An improved gate configuration which can be used both for a transistor according to the principles of FIG. 1 or for a memory device according to the principles of FIG. 15, will now be described with reference to FIGS. 16a and 16b. FIG. 16a illustrates the improved gate structure in relation to a transistor operative according to the principles described with reference to FIG. 1, and FIG. 16b illustrates the same gate structure applied to a memory device operative according to the principles of the memory of FIG. 15.

Figure 16B:
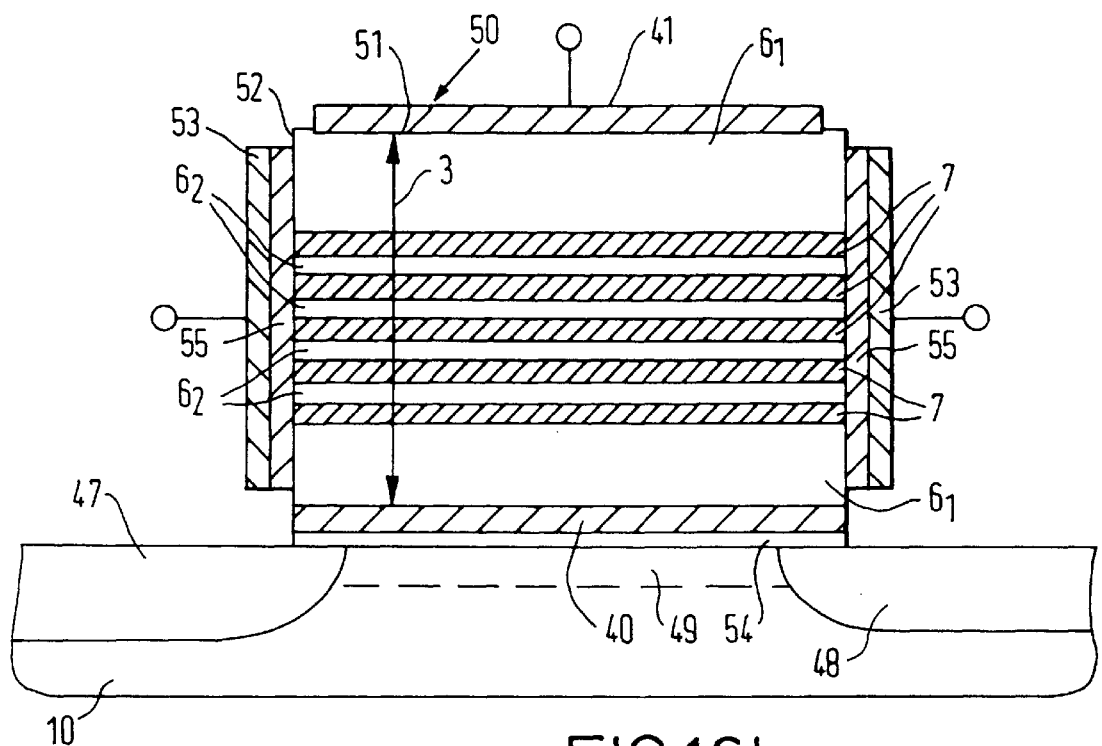
FIG. 16b illustrates a memory device in accordance with the invention, in schematic cross section.

The layer structure 3 shown in FIGS. 16a and 16b is arranged in the form of a pillar 50 upstanding from the substrate 1, with a top surface 51 and a peripheral side wall 52 which extends around the pillar. In accordance with the invention, a side gate 53 is formed along the side wall 52 so as to produce an electrostatic field into the pillar structure through the side wall to control the conductivity therein, by raising and lowering the barrier structure selectively. No significant controlling field is applied through the top surface 51 by the side gate 53.

In use, charge carriers flow vertically through the pillar structure from an electrode formed on the top surface 51. For a transistor in accordance with the invention, shown in FIG. 16a, the top electrode comprises a source 5 operable in the manner previously described with reference to FIG. 1 and the drain 2 is provided on the underside of the pillar. However, when the device is configured as a memory as shown in FIG. 16b, the top electrode operates in the manner of the control electrode 41 described previously with reference to FIG. 3 and the memory node 40 is disposed on the underside of the pillar structure. The charge stored on the memory node 40 controls the conductivity of the path 49 between source and drain regions 47, 48 formed in substrate 1, in the manner described with reference to FIG. 3, and insulated from the node 40 by an insulating $SiO_2$ layer 54.

The side gate 53 is formed e.g. of conductive polysilicon material on an electrically insulating layer 54, which may comprise silicon dioxide. The side gate 53 does not extend into the region occupied by the uppermost electrode 5, 41.

Figure 17:
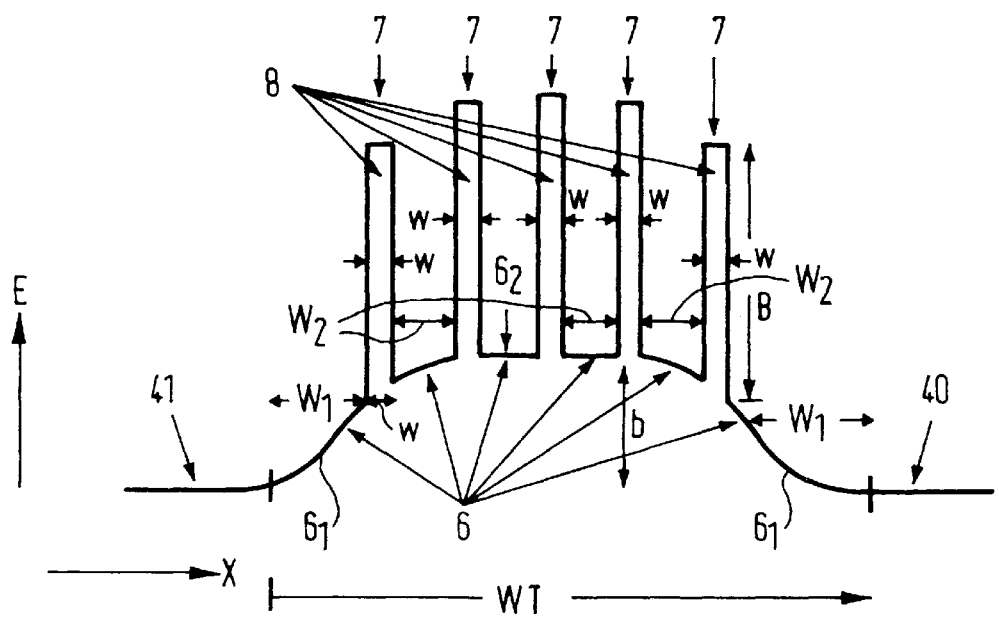
FIG. 17 illustrates an energy band diagram for the devices shown in FIGS. 16a and 16b.

The layers 6, 7 are typically formed with the thicknesses and compositions previously described with reference to FIG. 1, with the result that the energy band structure for the device is as shown in FIG. 17, in the absence of a voltage applied to the top electrode 5, 41 or the side gate 53. The insulating layers 7 give rise to relatively high barriers 8 of height B, of a relatively narrow width dimension ω corresponding to the width of the individual layers 7. In this example, the width dimension ω is of the order of 3 nm or less, typically of the order of 2 nm.

The spacing of the individual barriers 8 is determined by the thicknesses of the layers 6 of the conductive silicon material. Towards the top and bottom of the layer structure 3, the layers 6 have a thickness $W_1$ of the order of 50 nm and in the central region of the stack, the layers 6 have a thickness $W_2$ of 10 nm or less, e.g. the order of 5 nm.

Collectively, the layers of the structure 3 give rise to a barrier height b which is relatively low compared to the barrier height B of the individual layers, but which is relatively wide in terms of its physical dimension, corresponding to a width $W_T$ of the entire multiple layer structure 3.

The effect of a voltage applied to the side gate 53 is to raise or lower the overall energy band diagram shown in FIG. 5. The effect applying a voltage to the top electrode 5, 41 is to distort the band diagram in the manner shown in FIG. 2b, so as to allow charge carriers to pass from the top electrode 5, 41 downwardly through the pillar structure, either to reach the drain 2 or charge the memory node 40 depending on the device concerned. In the absence of a voltage applied to the top electrode 5, 41, the barrier structure prevents charge leakage along the path between the top and the bottom of the pillar structure.

When used as a memory as shown in FIG. 16b, the device operates as a fast static random access memory. The barrier height b typically gives rise to a small built-in potential of approximately 0.2V and the threshold voltage required on the gate electrode 53 under conditions of zero bias the control electrode 41 and the memory node 40, is −1.0V. The height of the overall barrier presented by the pillar structure is controlled by the bias applied to gate 53. A negative gate bias of about 4.0V applied to the gate electrode 53 causes stored charge to be retained on the memory node 40.

The negative gate bias produces a potential barrier of approximately 3 eV, which is high enough to keep stored electrons on the node for a period of approximately 10 years.

To write information, the voltage applied to gate 53 is kept to zero and a bias voltage of 1.0V is applied to the control electrode 41. Then, the overall barrier structure of the pillar forms a downwardly inclined slope in the manner shown in FIG. 2b with the result that electrons can tunnel through the individual barriers 8 to reach the memory node 40. To read information, a voltage of −3.0V is applied to the gate electrode 53 and the source-drain current flowing in channel 49 is monitored in the manner previously described with reference to FIG. 3.

When the device is used as a transistor as shown in FIG. 16a, such that the top electrode 5 comprises a source and the underlying region 2 comprises a drain, the device will operate as a fast, normally-on transistor. A more practical example of such a transistor will now be described with reference to FIG. 18.

Figure 18A:
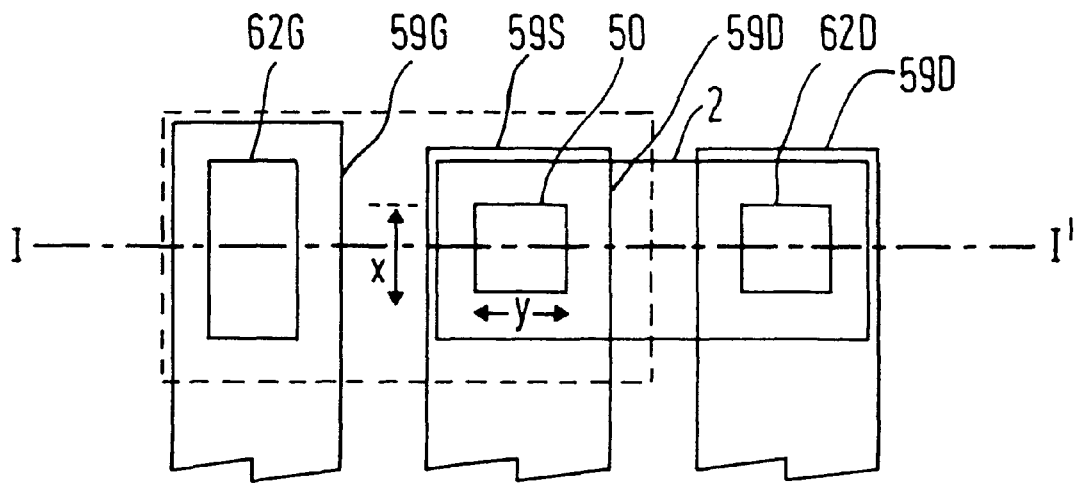
FIG. 18a is a schematic plan view of a transistor device in accordance with the invention.
Figure 18B:
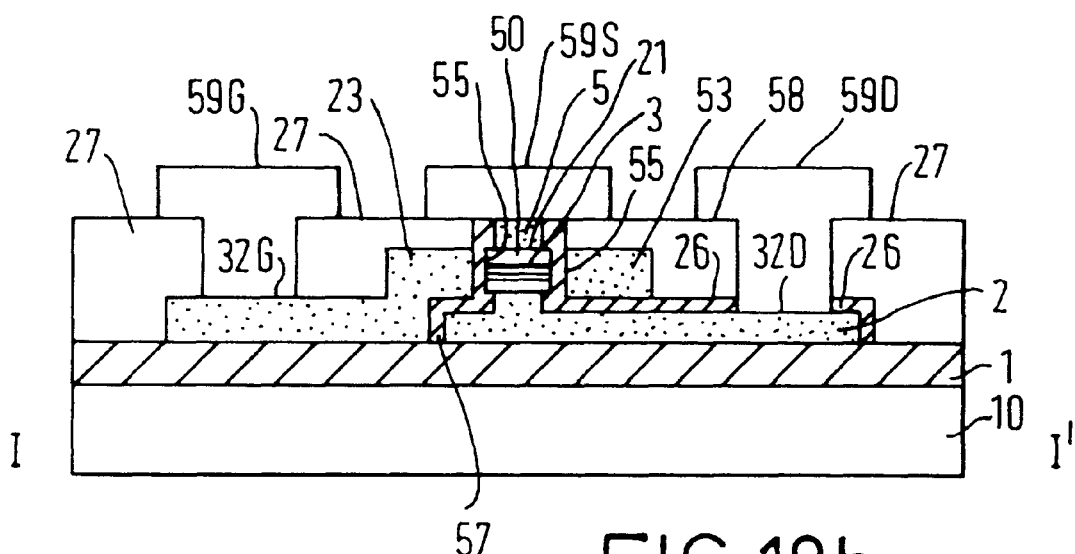
FIG. 18b is a schematic sectional view of the transistor device of FIG. 18a, taken along the line I-I'.

As shown in FIG. 18b, a silicon wafer 56 is provided with a thermally grown silicon dioxide layer 1, which acts as a substrate. The drain 2 comprises a layer of $n^+$ polysilicon formed on the silicon oxide layer 1. The drain is encapsulated by an electrically insulating layer 57 of silicon dioxide.

The layer structure 3, which gives rise to the multiple tunnel junction configuration is formed so as to overlie the drain 2. The layer structure 3 is formed as a pillar 50 so as to be upstanding from the drain region 2 and is surrounded by the insulating silicon dioxide layer 55. The source 5 comprises a layer of $n^+$ polysilicon, which overlies the top surface of the pillar 50.

The gate 53 comprises a layer of polysilicon which bounds the side wall 52 of the pillar 50, abutting the protective insulating layer 55, but does not cover its top surface 51.

The structure is covered by a protective, insulating layer 58 described in more detail hereinafter. As can be seen from FIG. 6a, contact windows are formed in the oxide layer 58 and source, drain and gate electrodes 59S, 59D and 59G provide external connections.

A method of fabricating the device shown in FIG. 18 will now be described in detail with reference to FIG. 19.

Figure 19A:
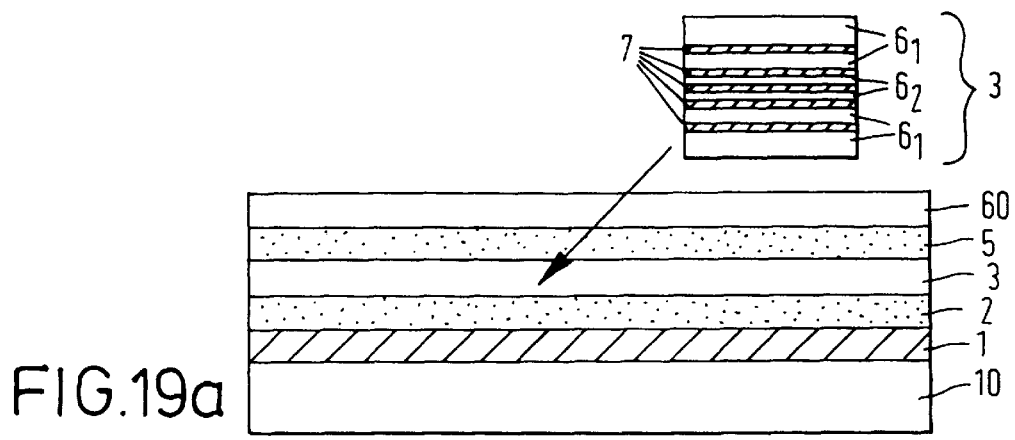
FIGS. 19a–h illustrate the various fabrication steps for manufacturing the transistor device shown in FIG. 18.

Referring to FIG. 19a, the starting material comprises a silicon wafer 56 which is thermally oxidised at 1000° C. to form a 600 nm layer 1 of $SiO_2$, which acts as an insulating substrate. Then, the layer 2, which is used to produce the drain, is formed on the $SiO_2$ layer 1. The layer 2 comprises 100 nm thickness polysilicon deposited in a reactor by low pressure chemical vapour deposition (LPCVD). A silicon dioxide layer of thickness of the order of 10 nm (not shown) is then deposited on the surface of the layer 2. Arsenic ions are then implanted into the layer 2 in order to form a $n^+$-doped conductive layer that can be used as the drain. The arsenic ions are implanted with a dosage of $3 \times 10^{15}$ $cm^{-2}$ at an energy of the order of 25 KeV through the oxide layer. The oxide layer is then removed by wet etching using a 20:1 BHF solution.

Thereafter, the multiple layer structure 3 is formed on the layer 2. The multiple layer structure 3 consists of a stack of intrinsic silicon and silicon nitride layers 6, 7. Initially, the layers $6_1$ of silicon are formed to have a relatively large thickness $W_1$=50 nm and then, for the major part of the stack, the thickness of the layers $6_2$ is of the order of $W_2$=5 nm. At least one further layer $6_1$ of thickness $W_1$ is formed at the top of the stack. In this example, two such layers $6_1$ are formed at the top. This can be seen in detail in the enlarged detail of the section shown in FIG. 19a.

The layers 6, 7 are formed in the LPCVD reactor. The process involves thermal nitridation of silicon, as described in detail by M. Moslehi and K. C. Saraswat, IEEE Trans. Electron Device, ED. 32, p 106 (1985) so as to form thin, tunnel junctions, in which the barrier thickness of the nitride is self-limited to around 2–3 nm depending on the growth temperature, with a tunnel barrier height of the order of 2 eV.

The layer structure 3 is repeatedly built up by firstly depositing a silicon layer in the LPCVD reactor at 770° C. in $SiH_4$ gas to achieve the appropriate thickness of silicon for the relevant layer as shown in FIG. 19a. Thereafter, the surface of the deposited silicon is directly converted to silicon nitride at 930° C. for 20 minutes in 100% $NH_3$ gaseous atmosphere at 1 Torr in the reactor. Then, a further layer of silicon is deposited on the silicon nitride in the same chamber and the process is repeated. Accordingly, pure silicon nitride without any silicon oxide is formed in the successively deposited layers 7.

Then, a layer 5 of polysilicon is deposited with a thickness of 100 nm by LPCVD. A silicon dioxide layer of thickness of the order of 10 nm is then deposited on the surface of the layer 5. Arsenic ions are implanted at an energy of 25 KeV at a dosage of $5\times10^{15}$ cm$^{-2}$ through the oxide layer (not shown) in order to change the silicon layer 5 to an heavily doped, n-typed layer. Thermal annealing at 800° C. for one minute is then carried out in order to activate the arsenic ions and provide heavily n-doped electrical characteristics in the layer 5, which is later used to provide the source of the device. A silicon oxide layer 60 of thickness 100 nm is then deposited on the layer 5.

Figure 19B:
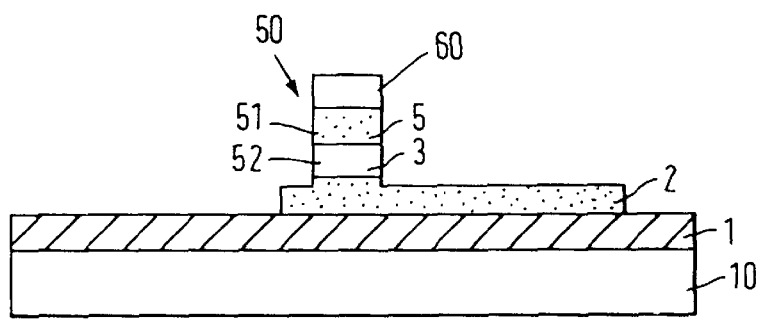

Referring to FIG. 19b, the silicon oxide layer 60 is then patterned using optical lithography and a dry etching method in an atmosphere of $CHT_3$ and argon gas, in a manner well known per se. Then, the layers 5 and 3 are patterned using a conventional dry etched method in $CF_4$ gas, using the photo-resist and the patterned layer 60 as a mask.

Then, in a separate patterning step, using conventional optical lithography and dry etching in an atmosphere of $CF_4$ gas, the layer 2 is etched so as to achieve the pattern shown in FIG. 19b. The layer structure 3 is thus etched into the form of a pillar 50 with a top surface 51 and a side wall 52, upstanding from the drain region 2.

Figure 19C:
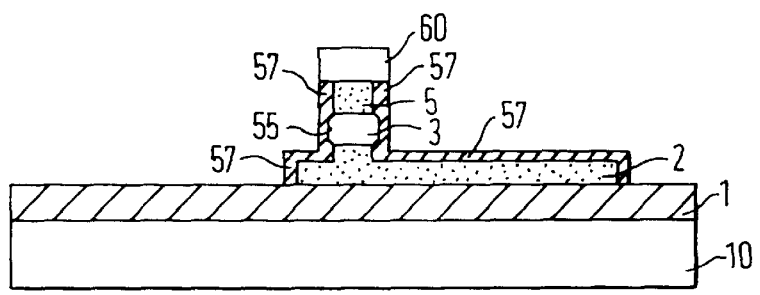

Next, as shown in FIG. 19c, silicon dioxide layers 55, 57 are grown by thermal oxidisation to overlie the etched portions of the n$^+$ polysilicon layers 5, 2 and the pillar structure 3. The thickness of the oxide layer 55 around the pillar structure is of the order of 10 nm whereas the layer 27 that covers the source and drain regions 5, 2 is of the order of 50nm thickness. The thickness of the silicon dioxide on the highly doped regions 5 and 2 is larger than the thickness of the silicon dioxide on the intrinsic silicon of the pillar 3 due to the SELOCS.

Figure 19D:
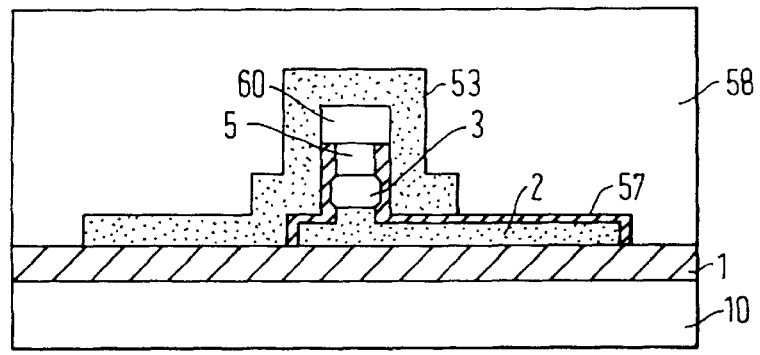

As shown in FIG. 19d, a layer of polysilicon 53 is deposited to a thickness of 100 nm by LPCVD. A thin silicon dioxide layer (not shown) of thickness of the order of 10 nm is then deposited on the surface of the layer 53. Arsenic ions are then implanted at an energy of 25 KeV and a dosage of $5\times10^{15}$ cm$^{-2}$ through the oxide layer in order to change the polysilicon layer 53 to a heavily doped n-type layer.

Thermal annealing at 800° C. for one minute is then carried out in order to activate the arsenic ions and provide heavily n-doped electrical characteristics in the layer 53, which is later used to provide the gate of the device. The layer 53 is then patterned using optical lithography and a dry etching method in an atmosphere of $CF_4$ gas. Then, the protective layer 58 is formed, which comprises BPSG (boron and phosphorous contained silicade glass) to a thickness of 500 nm, and HSG (spin on glass) to a thickness of 250 nm.

Figure 19E:
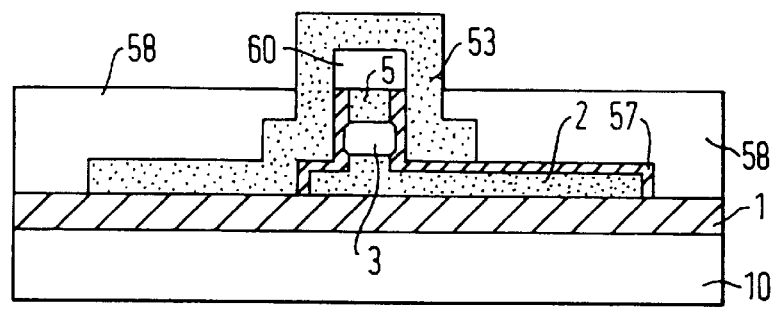

As shown in FIG. 19e, the BPSG and HSG layer 58 is then etched back by a dry etching method in an atmosphere of $CH_2F_2$ and argon gas so as to expose the top of the polysilicon layer 23.

Figure 19F:
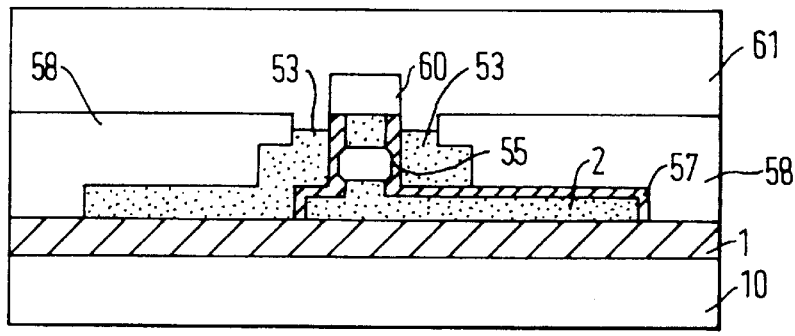

As shown in FIG. 19f, the top of the polysilicon layer 53 is etched to a level between the top and bottom surfaces of the n$^+$ polysilicon layer 5, by a dry etching method in an atmosphere of $WF_6$ gas. Then, a silicon dioxide layer 61 is deposited to a thickness of 1000 nm.

Figure 19G:
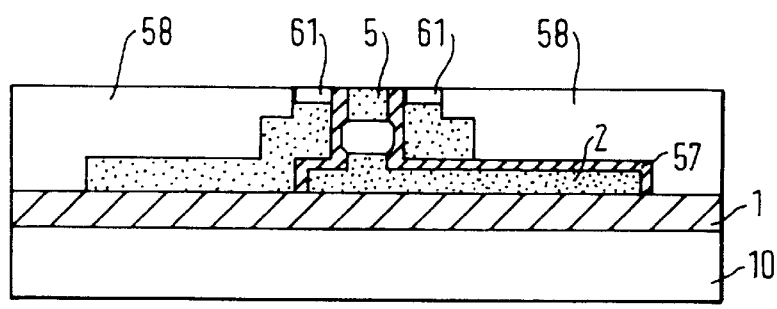

As shown in FIG. 19g, the silicon dioxide layer 61 is polished by a CMP (chemical mechanical polish) method so as to expose the top of the polysilicon layer 5, so as to provide access to the eventual source.

Figure 19H:
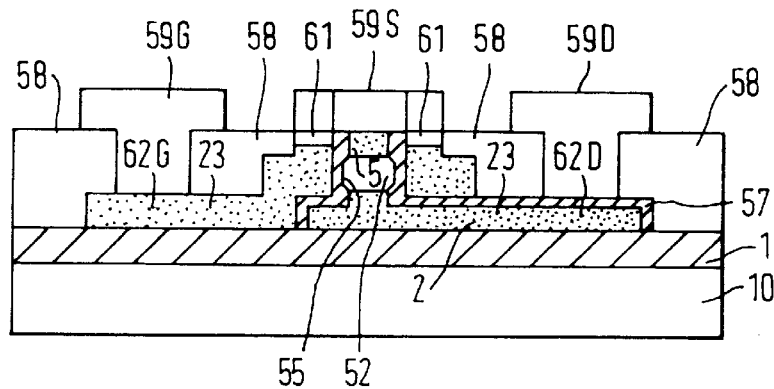

Then, as shown in FIG. 19h, a contact window 62D is etched through the oxide layers 57, 58 in order to allow an external electrical connection to be made to the drain layer 3. At the same time, a contact window 62G is opened to the gate 53. The contact windows can be seen clearly in the plan view of the device shown in FIG. 18a.

Next, a metallisation layer 59 is formed by sputtering in order to provide electrical connection to the source, drain and gate, in regions 59S, 59D and 59G. The layer 59 comprises an initial layer of titanium of 100 nm thickness overlaid by a layer of aluminium/silicon (1%) to a thickness of 1000 nm, produced by conventional sputtering techniques.

As shown in FIG. 19h, electrical insulation spaces are etched into the 37 metallisation layer 59 so as to provide the individual portions 59D, 59S and 59G.

The portion 59S thus provides a connection to the source region 5. The portion 59G provides a connection through window 62G to the layer 53 which surrounds the pillar structure 50 that gives rise to the multiple channel junction device. The layer 53, is insulated from the pillar structure 50 by the thin oxide layer 55 and thus acts as a side gate that extends along the side wall 52 of the pillar structure 50.

During and after the growth of the layers 6, 7 of the multi-layer structure 3, the overall wafer is heated to 900–1000° C. for several hours. However, to ensure that the resulting device operates successfully, the dopants from the heavily doped source and drain regions 5, 2 should not be permitted to migrate into the silicon layers $6_2$ of the layer structure 3. In the described embodiment, the uppermost and lowermost layers 7 of silicon nitride in the layer structure 3 act as barriers to the n$^+$ dopants in the layers 2, 5 and prevent them from diffusing into the central region of the multi-layer structure 3 during the heating process.

FIG. 18a shows the active region of the transistor to be X×Y. Typically X=Y=150 nm. A pillar dimension X=Y<20 nm can be achieved by means of a self-limiting oxidation process described by H. I. Lie, D. K. Biegelsen, F. A. Ponce, N. M. Johnson and R. F. W. Pease, Appl. Phys. Lett. vol. 64, p 1383, 1994 and H. Fukuda, J. L. Hoyt, M. A. McCord and R. F. W. Pease, Appl. Phys. Lett. vol 70, p 333, 1997. In this process, a retardation in the oxidation rate occurs as a result of a large compressive stress in the oxide skin near the silicon core/oxide interface, which can reach 10 Gpa, which is responsible for the self-limiting effect.

It will be understood that the transistor structure takes up a small space on the substrate and the arrangement of the side gate 53 minimises the high electric field region and conflict for space on the substrate that occurs in the embodiment described previously with references to FIG. 1.

It will be understood that the principles of construction described with reference to FIG. 19 can also be used to provide a side gated configuration for a memory cell; thus, the drain region 2 shown in FIG. 18 can be replaced by a polysilicon layer of e.g. 30 nm thickness to provide the aforementioned memory node 40. Conventional source and drain regions can be formed in the wafer 56 in a manner well known per se, thus to provide source and drain regions corresponding to the regions 47 and 48 shown in FIG. 15 and 16b, with a conductive source-drain path between them.

A number of modifications to the pillar structure 50 will now be described, which give rise to different operating characteristics for the transistor or memory fabricated in accordance with the invention.

Figure 20:
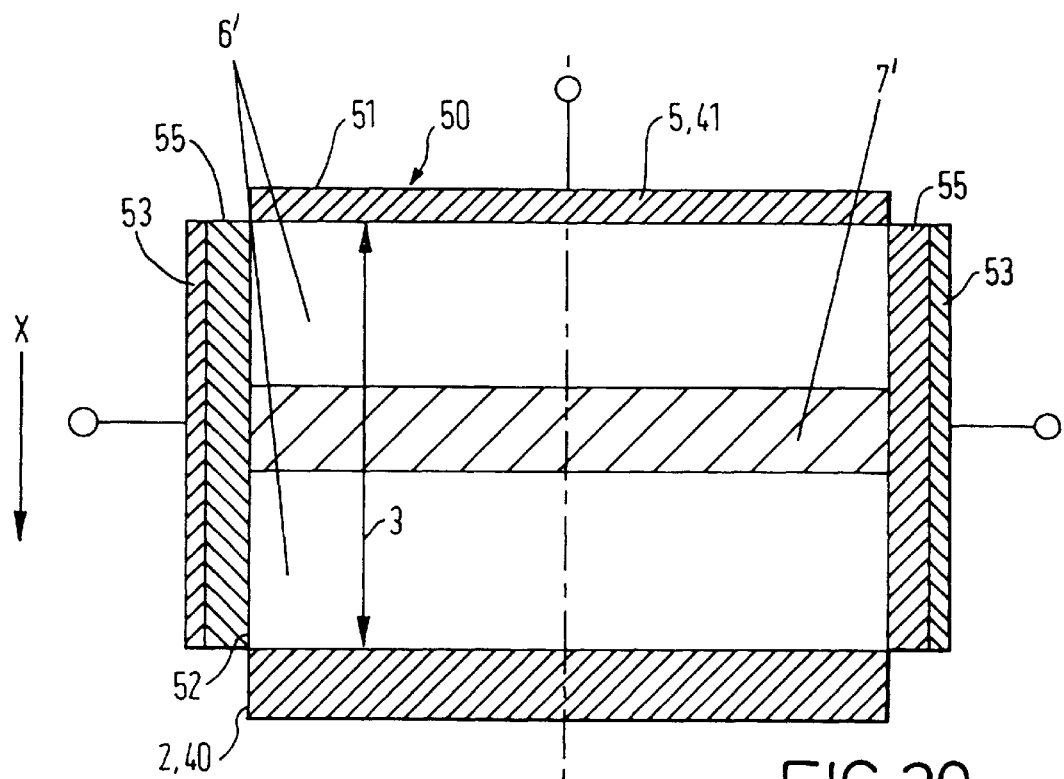
FIG. 20 illustrates a modified pillar structure for use in a device in accordance with the invention.

Referring now to FIG. 20, this illustrates an example of a pillar structure which can be used to provide a normally off transistor and a non-volatile memory. The configuration can be considered as a modification of the arrangement shown in FIG. 16a or 16b and the same reference nomenclature has been used in FIG. 20. The pillar structure is thus provided with the side gate 53 and insulating region 55.

Figure 21:
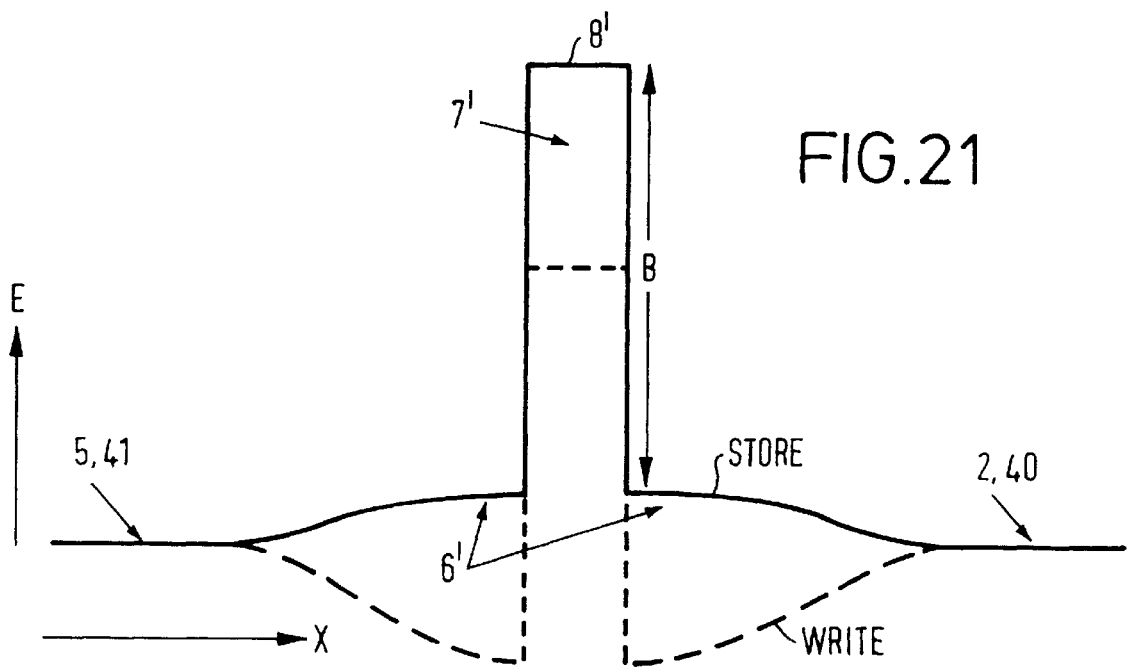
FIG. 21 is an energy band diagram for the device shown in FIG. 20.

The pillar structure 50 consists of a relatively thick insulating layer 7' typically of silicon dioxide or silicon nitride. The insulating layer is of a thickness of the order of 3–30 nm for silicon dioxide and from 4–30 nm for silicon nitride formed by plasma nitridation at 550° C. in $NH_3$ atmosphere with RF power of 300–500 W. The insulating layer is sandwiched between intrinsic silicon layers 6' of a thickness of 50 nm. The energy band profile associated with the pillar structure is shown in FIG. 21. The energy band profile includes a relatively wide barrier 8' of height B' with a width dimension corresponding to the thickness of the layer 7'.

In use, the device when configured as a memory, operates as a fast non-volatile random access memory (RAM) because the energy barrier 8' created by the insulating layer 7' keeps electrons stored in the memory node 10 without the need to apply an external gate voltage to the gate 53. The height B' of the energy barrier is of the order of 2.0 eV for silicon nitride and 3.0 eV for silicon dioxide.

When a bias voltage is applied to the gate 53, the energy barrier B' is lowered as shown in dotted outline in FIG. 21. This effect is used to lower the barrier to permit charge to be written onto the memory node 40. Additionally, a voltage is applied to the control electrode 41 to produce a potential gradient in the manner of FIG. 2b (not shown in FIG. 21), so that charge carriers move towards the node 40. In the case of a silicon nitride barrier 7', the voltage applied to the side gate 53 is of the order of 3V and the voltage applied to the control electrode is of the order of 1V. In this configuration, charge carriers pass the insulating layer 7' to reach the memory node 40, along a path from the control electrode 41. Thereafter, when the voltages are removed from the electrodes 41, 53, charge retained on the gate voltage by the barrier B' and the retention time can be of the order of 10 years. Accordingly, the device operates as a fast non-volatile RAM.

When the pillar structure of FIG. 20 is used in a transistor configuration, with the source 5 and drain 2, it will operate as a normally-off transistor.

Figure 22:
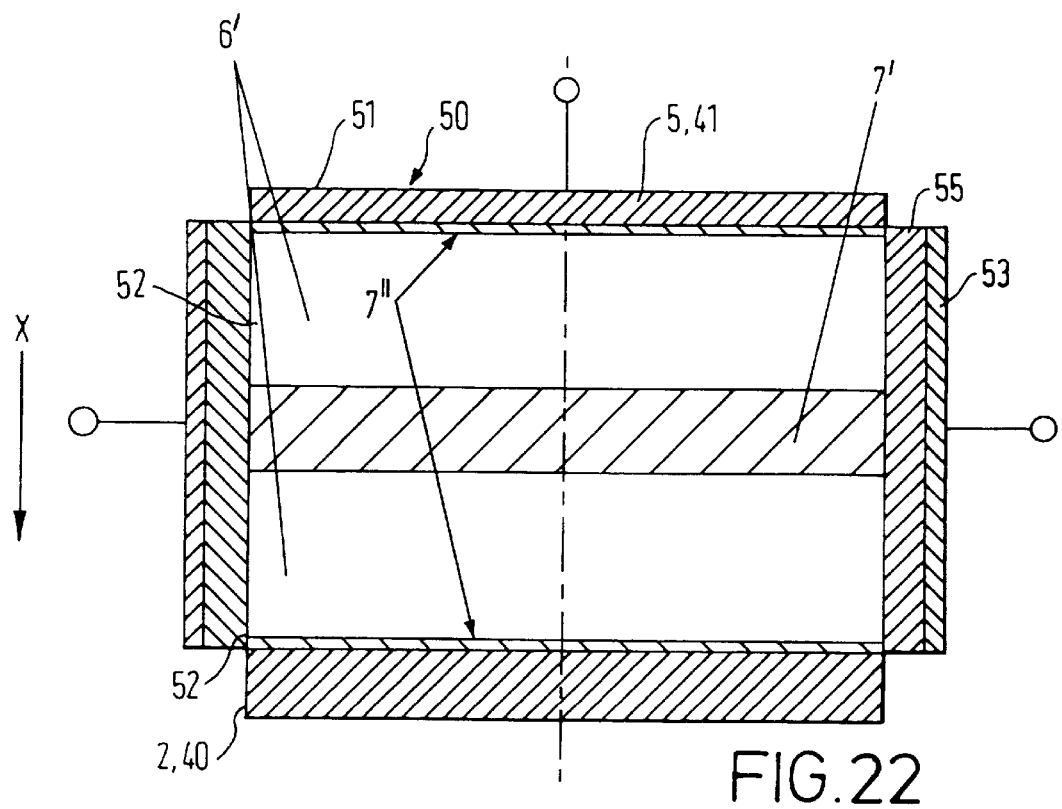
FIG. 22 illustrates a further pillar structure for use in a device according to the invention.
Figure 23:
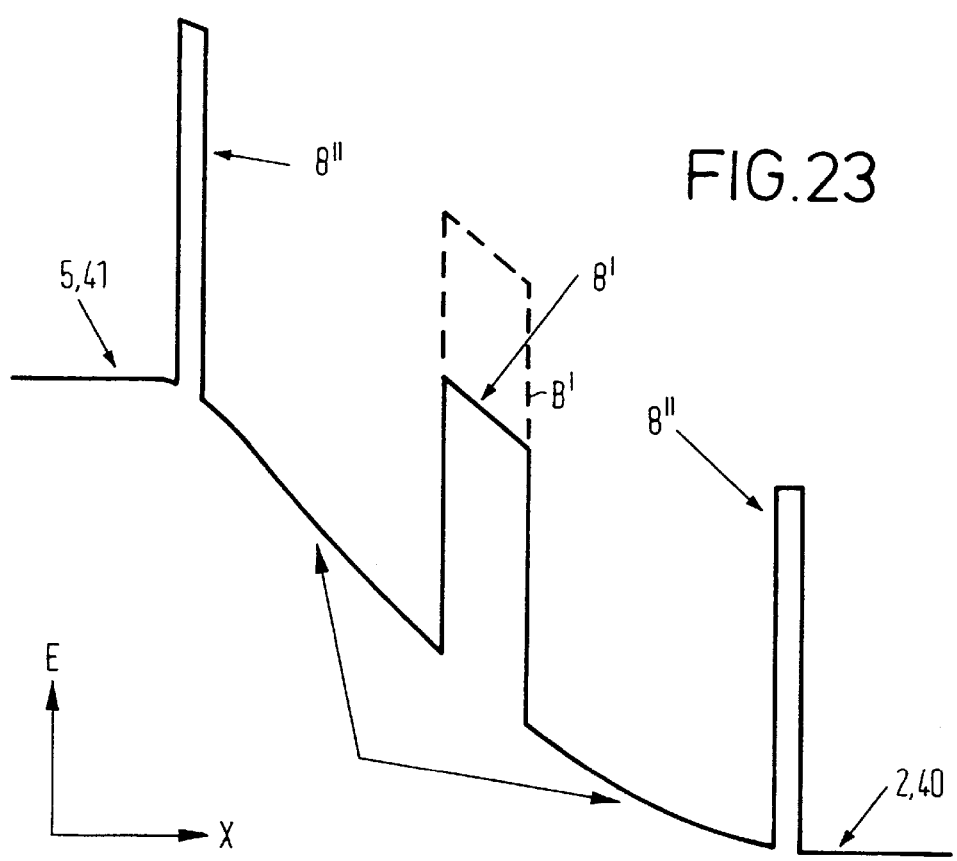
FIG. 23 illustrates an energy band diagram for the device shown in FIG. 22.

A modification is shown in FIG. 22, which includes additional, relatively thin insulating layers 7" adjacent the uppermost electrode 5, 41 and the lowermost region 2, 40, which give rise to additional barriers 8" in the corresponding energy band diagram shown in FIG. 23. When used as a memory, the layers 7" avoid massive electron re-distribution around the insulating layer 7, the control electrode 41 and the memory node 40 and so achieve an improved downward potential slope when the voltages are applied to the gate 53 and the control electrode 41 so as to write or erase charge from the node 40. The energy band diagram of FIG. 23 illustrates the situation in which a write voltage is applied to the control electrode 41 and also to the gate 53, with the values previously described in relation to FIG. 20. The effect of the voltage applied to the control electrode 41 is to configure the band diagram into a downward slope from the control electrode 41 to the memory node 40 so as to allow electrons to move down the slope onto the memory node, with the electrons tunnelling through the barriers B. The effect of the gate voltage 53 is to lower the height of the barriers B. The effect on the barrier B' is shown in FIG. 23. The barrier is reduced from the level shown in dotted outline as a result of the voltage applied to gate 53. When the pillar structure 50 is formed of silicon nitride and polysilicon layers 6, 7 as previously described, the additional thin layers 7" are typically of a thickness of 1–2 nm with the polysilicon layers 6' being of a thickness of the order of 5–30 nm.

Figure 24:
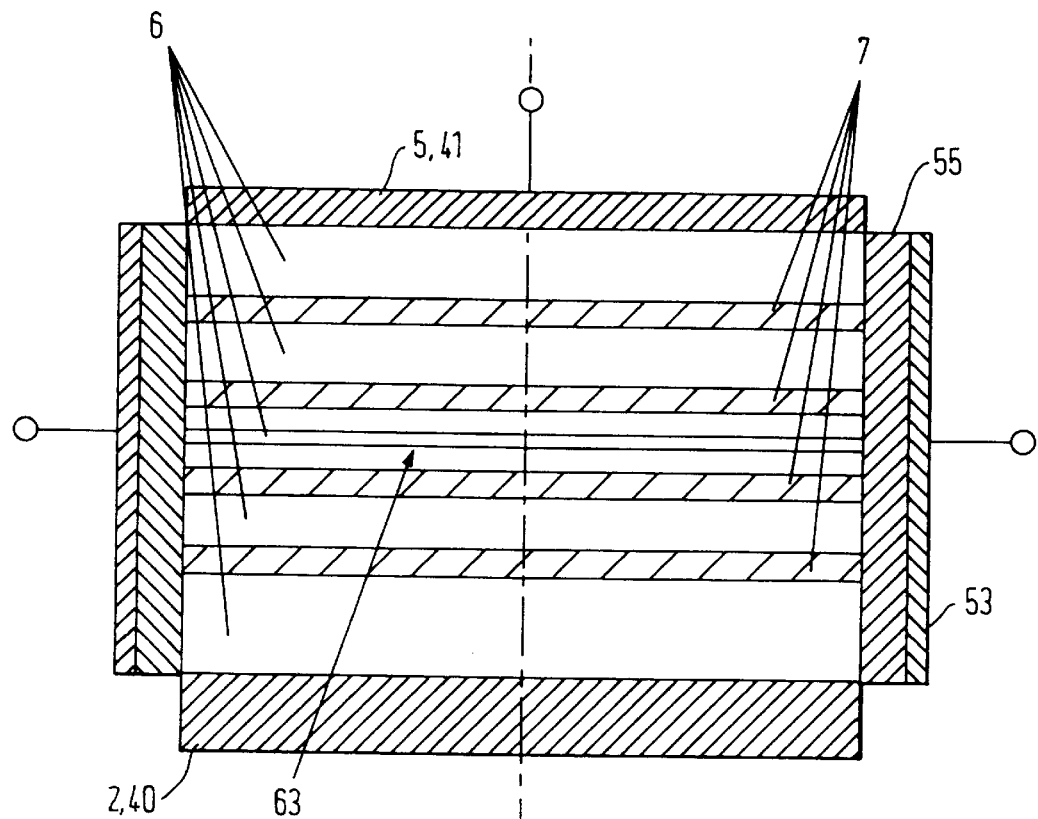
FIG. 24 illustrates a further pillar structure for use in a device according to the invention.
Figure 25:
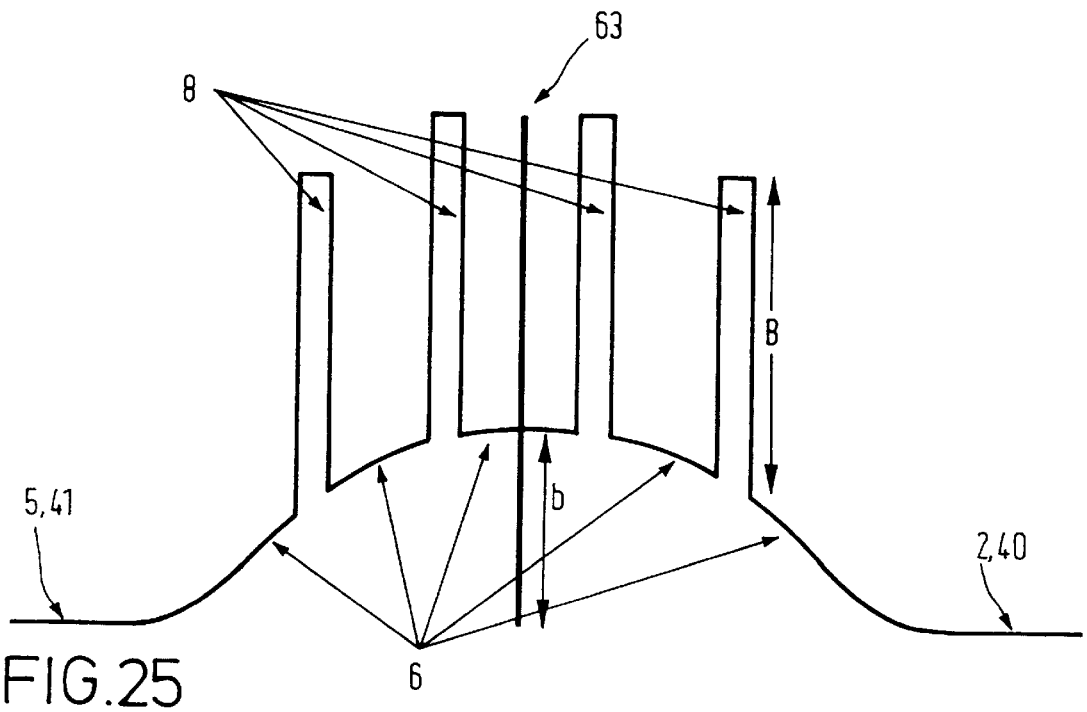
FIG. 25 illustrates the energy band diagram for the device of FIG. 24.

Another modification is shown in FIG. 24 to provide a static random access memory (SRAM) or a dynamic random access memory (DRAM) which obviates the need for conventional refresh circuits. The general side gated pillar structure is the same as that shown in FIG. 16 but with the addition of a thin p-type silicon layer 63. It will be appreciated that this layer which is typically of the a thickness of 1–2 nm, can be formed in the LPCVD reactor in a conventional manner, during the build up of the layers 6, 7. The dopant used for the layer 63 is typically boron with a dopant concentration of the order of $10^{18}$ cm$^{-3}$. This creates a built-in potential barrier of the order of 1.2V with a result that charge can be stored at the memory node 40 for a time of the order of a few minutes without an applied bias to the gate electrode 53. Therefore, the memory device does not require conventional heavy duty refresh circuits usually needed in a fast DRAM. If it is required to retain information for longer periods of time, a negative bias voltage is applied to the gate electrode 53. A bias voltage of –1.0V or –0.5V give rise to retention times of 10 years and 1 hour respectively. To read and write information, gate bias voltages of 0.0V and 1.0V are applied respectively to the gate electrode 53. It will be understood from the foregoing that in order to read information from the node, a source-drain voltage is applied to the source and drain 47, 49 (not shown in Figure) and the resulting source-drain current is detected. The level of current will depend on the level of charge stored on the memory node 40.

Figure 26:
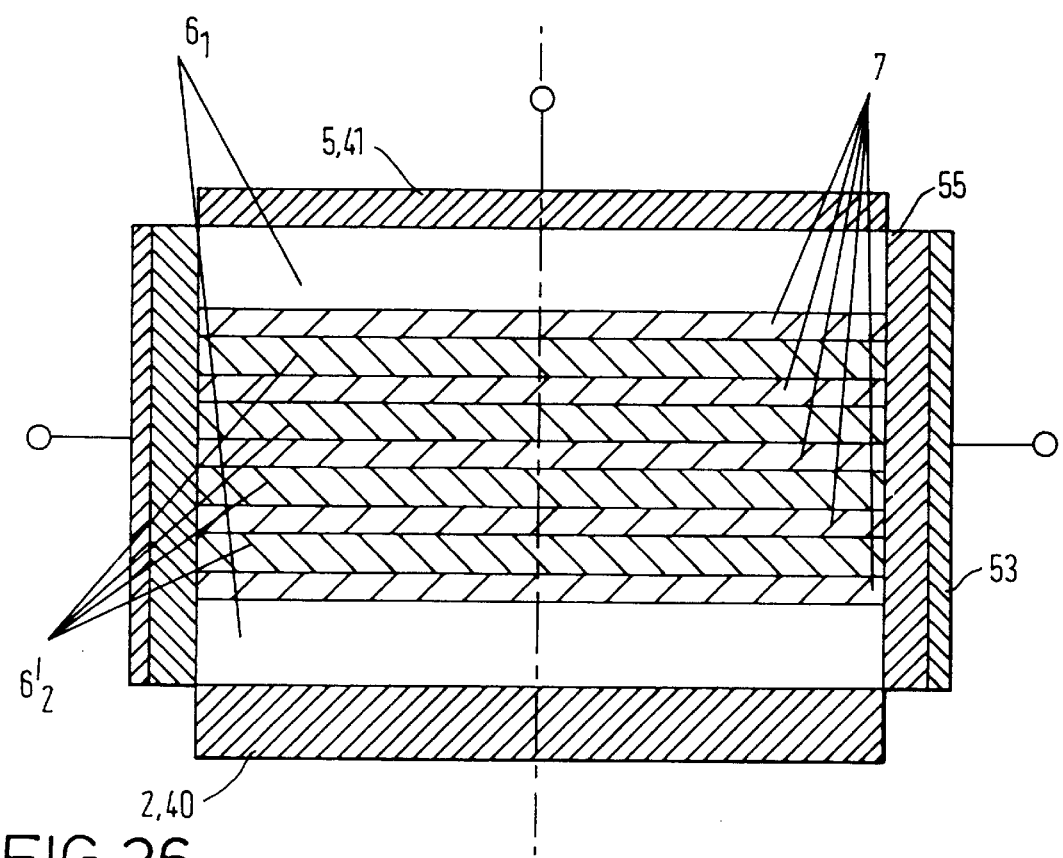
FIG. 26 illustrates a further embodiment of a pillar for use in a device according to the invention.
Figure 27:
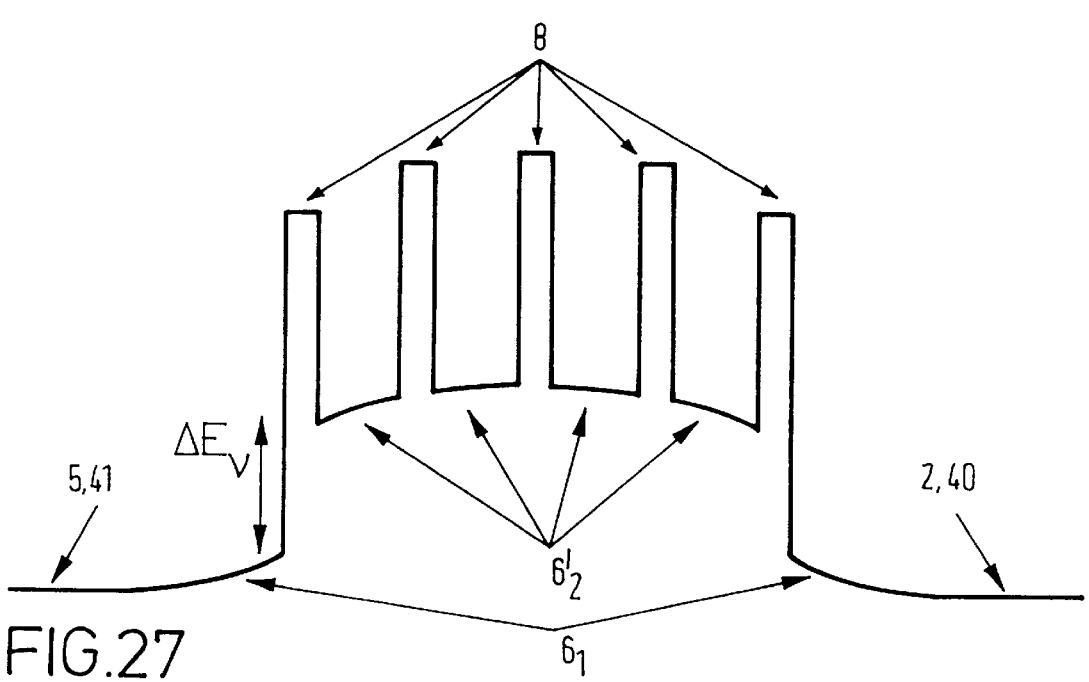
FIG. 27 illustrates the energy band diagram for the device of FIG. 26.

Another configuration is shown in FIG. 26 in which some of the regions 6 are formed of a material with a larger energy band gap in order to introduce a band gap discontinuity. In the embodiment shown in FIG. 26, the thinner layers $6_2$' are formed of a wide gap material such as a metal-semiconductor compound e.g. SiC, whereas the regions $6_1$ are formed of polysilicon in the manner previously described. It will be understood that the appropriate dopant can be introduced during the LPCVD process used to manufacture the pillar, when the layers $6_2$' are formed. The resulting band energy profile is shown in FIG. 27 and it will be seen that the band edge is lifted in the regions of the layers $6_2$', giving rise to a band edge discontinuity $\Delta E_v$. In this example, the band edge discontinuity is formed in the valence band but it will be understood that the discontinuity could be formed in the conduction band if appropriate materials are used and electrons are used as the carriers. In this example, the valence band discontinuity is of the order of 0.5 eV. This is effective for retaining information for a time of the order of 1 hour without the application of a bias to the gate electrode 53. Therefore, the memory device does not require fast refresh circuits in the manner of a conventional DRAM. In order to retain information for longer periods of time, a positive bias of 0.5V can be applied to the gate electrode 53, which achieves a retention time of the order of 10 years. To read and write information, gate bias voltages of −0.5V and −1.5V are applied to the gate electrode 53. The reading and writing is then carried out in the manner previously described.

When used as a transistor, the pillar structure of FIG. 14 gives rise to a normally-off transistor.

Figure 28A:
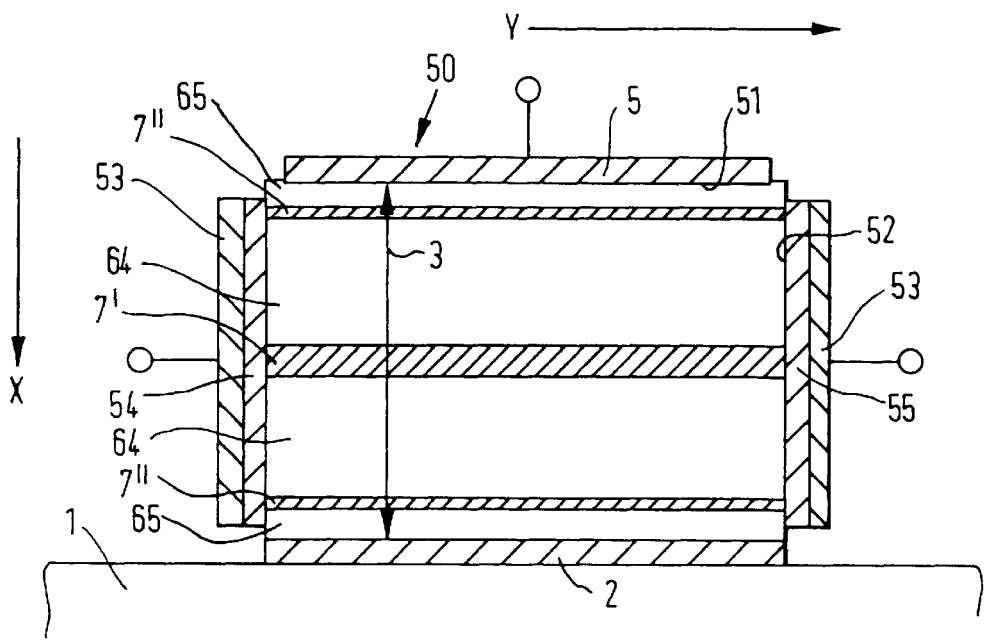
FIG. 28a is a schematic cross section of a transistor in accordance with the invention.
Figure 28B:
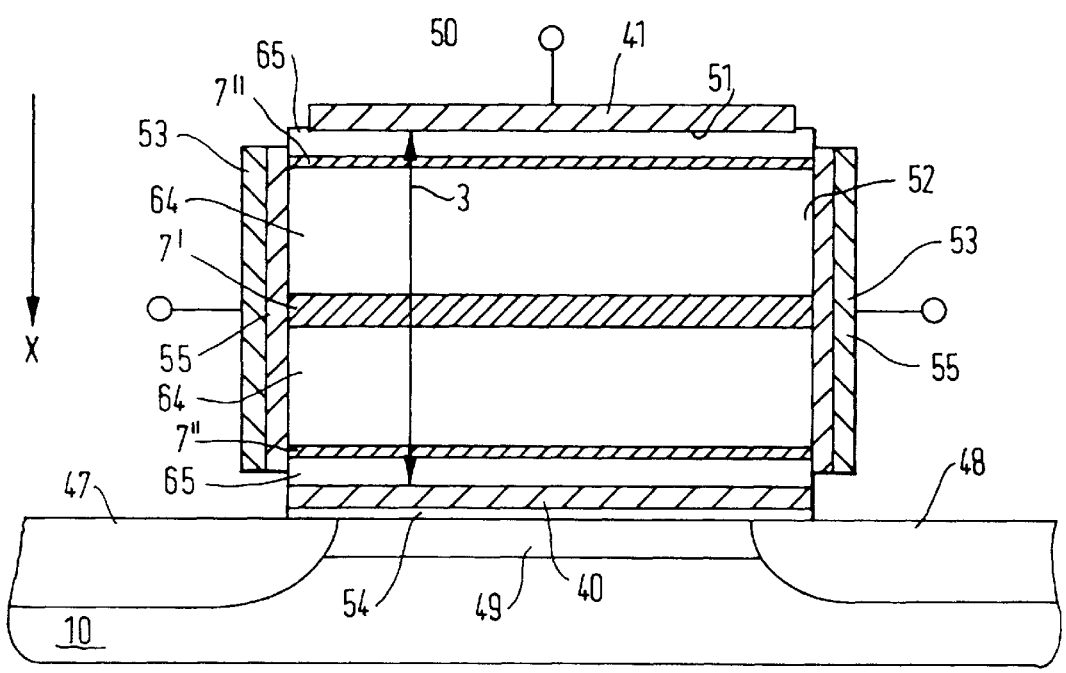
FIG. 28b is a schematic cross section of a memory device in accordance with the invention.

Another embodiment will now be described with reference to FIGS. 28a and 28b, which can be considered as a modification and improvement of the devices according to FIG. 22 and the same reference number scheme is used. FIG. 28a shows a transistor embodiment and FIG. 28b shows a memory device. The multiple layer structure 3 has an optimised configuration of barrier layers 7 as will now be explained.

In this example, non-conducting silicon nitride and conducting intrinsic silicon are used for the layers 6, 7. The configuration consists of a main barrier layer 7' of silicon nitride, sandwiched between spacer layers $6_4$ of intrinsic silicon, and guard barriers 7" of silicon nitride, are disposed between layers $6_5$ of intrinsic silicon and the layers $6_4$ respectively.

Figure 29A:
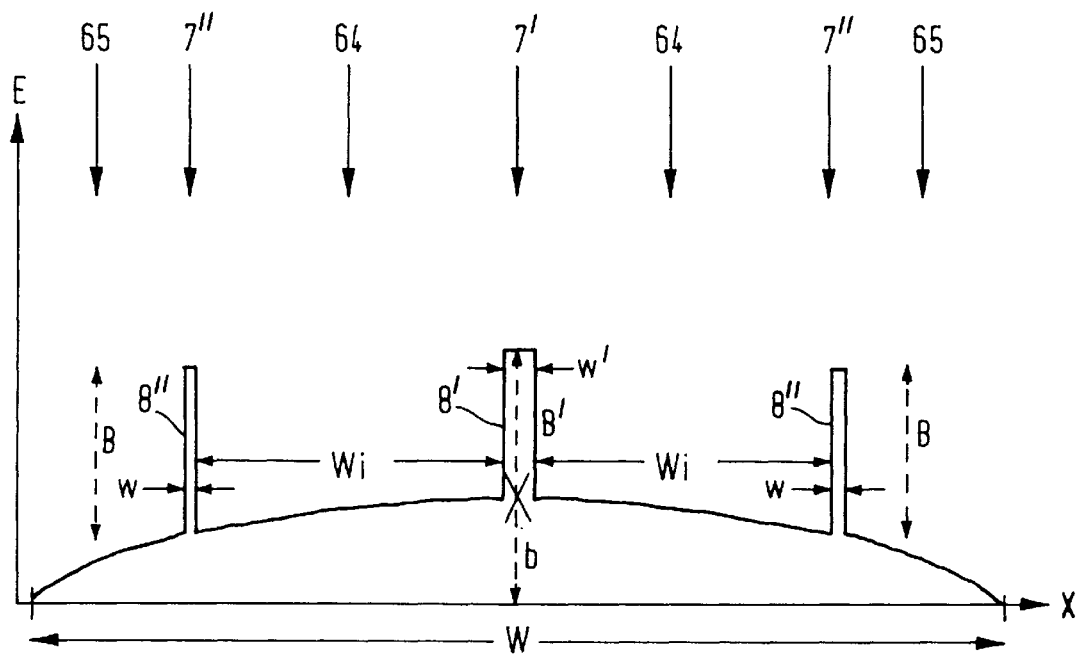
FIG. 29a is a schematic energy diagram of the barrier structure in the device of FIGS. 28a, b under conditions of zero bias.

The energy band diagram of the multiple layer structure 3 is shown in FIG. 29. Referring to FIG. 29a, under conditions of zero bias, the multiple layer structure gives rise to a relatively wide barrier of width W extending across substantially the entire width of the layer structure, with a relatively low barrier height b. Additionally, the main and guard barrier layers 7', 7" give rise to relatively narrow but high barrier components 8' and 8". The width of the barrier components 8' and 8" is a function of the thickness of the layers. In this example, it is assumed that the guard barrier layers 7" are of substantially the same thickness, giving rise to barriers of width ω, and height B. The main barrier 8' has a height B'. The thickness of the main barrier 8' is be different from the thickness of the guard barriers 8" and is referenced ω'. The main and guard barriers are spaced apart by a distance Wi, corresponding to the thickness of layers $6_4$.

Figure 29B:
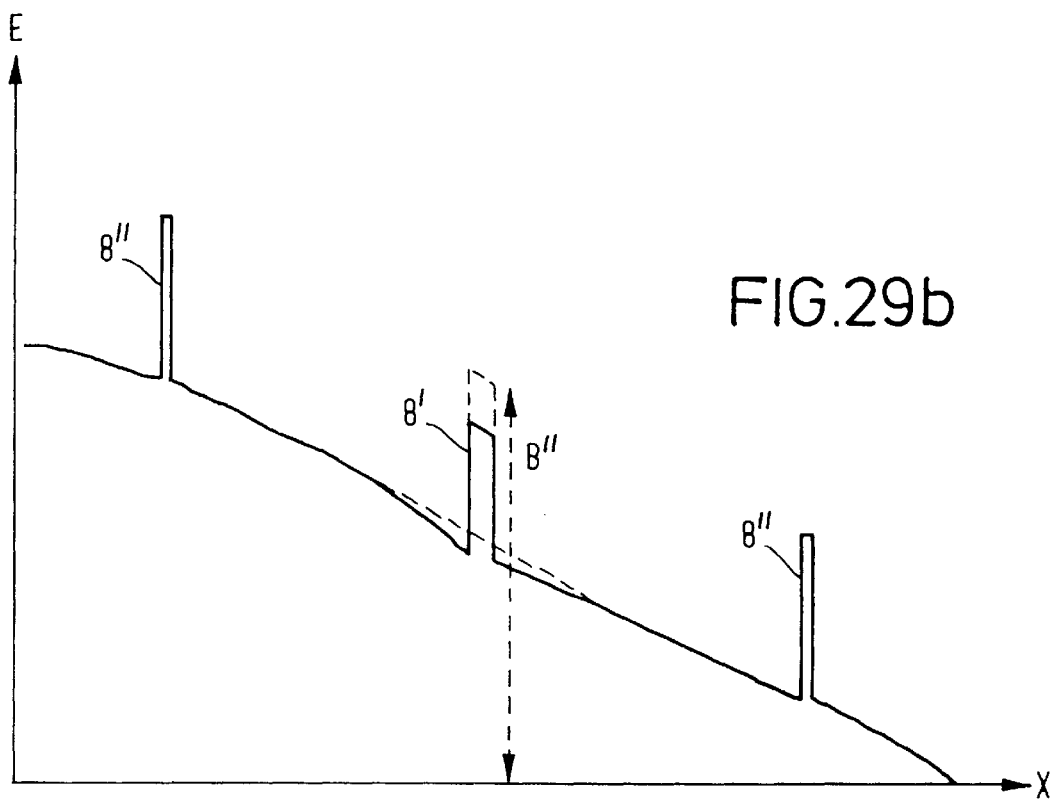
FIG. 29b corresponds to FIG. 29a under a condition of forward bias.

It has been found that under conditions of zero bias, the barrier structure shown in FIG. 29a provides an effective barrier against charge carrier flow between the input and output regions 5, 41 and 2, 40 as will be explained in more detail hereinafter. Referring to FIG. 29b, this shows the situation in which a bias voltage is applied to the input region 5,41. As a result, a potential gradient is produced between the input and output regions 5, 41 and 2, 40 which overcomes the effect of the relatively wide barrier W. Electrons can then tunnel through the narrow but high barriers 8' and 8" so as to pass down the potential gradient between the input and output regions 5, 41 and 2, 40.

Furthermore, the total height of the barrier B' can be altered by the application of voltage to the side gate 53. The effect of increased voltage on the side gate is shown for the barrier 8'. The total height of barrier B" is reduced from the height shown in dotted outline to the configuration shown in solid outline in FIG. 29b.

When the device is used as a memory as shown in FIG. 28b, after charge has tunnelled onto the memory node 40 and the bias voltages are removed, the charge is retained on the node 2' and, as will be explained hereinafter, the retention time can be of the order of 10 years. Accordingly, the device can be operated as a fast non-volatile RAM. For the configuration of FIG. 28a, the device operates as a normally-off transistor, with an extremely low leakage between the source and drain in the off state.

The effect of the guard barriers 8" is to avoid massive electron re-distribution around the layer 7' that gives rise to the main barrier 8', so as to achieve improved downward potential slope when voltages are applied to the gate 53 and the input electrode 5, 41 for the transistor and memory respectively. An example of a method of fabricating a memory device according to FIG. 28b will now be described in more detail with reference to FIG. 30. The resulting device is shown in plan view in FIG. 31.

Figure 30A:
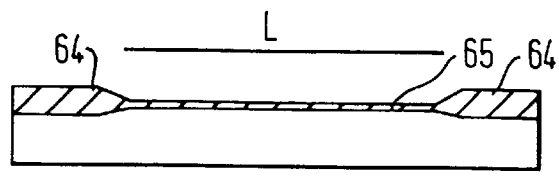
FIG. 30a–f are schematic cross sectional views of a sequence of process steps for fabricating a memory device in accordance with the invention.

Referring to FIG. 30a, the starting material is a p-type silicon wafer 1. A 400 nm thickness layer 64 of $SiO_2$ is formed on the substrate 1 and then, using a conventional LOCOS process with an optical photomask (L), a region 65 of $SiO_2$, of thickness 5 nm is formed in the region under the photomask.

Ion implantation is then carried out in order to form heavily doped p-type channel stopper regions (not shown) under the layer 18 in order to inhibit conduction between adjacent memory devices (not shown) formed on the same substrate.

Additionally, ion implantation is carried out to adjust the threshold voltage of the eventual channel 49 formed in the substrate, so as to adjust the threshold of the eventual MOS transistor 47, 48, 49 formed in the substrate 1 (see FIG. 28b).

Figure 30B:
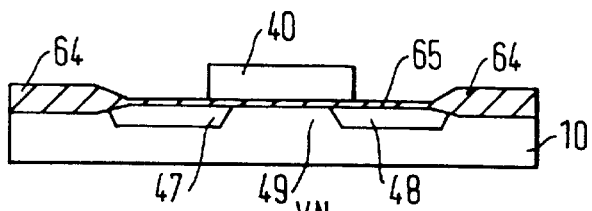

Referring to FIG. 30b, a layer 2 which is used to produce the memory storage node 40, is formed on the $SiO_2$ layers 64, 65 and patterned by a conventional optical lithographic technique, using a photomask (FG) and dry etching. The layer 40 comprises 100 nm thickness of polysilicon deposited by low pressure technical vapour deposition (LPCVD). Arsenic ions are then implanted into the layer 40 and the substrate 1 in order to form an $n^+$-doped conductive layer 40 that can be used as the memory storage node, and so as to provide the source and drain regions 47, 48 of the MOS transistor formed in the substrate 1. The arsenic ions are implanted with a dosage of $5 \times 10^{-15}$ $cm^{-2}$ at an energy of the order of 25 keV.

Figure 30C:
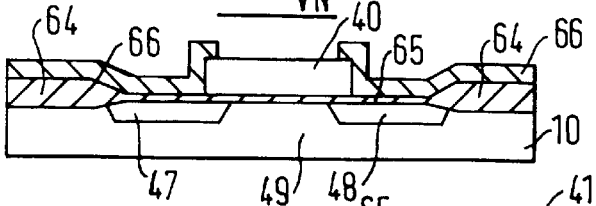

Referring to FIG. 30c, the silicon oxide layer 66 is deposited on the structure, and a contact window is etched through the layer 66 by means of an optical lithographic technique, using a photomask (VN) and dry etching, in a manner known per se.

Figure 30D:
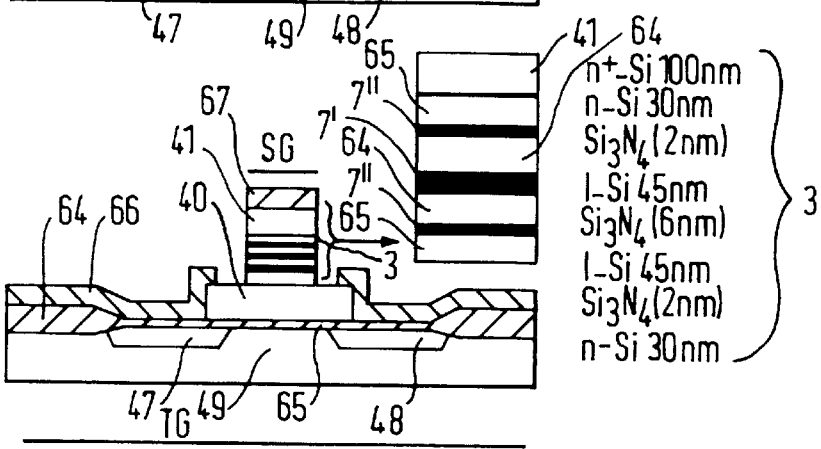

Then, as shown in FIG. 30d, a stack of silicon and silicon nitride layers is formed so as to form the multiple layer structure 3. In this example, the multiple layer structure 3 comprises in ascending order: a 30 nm lightly n-doped silicon layer $6_5$, a 2 nm thickness silicon nitride layer 7", which gives rise to a first guard barrier, a 45 nm thickness intrinsic silicon space layer $6_4$, a 6 nm thickness silicon nitride layer 7', which gives rise to the main barrier, together with further layers $6_4$, 7" and $6_5$, provide a second guard barrier 7", of 2 nm thickness, spaced from the main barrier 7' by 45 nm. The structure is covered by a 100 nm thickness layer of n-doped silicon which forms the electrode 41.

The thin silicon nitride layers 7" which give rise to the guard barriers, are grown by thermal nitridation of silicon in an atmosphere of $NH_3$ at a temperature of 900° C. The silicon nitride layer 7' which gives rise to the main barrier is formed by chemical vapour deposition (CVD).

Thereafter, a 50 nm thickness $SiO_2$ layer 67 is deposited on the multiple layer structure 3. The resulting arrangement of layers 3 and 67 are then patterned by conventional optical lithographic techniques using a photomask (SG) and dry etching, so as to form an upstanding pillar structure on the memory node region 40.

Figure 30E:
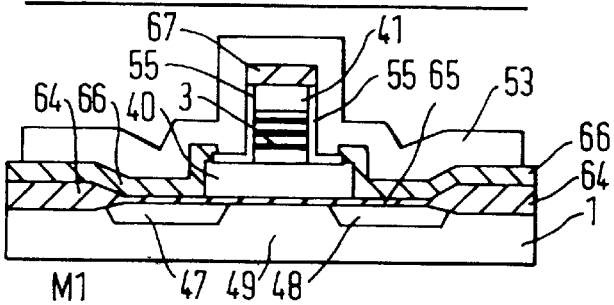

Referring to FIG. 30e, a 10 nm thickness layer 55 of insulating $SiO_2$ is formed by thermal oxidation or deposition around the side walls of the pillar structure to provide an electrically insulating layer. Then, a layer 3 of boron doped silicon is deposited to a thickness of 100 nm and patterned by optical lithography using a photomask (TG) and dry etching. As will be evident hereinafter, the conductive boron doped layer 53 is used as the side gate for the multiple layer structure 3, in the manner shown in FIG. 29b.

Figure 30F:
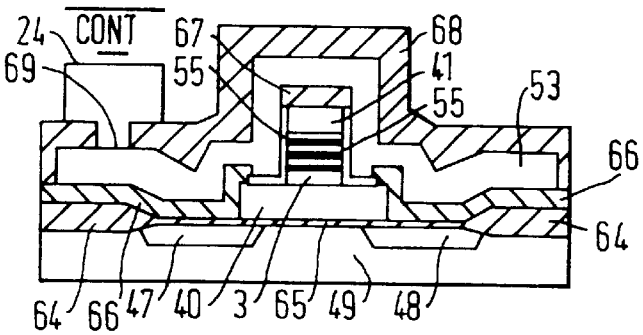
Figure 31:
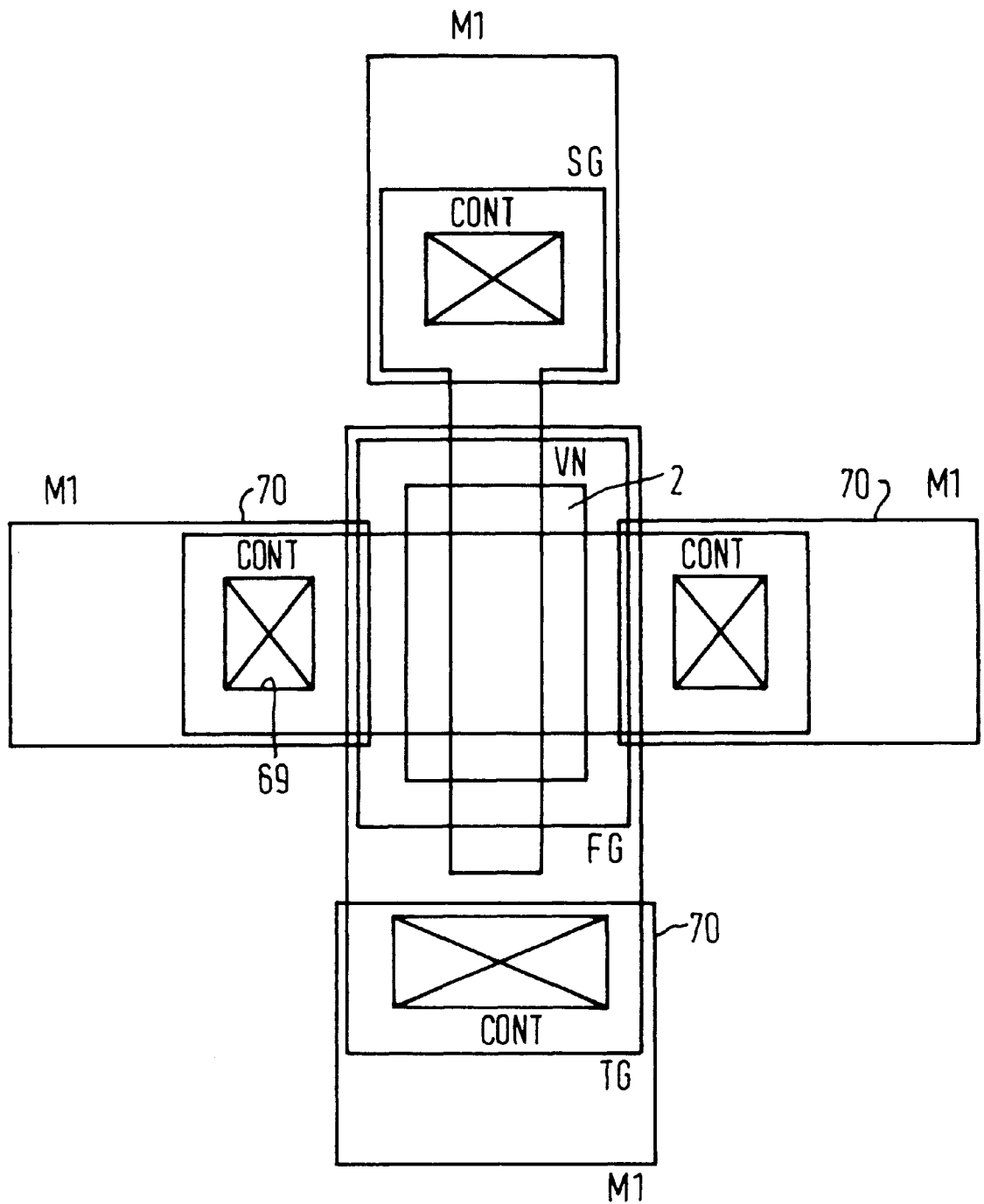
FIG. 31 is a plan view of the memory device made by the process shown in FIG. 30.

Thereafter, as shown in FIG. 30f, a silicon oxide layer 68 of 100 nm thickness is deposited over the structure, and contact windows are etched through the oxide layer 68 by optical lithography using a photomask (CONT) and dry etching, in order to provide contact windows 69 to permit electrical connection to be made to the side gate layer 53. As shown in FIG. 31, contact windows 70 to the input electrode layer 41 and the side gate layer 53 are simultaneously formed by means of this processing step.

It will be understood that in practice, many of the memory devices will be simultaneously formed in an array on the substrate 1. The source and drain regions 47, 48 thus may run from cell to cell and external connections (not shown) are provided for them elsewhere on the substrate.

Figure 32A:
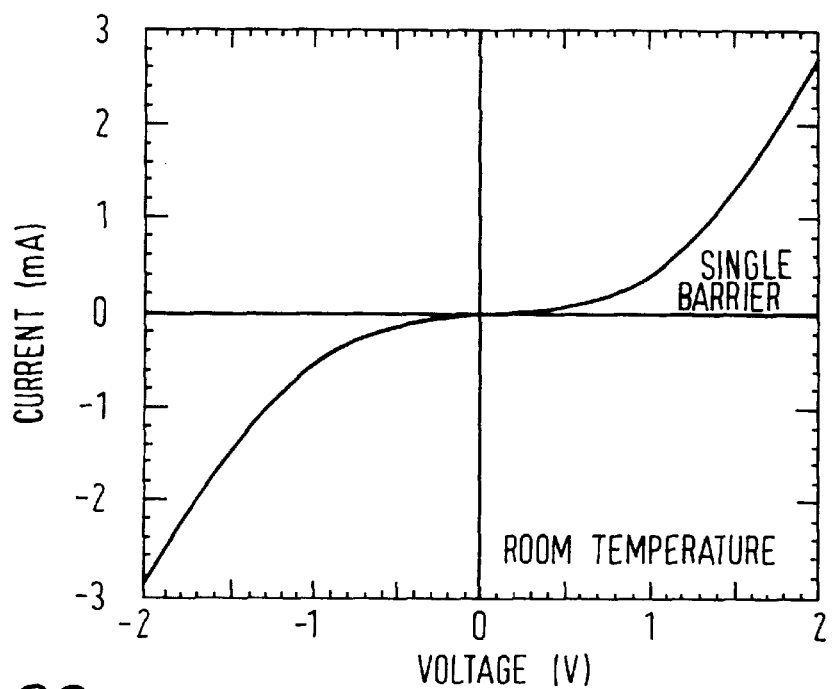
FIG. 32 illustrates the voltage-current characteristics of one of the guard barriers shown in FIGS. 28a and 28b.
Figure 32B:
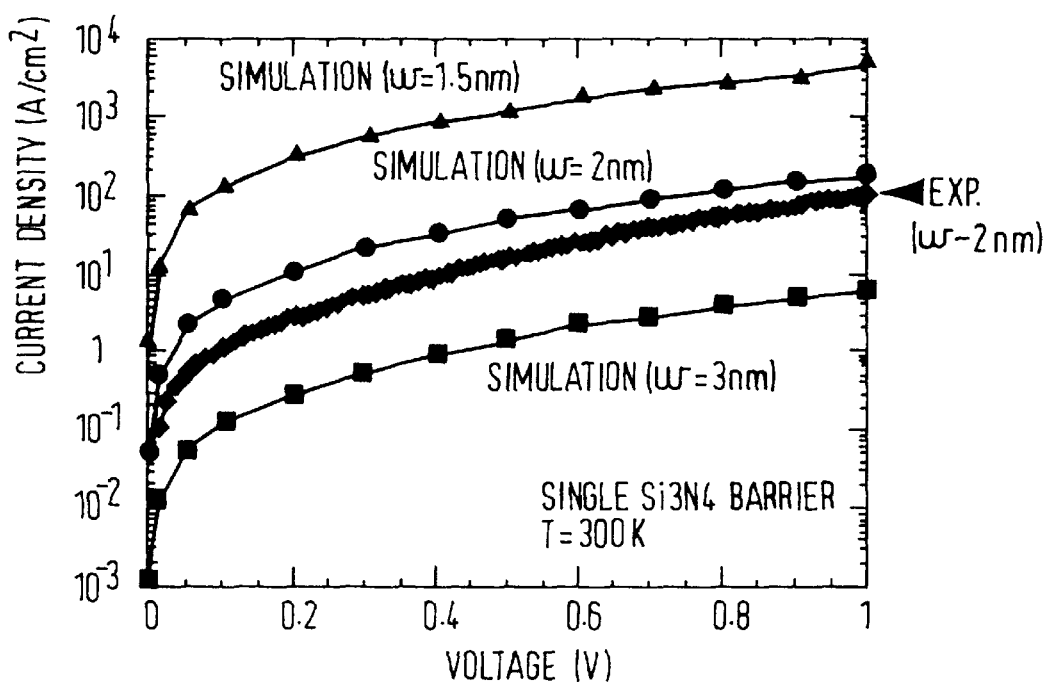

The characteristics of the main barrier 7' and the guard barriers 7" will now be considered in more detail. Referring to FIG. 32, an investigation of the characteristics of the guard barrier layers 7" was carried out both by experimentation and by simulation. The voltage-current characteristics of one of the barriers 7" is shown in FIG. 32a and the current density achievable is shown in FIG. 32b. The results in FIG. 32b are derived from a junction with an area of 50 $\mu$m×50 $\mu$m for a barrier thickness ω~2 nm and simulations for ω=1.5, 2 and 3 nm are also shown.

It will be seen that a tunnel current density in excess of $10^2 A/cm^{-2}$ can be obtained, which is suitable for achieving high speed write/erase operation of the device, when embodied as a memory.

Figures 33A, 33B:
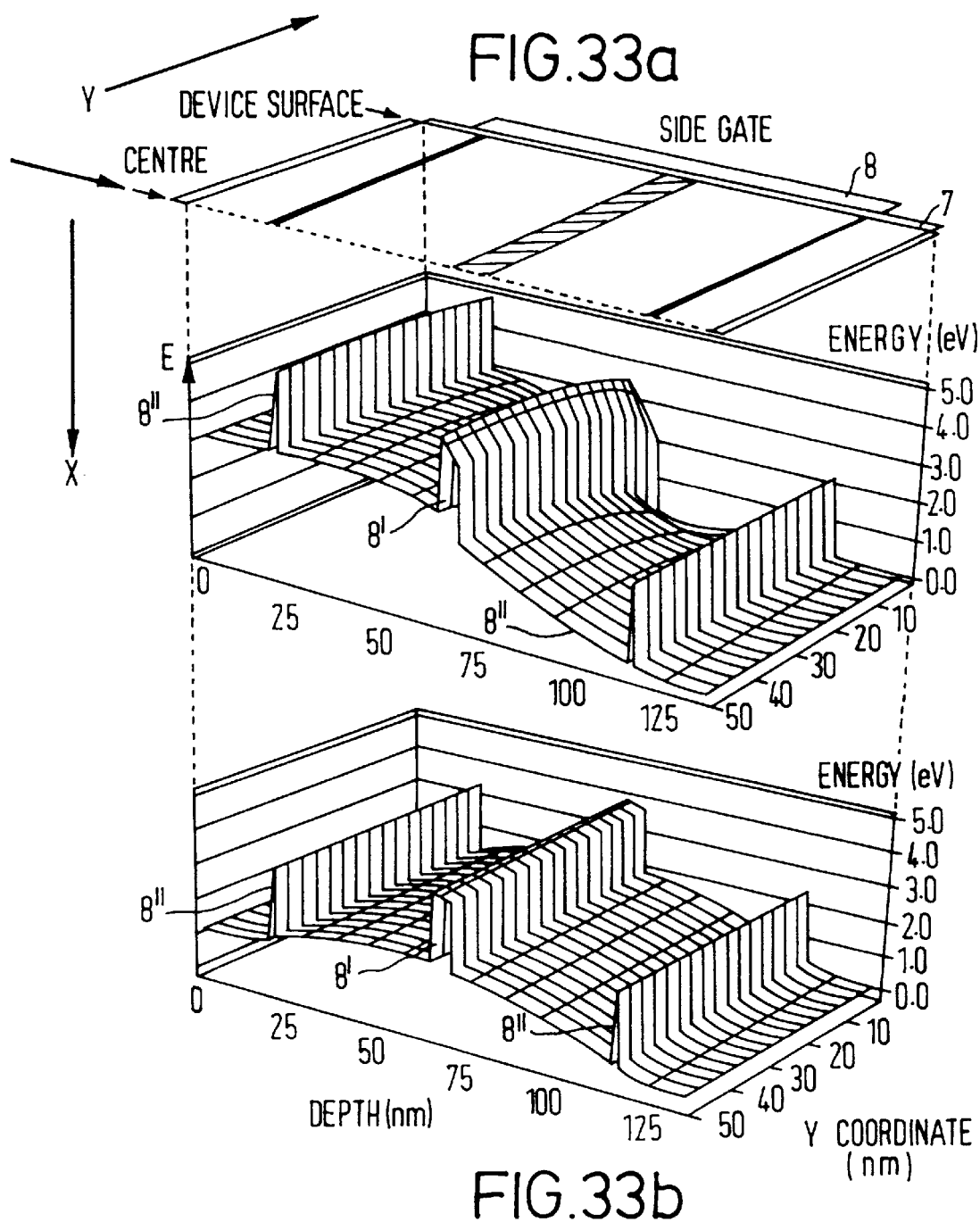
FIGS. 33a, b is a three dimensional energy band diagram of the barrier structure shown in FIGS. 28a, b.

The relationship between the thickness of the main barrier layer 7', the thicknesses of the guard barriers 7" and the spacing between the barriers, determined by the thickness of the layers $6_4$ will now be considered in more detail. The on/off characteristics of the layer structure 3, when embodied in a normally-off transistor are shown in FIG. 33. This illustrates, as a three dimensional energy diagram, the energy band diagram through the layer structure from a centre line z, in a direction x and y also illustrated in FIG. 28a. FIG. 33a illustrates the energy band diagram in an on-state i.e. with current flow between the source 5 and drain 2, whereas FIG. 33b illustrates the energy diagram in the off-state. In the on-state, the drain-source voltage $V_{ds}$=3.0V and the voltage between the side gate 7 and the source 6 $V_{gs}$=3.0V. In the off state, $V_{ds}$=1.0V and $V_{gs}$=0V. The lateral dimension (2y) of the layer structure 3 was 0.1 $\mu$m. The thickness of the main silicon nitride barrier layer 7' was 6 nm and the thickness of each of the layers $6_4$ was 45 nm.

In the off-state shown in FIG. 33b, both the relatively narrow barriers 8", 8' of width ω and ω', together with the relatively wide barrier b of width W combine together to act as a barrier to prevent the passage of electrons. The tunnelling current in an off-state was calculated to be $2.81×10^{-34}$A. When used in the memory device shown in FIG. 28b, this barrier configuration guarantees non-volatility with a retention time of over two years.

In the on-state shown in FIG. 33b, the main barrier 16 is reduced (as described with reference to FIG. 29b) so as to allow charge carrier tunnelling down the potential gradient between the input and output regions 5, 41; 2, 40. The reduction in height of the main barrier 8' occurs to a major extent in the vicinity of the side gate 53. The resulting tunnelling current is of the order of 0.6 $\mu$A. For the memory device of FIG. 28b, it is estimated that the amount of charge required on the memory node 40 to obtain a voltage shift of 1.0V for the sensing transistor device 47, 48, 49 is of the order of 1700 e (where e is the charge of a single electron). From this data, the charging and discharging time for the memory node 40 is estimated to be of the order 0.45 n sec for the described memory device according to the invention.

Figure 34:
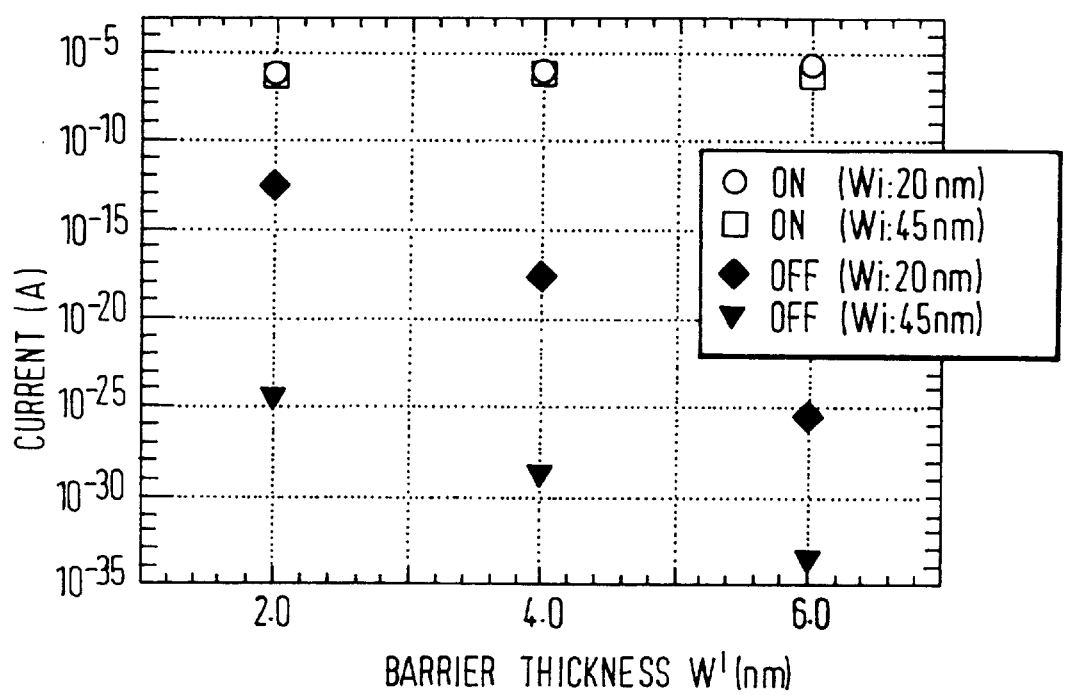
FIG. 34 illustrates the relationship between the thickness of the main barrier and the spacing between the main and guard barriers, as a function of current flow through the barrier structure, in the on and off states respectively.

The on and off currents that result from different values of thickness ω' of the main barrier 15, as determined by the thickness of the silicon nitride layer 10, is shown in FIG. 34, for different values of thickness Wi of the spacer layers $6_4$. It will be seen that the tunnel current in the off state is reduced by increasing the thickness of the main barrier layer 7', so as to increase the barrier thickness ω' and the thickness Wi of the intrinsic silicon layers $6_4$. It will be seen that the current in the on state does not vary significantly over the range of thicknesses illustrated in FIG. 34 because the current in the on state is determined mainly by the current that flows through the layer structure adjacent to the side gate 53 (FIG. 33). To achieve a data retention time of the order of 10 years, the tunnelling current in the off state should be made smaller than $10^{-25}$A. This means that ω' should be greater than 6 nm when Wi is 20 nm or less and, ω' should be greater than 2 nm when Wi is 45 nm or less. These results show that the normally-off transistor device in accordance with the invention facilitates an extremely on-off current ratio and, by optimising structural parameters, it is possible to achieve a non-volatile memory device in the form of a high-speed RAM, with a write time of less than 1.0 n sec.

Granular Barrier Structure

Figure 35:
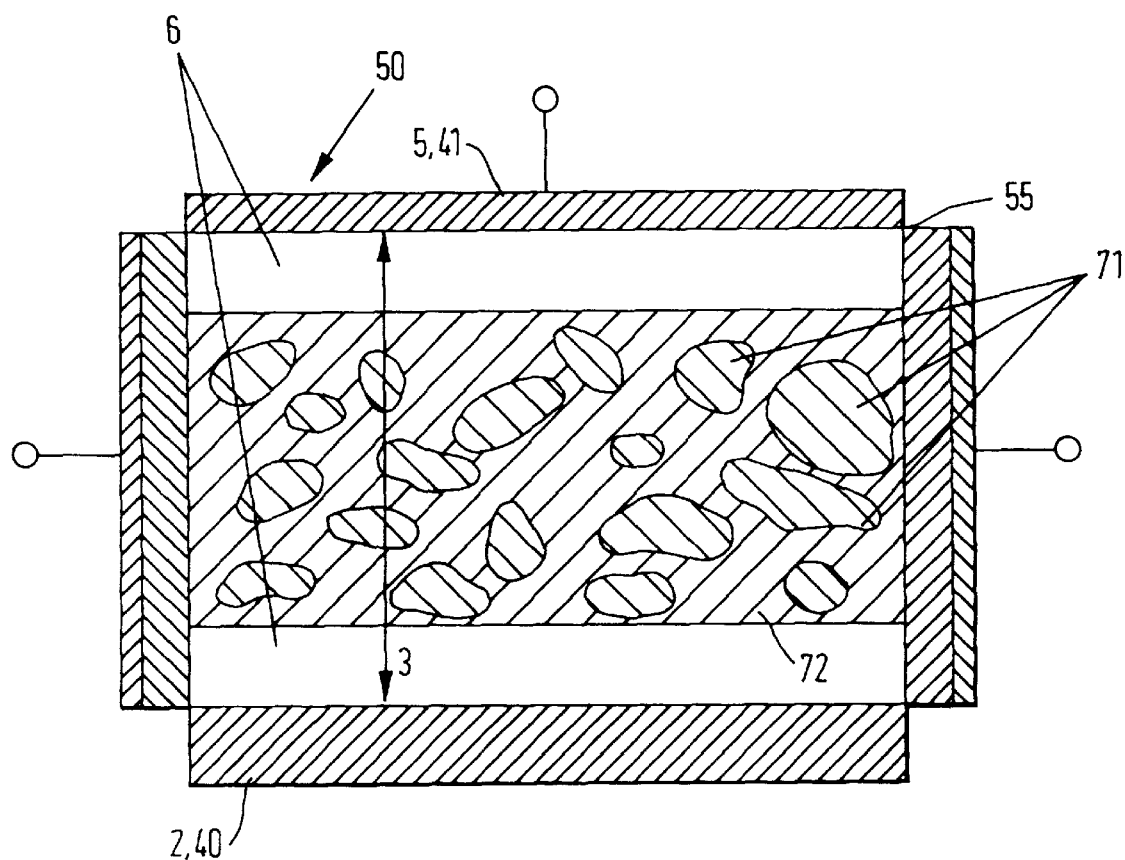
FIG. 35 illustrates an alternative, granular pillar structure for use in a device according to the invention.

Referring to FIG. 35, another example of the side-gated pillar structure 3 is shown in which the barrier configuration is provided by a cluster of granular semiconductor or conductor islands 71 are formed in an insulating matrix 72. In this example, the matrix 72 is sandwiched between layers of polysilicon material 6 of 50 nm thickness. The islands 71 may comprise silicon, germanium, amorphous silicon or metallic dots such as gold or aluminium. A number of different methods of preparing nanometre scale islands will now be described.

1. Method of Segregating Nanometre Scale Ge Crystallites from Si—Ge—O Mixture Films Si—Ge—O mixture films were prepared by radio frequency magnetron sputtering (RFMS) or ion beam sputtering (IBS). The sputtering target consisted of a 99.99% pure $SiO_2$ glass plate of 100 mm in diameter on which were disposed a number of high purity Ge chips 5 mm square. Sputtered material from the target was deposited on a Si substrate of a thickness of 200 nm. The number of Ge chips distributed on the circular $SiO_2$ glass plate was selected in order to control the amount of Ge sputtered onto the target.

In the case of RFMS, the sputtering was carried out at 1.25 kW at 13.56 MHz rf power in an argon gas atmosphere at a pressure of 3 m Torr. In the case of IBS, sputtering was carried out with a dc power source at 1 kW in an argon atmosphere at 0.3 m Torr. In more detail, the process was performed in a deposition chamber which was first evacuated by means of a cryo-pump to a pressure of $3×10^{-7}$ Torr. Next, argon gas was introduced and the electrical power previously described, was applied for sputtering. After 7 minutes, a $SiO_2$ glass was formed on the target supersaturated with Ge. The sample was then annealed at 300–800° C. in argon gas for 30 minutes–4 hours. As a result, Ge nanometre scale crystallites segregated in the glass. The number of Ge chips, the annealing temperature and the annealing time were chosen so as to control the density and size of the nano-crystallites of Ge formed in the class. Table 1 below gives examples.

TABLE 1

| Sample No. | Annealing Temp. | Annealing time | Average Diameter |
| --- | --- | --- | --- |
| 1 | 300° C. | 30 min | 4.2 nm |
| 2 | 600° C. | 30 min | 6.0 nm |
| 3 | 800° C. | 30 min | 6.5 nm |

2. Preparation of Hydrogenated Amorphous Silicon by Plasma Enhanced Chemical Vapour Deposition Method In this method, capacitively coupled rf-plasma enhanced chemical vapour deposition was used in the preparation of very thin, hydrogenated amorphous silicon. A deposition chamber was first evacuated down to a pressure of $10^{-7}$ Torr before the introduction of reaction gases. A silicon substrate mounted on a grounded electrode in the chamber was heated up to a temperature of 250° C. A gas mixture of $SiH_4$ and $H_2$ was introduced into the deposition chamber through a mass flow controller. The gas flow rates were 10 and 40 sccm respectively. A gas pressure of 0.2 Torr was maintained by an automatic pressure controller. Substitutional doping was attained by introducing $PH_3$ or $P_2H_6$ gas during the deposition in order to provide n-type and p-type hydrogenated amorphous silicon respectively. In this example, 5 sccm or 0.2% $PH_3$ diluted in $H_2$ was added as an n-type dopant. 13.56 MHz RF power at a level of 10 W was applied onto electrodes in the chamber via an automatic matching box so as to maximise the forward power and minimise reflections, thereby establishing a plasma in the chamber. The deposition rate in this case was 0.08 nm/sec. Deposition was carried out for 50 seconds to obtain a layer thickness of 4 nm containing hydrogenated amorphous silicon.

3. Preparation of Microcrystalline Silicon by Plasma Enhanced Chemical Vapour Deposition Method Capacitively coupled rf-plasma enhanced chemical vapour deposition was used to prepare microcrystalline silicon. The main reaction chamber was isolated and connected to a load lock chamber by a shutter which can be opened easily. Loading and unloading of the samples into and from the main chamber is carried out through the load lock chamber. The pressure in the chamber was determined by an automatic pressure controller. The deposition chamber was evacuated by a turbo-molecular pump down to a pressure of $10^{-7}$ Torr before introduction of the reaction gases. The substrates to receive the deposited layer were situated on a grounded electrode of 15 cm diameter heated to a temperature of 250° C. The distance between the electrodes was fixed at 3 cm. The gas mixture of $SiH_4$ and $H_2$ was introduced into the deposition chamber through a mass flow controller. The gas flow rates for $SiH_4$ and $H_2$ were selected to be 1 and 100 sccm respectively. During this process, the gas pressure was maintained at 0.15 Torr by means of an automatic pressure controller. Substitutional doping is obtained by introducing phosphine or diborane gases during the deposition process, in the same plasma to provide n-type and p-type amorphous silicon respectively. In this example, 2 sccm of 0.2% phosphine diluted in hydrogen was added as an n-type dopant. 80 power was applied at 13.56 MHz to the electrodes in the chamber by means of an AMC, so as to maximise the forward power and minimise the reflected power. The deposition rate was 0.05 nm/sec. The deposition process was contained for 80 seconds to achieve a 4 nm layer of microcrystalline silicon.

4. Preparation of Stacking Structures of Silicon Nitride and Amorphous or Microcrystalline Silicon by Plasma Enhanced Chemical Vapour Deposition To achieve a stack structure of layers of silicon nitride or microcrystalline silicon can be achieved using either method No. 2 or 3 discussed above to produce the amorphous or microcrystalline silicon and interspersed silicon nitride layers can be also prepared in a similar way by using a gas mixture of $SiH_4$, $NH_3$ and $H_2$. To prevent contamination between the silicon and silicon nitride layers, the individual films are prepared in different deposition chambers which are connected by means of a vacuum transfer mechanism.

5. Preparation of Silicon Films by Other Methods

The following are examples of other methods which can be used to prepare the amorphous and microcrystalline silicon films: thermal chemical decomposition, photo-chemical vapour decomposition, spattering, ion beam deposition, cluster ion beam deposition and molecular beam deposition. These methods can be combined with thermal annealing, rapid thermal annealing and laser annealing to achieve a wide range of microcrystalline silicon configurations.

In a specific example, silicon grains are formed with insulating grain boundaries, the grains have a dimensional range of 3–10 nm and preferably 5 nm or less. In the resulting structure illustrated schematically in FIG. 35, a current threshold of about 0.5V is formed. As a result, information can be stored on the memory node 40 for a time of the order of a few minutes, without a bias applied to the gate electrode 53. Information can be retained for longer periods of time by applying a bias voltage of −1.0V or −0.5V to the gate electrode 53 to achieve retention times of 10 years and one hour respectively. To read/write stored information, gate bias voltages of 0V and 1V are applied respectively to the gate electrode 53.

When used as a transistor, the pillar structure 20 of FIG. 35 gives rise to a normally-off transistor device.

It will be understood that the grain size of intrinsic polysilicon layer 6 in previously described structures can be formed as small as 3–10 nm. During thermal nitridation, grain boundaries are also converted to silicon nitride so that grains are also surrounded by insulation of 2–3 nm thickness. It will be also understood that the composite layer of conductive and insulator structure FIG. 35 can be used with any of the pillar structure previously described. The small grain size enhance the energy barrier effects due to the charging energy and quantum size effects, as well as the enhancement of electron localisation since resistance of each tunnel junction can be increased as the junction area is reduced. Also the leakage current due to the electron-hole pair creation can be reduced because the generated electron-hole pair would recombine inside the grain region, because the separation outside the grain is not energetically preferable due to the increase of the charging energy.

The device shown in FIG. 35 has node 2, 40 and overlying layer 6. However, it is possible to omit node 2, 40 and layer 6, and the islands 71 can be used as the node.

Modified Side Gate Structures

Figure 36:
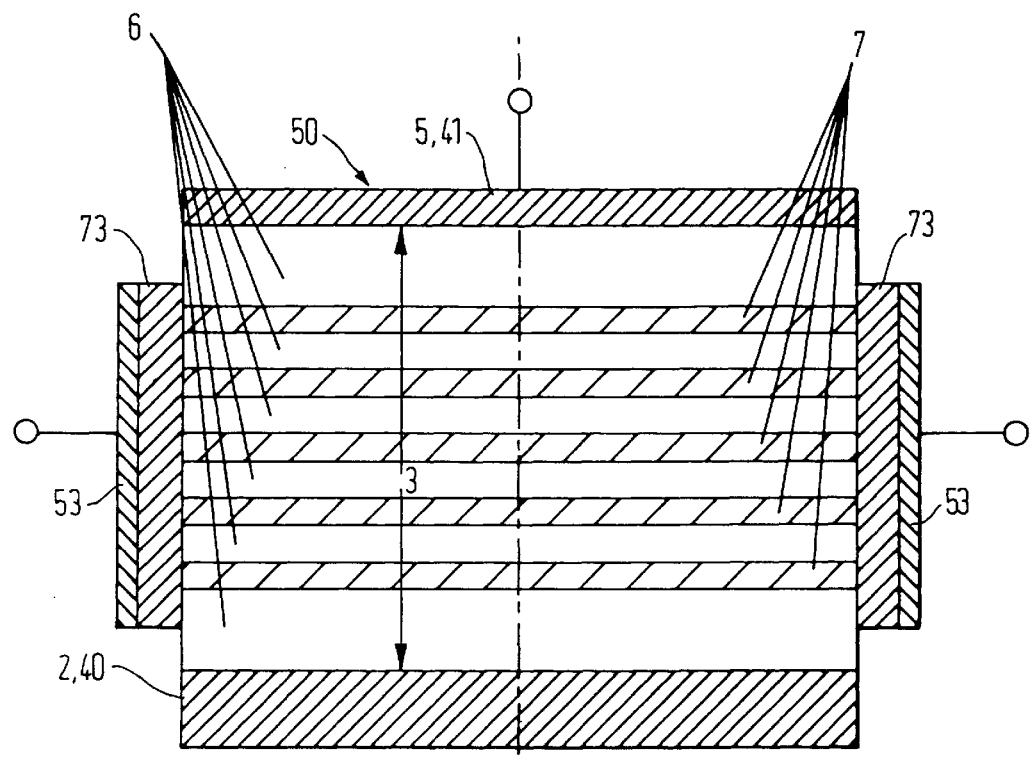
FIG. 36 illustrates yet a further embodiment of pillar structure for use in a device according to the invention, which incorporates a junction diode side gate.

Referring now to FIG. 36, this shows a modification to the side gate structure, which can be considered as a modification of the configuration shown in FIG. 16. In this device, the insulating oxide layer 55 of FIG. 16 is replaced by a semiconductor layer 73 so as to form a junction gate. In the example shown in FIG. 37, the region 73 comprises p-type silicon. The pillar structure 50 includes layers 6, 7 of conductive polysilicon and insulating silicon nitride as described previously with reference to FIG. 16. The side gate 53 is formed of polysilicon as described previously.

Figure 37:
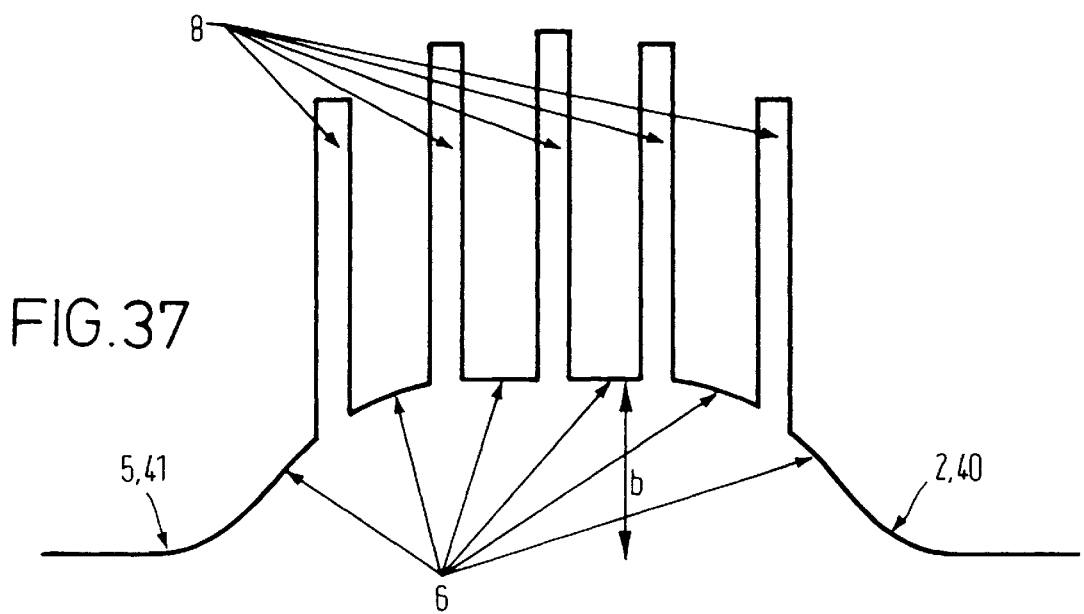
FIG. 37 illustrates the energy band diagram for the device of FIG. 36.

The effect of the p-type region 73 is to create a built-in potential b of 1.0V in the energy band profile, as shown in FIG. 37. As a result, the current threshold voltage in this device is of the order of −0.1V. Therefore, when uses as a memory device, a low voltage operation can be achieved as the refresh operation can be less frequent than for a conventional DRAM. Negative bias voltages of −1.6V and −1.1V applied to the gate electrode 53 produce retention times at the node 40 of the order of 10 years and one hour respectively. To read/write information from the node 40, gate bias voltages of −0.8V and 0.4V are applied to the gate electrode 53.

When used as a transistor, the pillar structure 50 of FIG. 36 gives rise to a normally-on transistor device.

Figure 38:
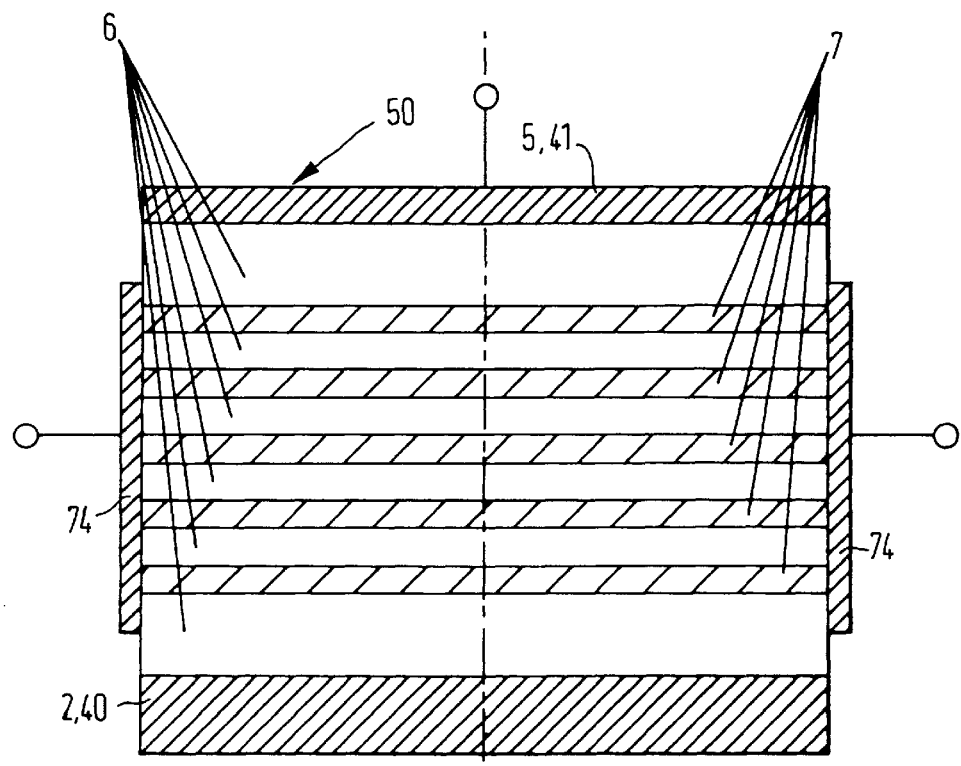
FIG. 38 illustrates a side gated structure utilising a Schottky gate.
Figure 39:
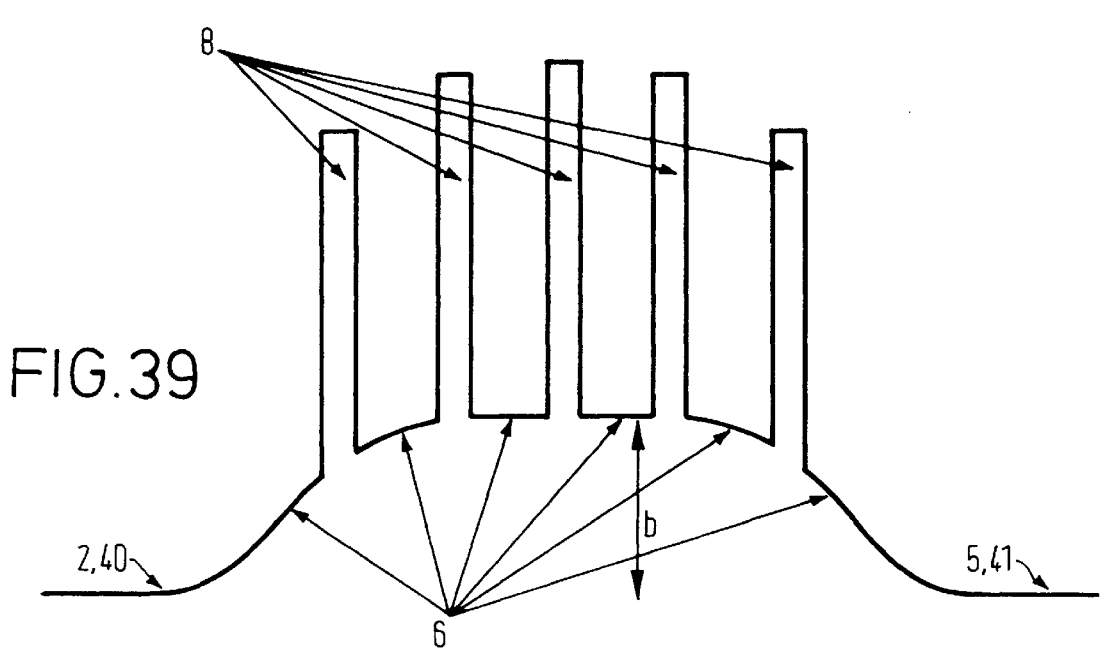
FIG. 39 illustrates the energy band diagram for the device of FIG. 38.

A pillar structure 50 with an associated Schottky side gate structure is shown in FIG. 38, which can be considered as a modification of the configuration of FIG. 16. In the embodiment of FIG. 38, the insulating later 55 is omitted and a metallic side gate 74 is applied directly to the pillar structure 3 on its side wall 5 in order to form a Schottky gate.

The side Schottky gate 74 creates a built-in potential b of up to 0.4V in the pillar structure 50. The resulting current threshold voltage is of the order of −0.3V. Thus, when used as a memory device, low voltage operation can be achieved and the refresh operation can be less frequent that for a conventional DRAM. Negative bias voltages of −1.8V and −1.3V when applied to the gate electrode 37 can achieve retention times of 10 years and one hour respectively. To read/write information form the memory node 10, gate bias voltages of −1.0 and 0.2V are applied to the gate electrode 37. In a typical example, the Shottky metal gate 74 is formed of WSi or aluminium. It will be appreciated that the process steps described with reference to FIG. 19 or 30 will be modified appropriately to produce the Shottky gate of a suitable material.

The pillar structure of FIG. 38 can also be used in a transistor structure; a normally on transistor is thereby provided.

It will be understood that the junction gate of FIG. 36 and the Schottky gate of FIG. 38 can be used with any of the pillar structures previously described and not only the pillar structure of FIG. 16.

Further Fabrication Process

Another method of fabricating a transistor device in accordance with the invention will now be described with reference to FIG. 40. The starting materials are the same as those used in the method described with reference to FIG. 19. Thus, referring to FIG. 40a, silicon wafer 56 is thermally oxidised as 1000° C. to form a 600 nm thickness layer 1 of silicon dioxide which acts as an insulating substrate. Then, a layer 2, which is used to produce the drain, is formed on the silicon dioxide layer 1. The layer 2 comprises 100 nm thickness polysilicon deposited by LPCVD in a reactor. A thin silicon dioxide layer (not shown) of thickness of the order of 10 nm is deposited on the surface of the layer 2. Arsenic ions are then implanted into the layer 2 so as to form a $n^+$-doped conductive layer that can be used as the drain. The arsenic ions are implanted with a dosage of $3 \times 10^{15}$ cm$^{-2}$ at an energy of the order of 25 KeV, through the oxide layer. The oxide layer is then removed by wet etching using a 20:1 BHF solution. Thereafter, a stack of the silicon and silicon nitride layers 6, 7 are grown so as to form the multiple layer structure 3 that gives rise to the multiple tunnel junction. Initially, the layers $6_1$ of silicon are formed to have a relatively thickness $W_1$=50 nm and then, for the major part of the stack, the thickness of the layers $6_2$ is of the order of $W_2$=5 nm. At least one further layer $6_1$ of thickness $W_1$ is formed at the top of the stack and in this example, a further layer $6_3$ of silicon is formed with a thickness of 30 nm.

The layers 6, 7 are formed in the LPCVD reactor. The process involves thermal nitridation of silicon as described by Moslehi & Saraswat, supra.

As previously described with reference to FIG. 19, the layer structure is built up successively by firstly depositing a silicon layer in the LPCVD reactor at 770° C. in $SiH_4$ gas to achieve the appropriate thickness of silicon for the relevant layers shown in the insert in FIG. 40a. Thereafter, the surface of the deposited silicon is directly converted into silicon nitride at 930° C. for 20 minutes in 100% $NH_3$ gaseous atmosphere at 1 Torr in the reactor. Then, a further layer of silicon is deposited on the silicon nitride in the same chamber. Accordingly, pure silicon nitride without any silicon dioxide is formed between the successive deposited silicon layers.

Referring to FIG. 40b, a 10 nm thick layer 75 of silicon dioxide is formed by thermal oxidisation over the layer structure 3 and a silicon nitride layer 76 of thickness 160nm is deposited at a temperature of 740° C.

Referring to FIG. 40c, the layers 75, 76 are then patterned using optical lithography and a dry etching method in an atmosphere of $CHF_3$ and argon gas, in a manner well known per se. The resulting structure has a lateral width dimension AA and a breadth, shown in FIG. 41, of a dimension Y.

As shown in FIG. 40d, the patterned layers 75, 76 are then used as a mask in order to dry etch the multiple layer structure 3 so as to remove most of the layers 6, 7 outside of the dimension AA, but leaving a thickness of approximately 30 nm of the structure 3 outside of the masked pattern. This remaining portion of the region 3 is then converted into silicon dioxide by thermal oxidisation to form regions 77 in order to isolate adjacent transistors (not shown) formed by the inventive method on the same substrate 1. The electrically insulating regions 77 are shown in FIG. 40e.

Referring to FIG. 40f, the silicon nitride and silicon dioxide layers 75, 76 are then removed using orthophosphoric acid at 160° C. and a 20:1 BHF solution. Then, layer 5 of polysilicon is deposited with a thickness of 100 nm by LPCVD. A thin silicon dioxide layer (not shown) of thickness of the order of 10 nm is deposited on the surface of the layer 5. Arsenic ions are implanted at an energy of 25 KeV and a dosage of $5 \times 10^{15}$ cm$^{-2}$ through the oxide layer in order to change the silicon layer 5 into a heavily doped n-type layer for use as the source of the transistor. Thermal annealing at 800° C. for one minute is then carried out in order to activate the arsenic ions and provide heavily doped electrical characteristics in the layer 5. A silicon dioxide layer 78 of thickness 100 nm is then deposited on the layer 5.

Figure 40G:
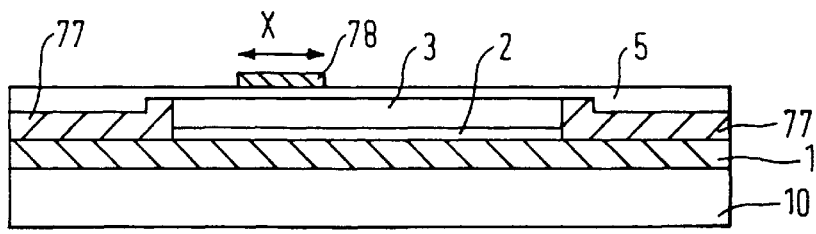

Referring to FIG. 40g, the silicon dioxide layer 78 is patterned using electron beam lithography and dry etching in order to provide an elongate region of width X which will be used to define a mask to define the extent of the source of the transistor.

Figure 40H:
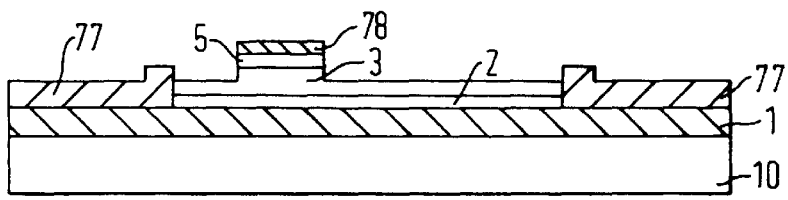

Then, a shown in FIG. 40h, the polysilicon layer 5 and the multiple layer structure 3 are etched in $CF_4$ gas, leaving a thickness of approximately 30 nm of the layer structure 3, except under the portion of the etched layer 78, where the full thickness of the layers 3 and 5 remain.

Figure 40I:
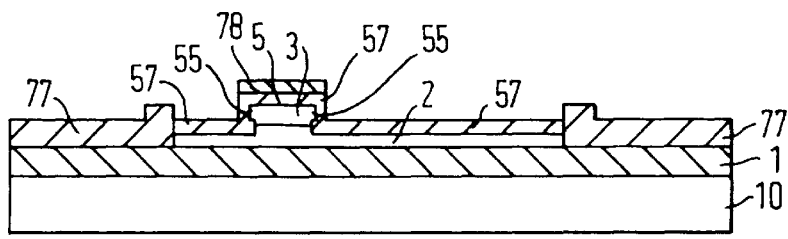

As shown in FIG. 40i, the silicon dioxide layer regions 55, 57 of thickness approximately 10 nm and 50 nm respectively are grown by thermal oxidation to overlie the etched portions of the multiple layer structure 3 and the exposed portions of the n-type source and drain regions 5, 2. The thickness of the silicon dioxide 57 on the highly doped regions 5, 2 is greater than that of the thickness of the oxide 55 on the intrinsic silicon of the layer structure 3, due to the SELOCS process.

Figure 40J:
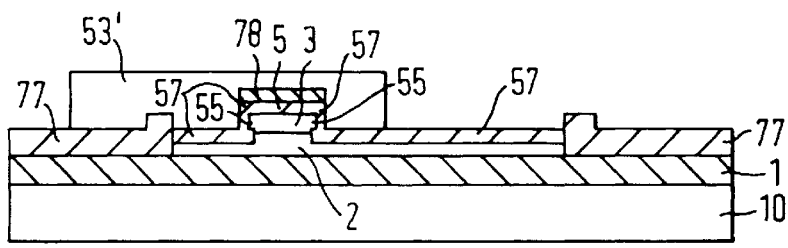

As shown in FIG. 40j, a layer 53' of polysilicon is deposited to a thickness of 100 nm by LPCVD. A thin silicon dioxide layer (not shown) of thickness of the order of 10 nm is deposited on the surface of the layer 53'. Arsenic ions are implanted at an energy of 25 KeV and a dosage of $5 \times 10^{15}$ cm$^{-2}$ through the oxide layer in order to change the polysilicon layer 53' to a heavily doped n-type layer. Thermal annealing at 800° C. for one minute is then carried out in order to activate the arsenic ions and provide heavily doped n-type electrical characteristics in the layer 53' which is later used to provide the gate of the device. The layer 53' is then patterned using optical lithography and a dry etching method in an atmosphere of CF$_4$ gas.

Figure 40K:
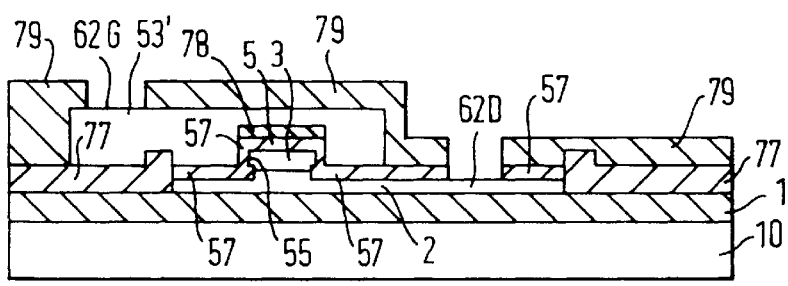

Then as shown in FIG. 40k, a silicon dioxide layer 79 of thickness 100 nm is deposited on the device and a contact window 62D is etched through the oxide layers 79, 57 in order to allow electrical connection to be made to the drain layer 2. The contact window 62D is produced by optical lithography and wet etching using a 20:1 BHF solution. As part of the same process, a contact window 62G is formed for the gate 53'.

Figure 40L:
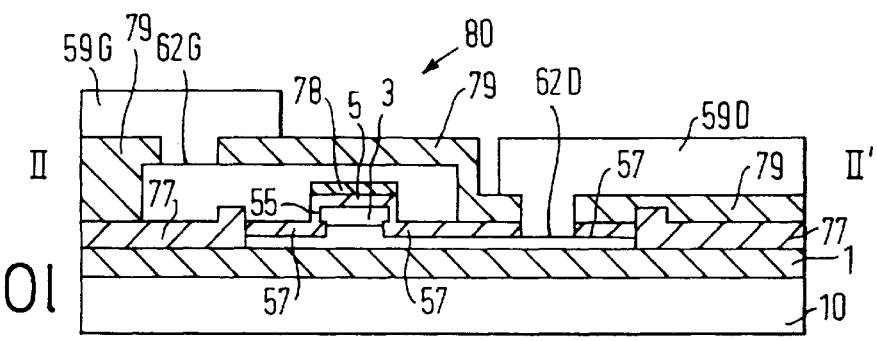

Metallisation 59 is then formed by sputtering in order to provide electrical connection to the gate and drain. The layer 59 comprises an initial layer of titanium of 100 nm thickness, overlaid by a 1000 nm of aluminium/silicon (1%) produced by conventional sputtering techniques. As shown in FIG. 40l, an electrical insulation space 43 is etched into the layer 59 so as to provide first and second contact portions 59D and 59G, which provide connections through the contact windows 62D and 62G to the gate and drain regions respectively.

Figure 41:
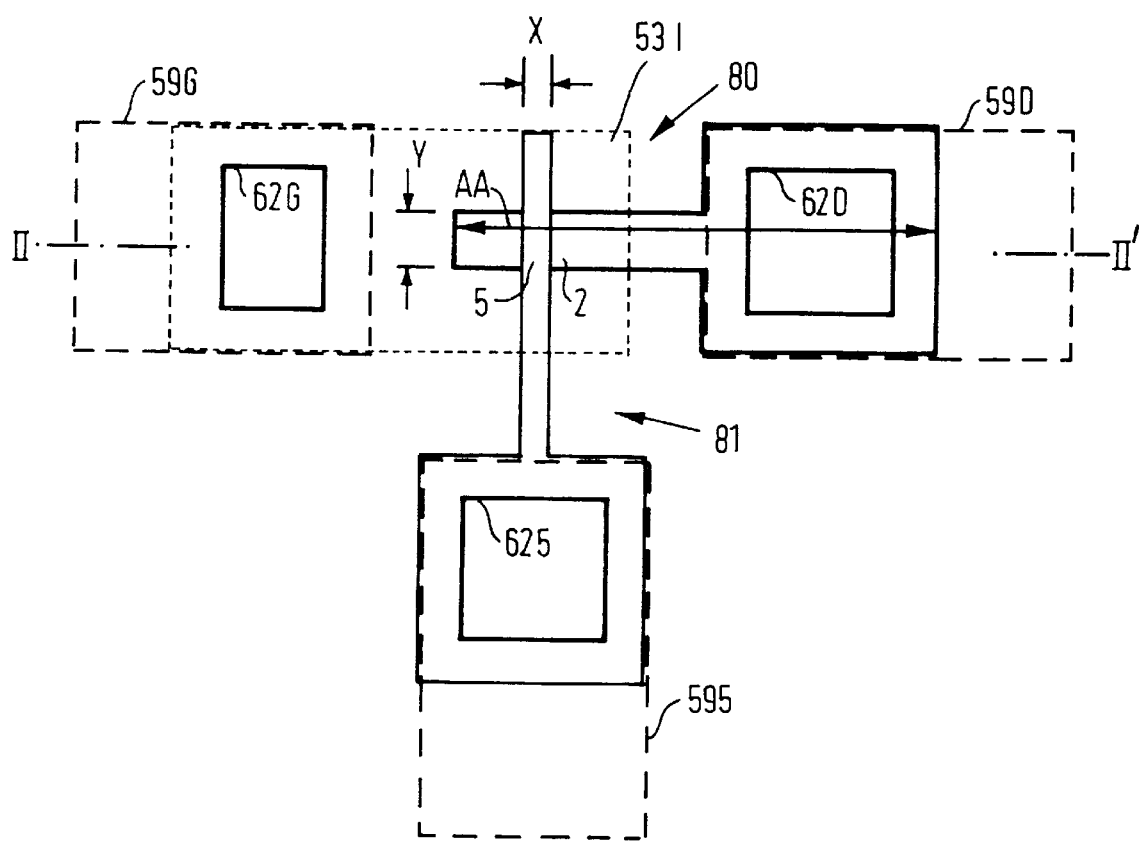
FIG. 41 illustrates the transistor device manufactured according to FIG. 40, in plan view, with FIG. 40l being a section on the line II-II'.

The resulting device is shown schematically in plan view in FIG. 41. From FIG. 41, it can be seen that the process step described with reference to FIG. 40k that formed the contact window 62D, 62G can also be used to form a contact window 62S through the silicon dioxide overlayer 78, so as to provide an external electrical connection to the heavily doped n-type region 5 that forms the source. Additionally, when the insulating gap 80 is formed, an insulating gap 81 shown in FIG. 41 is also formed so as to define portion 59S of the sputtered metallic contact layer 59. This provides electrical connection through the contact window 62S to the source 5.

During and after the growth of the layers 6, 7 of the multilayer structure 3, the overall wafer is heated to 900–1000° C. for several hours. However, to ensure that the resulting device operates successfully, the dopants from the heavily doped source and drain regions 5, 2 should not be permitted to migrate into the silicon layers 6$_2$ of the layer structure 3. In the described embodiment, the uppermost and lowermost layers 7 of silicon nitride act as barrier for the n$^+$ dopants in the layers 2, 5 and prevent them from diffusing into the central region of the multi-layer structure 3 during the heating process. FIG. 41 shows the active region of the transistor to be X×Y. Typically X=50 nm and Y=200 nm.

Referring again to FIG. 40l, it will be seen that the etched multi-layer structure 3 is formed into pillar 50 upstanding from the drain region 2. The region 53' acts as a side gate which extends alongside the side wall 52 of the pillar 50. When a gate voltage is applied to the contact region 59G, the controlling field is applied by the side gate through its side wall 52 into the layer structure 3 so as to control its tunnel barrier configuration, in a manner previously described. The controlling field is applied substantially only through the side wall 52; no significant field is applied through the top surface 51 of the pillar structure. Although the region 53' bridges over the pillar, it is spaced from the pillar's top surface 51 by the thickness of the source region 5 and overlying insulating layer 78, and thus no significant field is applied through the top surface. The described configuration has the advantage that because the gate field is applied through the side wall, the high electric field region between the gate and the drain is substantially reduced thereby improving the source-drain characteristics of the transistor.

It will be appreciated that the device described with reference to FIGS. 40 and 41 may utilise alternative multi-layer structures 3 in order to provide the pillar structure 50, in the manner described previously with reference to FIGS. 20 to 39, for example.

Furthermore, it will be understood that the side gated structure described with reference to FIG. 40 may also be used in a memory device rather than a transistor, in which the drain region 2 is replaced by a polysilicon or like conducting memory node 400, with source and drain regions corresponding to regions 47, 48 previously described being formed in the device substrate.

Figure 42:
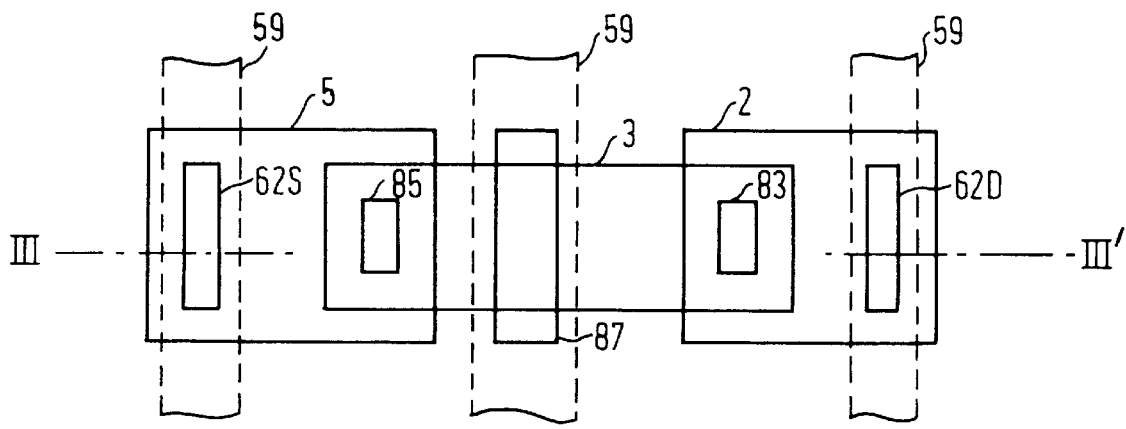
FIG. 42 is a plan view of a lateral transistor structure according to the invention.
Figure 43:
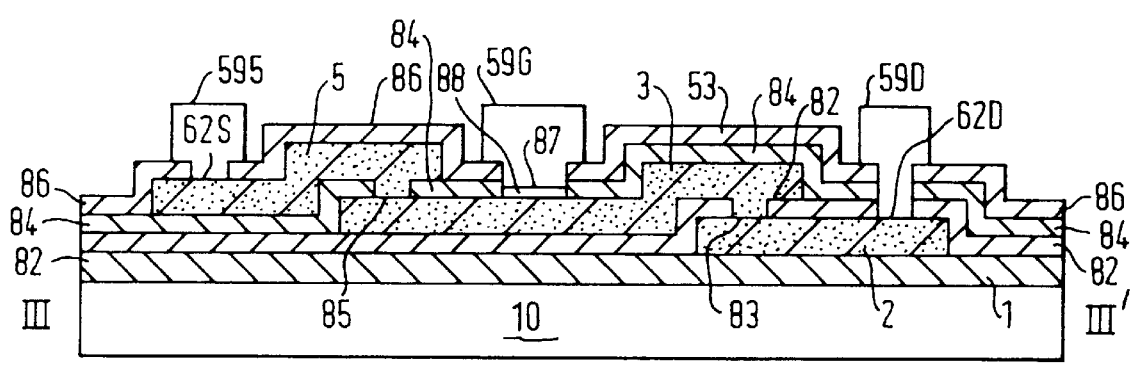
FIG. 43 is a sectional view of the transistor of FIG. 42, taken along the line III-III'.

The structures previously described can be designed so that the electrons are transported mainly at the surface region of the pillar. In this configuration, the operation becomes similar to the MOS transistor and not so much influenced by the lateral dimension of pillar. The devices can also be designed so that electrons are transported through both surface and centre regions of pillar, particularly in a pillar with small lateral dimensions Further Embodiment The structure described previously can also be arranged laterally as shown in FIGS. 42 and 43. The gate electrode 59G induces electric field into a multiple-tunnel junction to control the electron transport between a source and drain. The gate is not overlapped with source and drain contact regions and so in this structure, the gate region can be defined by lateral patterning and the fabrication process can be simplified.

A method of fabricating the device will now be described in more detail with reference to FIG. 43. The starting materials comprise a silicon wafer 56 which is thermally oxidised at 1000° C. to form a 600 nm thick layer 1 of SiO$_2$ which acts as an insulating substrate. Then, a layer 2, which is used to produce the drain is formed on the SiO$_2$ layer 1. The layer 2 comprises 100 nm thickness polysilicon deposited by LPCVD. A thin silicon dioxide layer of thickness of the order of 10 nm is deposited on the surface of the layer 2. Arsenic ions are then implanted in the layer 2 to form an n$^+$-doped conductive layer that can be used for the drain. The arsenic ions are implanted with a dosage of $3 \times 10^{15}$ cm$^{-2}$ at an energy of the order of 25 keV through the oxide layer (not shown). The 10 nm oxide and silicon layer 2 are patterned by optical lithography and dry etching. Then, a silicon oxide layer 82 of thickness 60 nm is deposited, and a contact window 83 is etched through the oxide layers 82 and 10 nm and oxide in order to allow electrical connection to be made to the drain layer 2. The contact window 83 is formed by optical lithography and wet etching using 20:1 BHF solution.

Thereafter, a stack of the silicon and the silicon nitride layers are grown so as to form the multiple layer structure 3 that gives rise to the multiple tunnel junction, by the same method described before. The multiple layer 3 structure is patterned by optical lithography and dry etching.

Then, a silicon oxide layer 84 of thickness 60 nm is deposited, and a contact window 85 is etched through the oxide layer 84 in order to allow electrical connection. The contact window 85 is formed by optical lithography and wet etching using 20:1 BHF solution.

Then, layer 5, which is used to produce the source, is formed. The layer 5 comprises 100 nm thickness polysilicon deposited by LPCVD. A thin silicon dioxide layer of thickness of the order of 10 nm is deposited on the surface of the layer 5. Arsenic ions are then implanted in the layer 5 to form an n⁺-doped conductive layer that can be used for the source. The arsenic ions are implanted with a dosage of $3 \times 10^{15}$ cm$^{-2}$ at an energy of the order of 25 keV through the oxide layer (not shown). Then the 10 nm oxide and the silicon layer 5 are patterned by optical lithography and dry etching.

A silicon oxide layer 86 of thickness 60 nm is deposited, and a gate window 87 is etched through the oxide layers 86 and 84. The gate window 87 is formed by optical lithography and wet etching using 20:1 BHF solution. Then, a 10 nm silicon dioxide layer 88 is formed by thermal oxidation.

Then, the contact window 62D is etched through the oxide layers 86, 84 and 82 in order to allow electrical connection to be made to the drain layer 2. The contact window 62D is formed by optical lithography and wet etching using 20:1 BHF solution. At the same time, a contact window 62S is made to the source 5.

Metallisation and patterning is then carried by the same method described with reference to FIG. 40*l*, to complete the structure shown in FIG. 42 and FIG. 43.

It will be appreciated that the device described with reference to FIGS. 42 and 43 may utilise alternative tunnel barrier structures 3, in the manner described previously with reference to FIGS. 8 to 19, for example. Also, the drain 2 may be replaced by a memory node in order to provide a memory device rather than a transistor.

Many other modifications and variations within the scope of the invention will be apparent to those skilled in the art. For example, whilst in the described embodiments silicon nitride is used to provide the insulating layers of the multi-layer structure 3, silicon oxide layers could be used or other films of insulating material. Also, the n-type and p-type regions could be interchanged and varied in the type of dopant used. For example it would be possible to use a n-type source and drain (or memory node), with a p-type gate.

What is claimed is:

1. A controllable conduction device comprising an upstanding pillar structure having a side wall and a top surface, the structure being formed of regions of relatively conductive and non-conductive material such that in a first condition, charge carrier flow can occur through the pillar structure and in a second condition the regions present a tunnel barrier configuration that inhibits charge carrier flow through the pillar structure, said regions providing an energy band profile that comprises a dimensionally relatively wide barrier component with a relatively low barrier height, and at least one relatively narrow barrier component with a relatively high barrier height, and a side gate structure alongside the side wall of the pillar structure, configured to apply an electric field through the side wall into the pillar structure to control electrical conductivity therein.

2. A device according to claim 1 wherein the component of the energy band profile of relatively high barrier height is provided by an element of a width of 3 nm or less.

3. A device according to claim 1 wherein the energy band profile of the tunnel barrier configuration includes a plurality of said relatively high barrier height components.

4. A device according to claim 1 wherein the configuration includes alternate layers of relatively electrically conductive and insulating material wherein the layers collectively provide said relatively low barrier height component of the energy band profile, and the individual insulating layers provide the relatively high barrier components.

5. A device according to claim 4 wherein the alternate layers comprise polysilicon and silicon nitride.

6. A device according to claim 4 wherein the alternative layers comprise polysilicon and silicon dioxide.

7. A device according to claim 4 including a heavily doped barrier layer within the alternating layers.

8. A device according to claim 4 wherein the electrically conductive layers each are of a thickness of less than 10 nm and the insulating layers are of a thickness of the order of 1 nm.

9. A device according to claim 4 wherein the configuration includes alternate layers of electrically conductive material and semiconductor material.

10. A device according to claim 1 wherein the pillar structure includes a plurality of conductive islands.

11. A device according to claim 10 wherein the islands are distributed in the an insulating matrix.

12. A device according to claim 10 wherein the islands have a diameter of 3–10 nm.

13. A device according to claim 10 wherein the islands comprise nano-crystals of semiconductor material.

14. A memory device according to of claim 10 wherein the islands are formed of a metal.

15. A device according to claim 1 operable as a transistor, including source and drain regions to provide a source-drain charge carrier flow path through the pillar structure, and the side gate is operable to control charge carrier flow along the source-drain charge carrier flow path.

16. A device according to claim 1 operable as a memory, including a memory node to receive charge carriers that pass along a path through the pillar structure, and the side gate is operable to control charge carrier flow along the path, for controlling the charge stored in the node.

17. A device according to claim 16 including a source-drain path having a conductivity dependent on the level of electrical charge stored in the node.

18. A device according to claim 1 wherein said side gate structure comprises a Schottky gate.

19. A device according to claim 1 wherein the side gate structure comprises a junction gate.

20. A device according to claim 1 wherein the side gate is disposed alongside the side wall but does not overlie the top surface.

21. A device according claim 1 wherein the side gate is formed of a region which is disposed alongside the side wall and also forms a bridge over the pillar structure spaced from its top surface such that no significant controlling electrostatic field is applied by the region into the pillar structure from the bridge.

22. A device according claim 1 including a control electrode extending over the entire top surface of the pillar structure.

23. A memory device comprising a barrier structure formed of regions of relatively conductive and non-conductive material such that in a first condition, charge carrier flow can occur through the pillar structure and in a second condition the regions present a tunnel barrier configuration that inhibits charge carrier flow through the structure, a memory node to receive charge carriers that pass along a path through the structure, and a control electrode for supplying charge carriers to the path so as to pass through the structure to be stored at the node, wherein the regions of non-conductive material are configured so as to provide an energy band profile that comprises dimensionally relatively narrow barrier components adjacent the memory node and the control electrode respectively, and a dimensionally relatively wide barrier component between the narrow barrier components, the barrier components being configured such as to provide non-volatile charge storage at the node.

24. A device according to claim 23 including a side gate to apply an electrostatic field to the pillar structure through its side wall.

25. A device according to claim 1 wherein the regions of the barrier structure give rise to a dimensionally relatively wide barrier component across the width of the barrier structure with a relatively low barrier height, and the non-conductive regions give rise to barrier components that at are dimensionally relatively narrow compared with the wide barrier component but with a relatively high barrier height.

\* \* \* \* \*

UNITED STATES PATENT AND TRADEMARK OFFICE
CERTIFICATE OF CORRECTION

PATENT NO. : 6,211,531 B1
DATED : April 3, 2001
INVENTOR(S) : Kazuo Nakazato et al.

Page 1 of 1

It is certified that error appears in the above-identified patent and that said Letters Patent is hereby corrected as shown below:

Column 12,
Line 40, change "112" to -- 11$_2$ --.
Line 41, change "152" to -- 15$_2$ --.
Line 48, change "structure $^3{}_1$" to -- structure $3_1$ --.

Column 21,
Line 48, after "hereinafter." start new paragraph.

Column 24,
Line 60, after "Torr." start new paragraph.

Column 28,
Line 2, change "thickness of $_{30}$ nm" to -- thickness of 30 nm --.

Column 32,
Line 26, before "claim" delete "of".

Signed and Sealed this

Eighth Day of January, 2002

Attest:

Attesting Officer

JAMES E. ROGAN
Director of the United States Patent and Trademark Office